United States Patent
Dobereiner et al.

(10) Patent No.: US 11,932,789 B2
(45) Date of Patent: Mar. 19, 2024

(54) LUMINESCENT COMPOUND

(71) Applicant: Temple University—of the Commonwealth System of Higher Education, Philadelphia, PA (US)

(72) Inventors: Graham Dobereiner, Philadelphia, PA (US); William Sabbers, Philadelphia, PA (US); Weerasiri Arachchige Kushan Chandana Weerasiri, Philadelphia, PA (US)

(73) Assignee: Temple University- of the Commonwealth System of Higher Education, Philadelphia, PA (US)

( * ) Notice: Subject to any disclaimer, the term of this patent is extended or adjusted under 35 U.S.C. 154(b) by 206 days.

(21) Appl. No.: 17/095,520

(22) Filed: Nov. 11, 2020

(65) Prior Publication Data
US 2021/0139771 A1    May 13, 2021

Related U.S. Application Data

(60) Provisional application No. 62/933,841, filed on Nov. 11, 2019.

(51) Int. Cl.
| | |
|---|---|
| C09K 11/06 | (2006.01) |
| C07F 5/02 | (2006.01) |
| C07F 9/6506 | (2006.01) |
| C07F 9/655 | (2006.01) |
| H10K 85/30 | (2023.01) |
| H10K 50/11 | (2023.01) |

(52) U.S. Cl.
CPC .............. C09K 11/06 (2013.01); C07F 5/027 (2013.01); C07F 9/6506 (2013.01); C07F 9/65515 (2013.01); H10K 85/371 (2023.02); C09K 2211/188 (2013.01); H10K 50/11 (2023.02)

(58) Field of Classification Search
CPC ... C09K 11/06; C09K 2211/188; C07F 5/027; C07F 9/6506; C07F 9/65515; H01L 51/0091; H01L 51/5012
See application file for complete search history.

(56) References Cited

U.S. PATENT DOCUMENTS

| | | | | |
|---|---|---|---|---|
| 2004/0102632 A1* | 5/2004 | Thompson | ........... | H10K 85/342 534/14 |
| 2009/0091243 A1* | 4/2009 | Fujimura | ............ | H01L 51/0084 546/4 |
| 2010/0197983 A1* | 8/2010 | Beller | ...................... | C07C 11/21 585/16 |
| 2016/0031845 A1* | 2/2016 | Kadyrov | .................. | B01J 31/24 548/542 |
| 2016/0111661 A1* | 4/2016 | Boudreault | ......... | C07F 15/0033 546/4 |
| 2017/0077427 A1* | 3/2017 | Kim | ..................... | H10K 85/371 |

OTHER PUBLICATIONS

K. Weerasiri et al., 358 Advanced Synthesis & Catalysis, 4106-4113 (2016) (Year: 2016).*
D. Mendoza-Espinosa et al., 6 Chemistry—An Asian Journal, 1099-1103 (2011) (Year: 2011).*
O. Halter et al., 22 Chemistry A European Journal, 18066-18072 (2016) (Year: 2016).*
D. Wozniak et al., 37 Organometallics, 2376-2385 (2018) (Year: 2018).*
D. Wozniak et al., 48 Dalton Transactions, 14138-14155 (2019) (Year: 2019).*
J. Bates et al., 48 Angew. Chem. Int. Ed., 9844-9847 (2009) (Year: 2009).*
Y. Wang et al., 132 Journal of the American Chemical Society, 14370-14372 (2010) (Year: 2010).*
CAS Abstract and Indexed Compounds: O Halter et al., 22 Chemistry A European Journal, 18066-18072 (2016) (Year: 2016).*
CAS Abstract and Indexed Compounds: D. Mendoza-Espinosa et al., 6 Chemistry—An Asian Journal, 1099-1103 (2011) (Year: 2011).*
F. Medici et al., 37 Organometallics, 517-520 (2018) (Year: 2018).*
V. Cesar et al., 3 ACS Omega, 15582-15591 (2018) (Year: 2018).*
M. Bayat et al., 46 Dalton Transactions, 207-220 (2017) (Year: 2017).*
CAS Abstract K. Weerasiri et al., 358 Advanced Synthesis & Catalysis, 4106-4113 (2016) (Year: 2016).*
G. Schnee et al., Chemistry A European Journal, 17959-17972 (2015) (Year: 2015).*
CAS Abstract, G. Schnee et al., 21 Chemistry—A European Journal, 17959-17972 (2015) (Year: 2015).*
Cradlebaugh et al. (Jun. 24, 2004) "Rate Constants for Hydrogen Abstraction from Alkoxides by a Perfluoroalkyl Radical. An Oxyanion Accelerated Process", Organic and Biomolecular Chemistry, 2(14):2083-2086.
De Frémont et al. (Apr. 8, 2005) "Synthesis and Structural Characterization of N-Heterocyclic Carbene Gold(I) Complexes", Organometallics, 24(10):2411-2418.
De Frémont et al. (Nov. 18, 2005) "Synthesis of Well-Defined N-Heterocyclic Carbene Silver(I) Complexes", Organometallics, 24(26):6301-6309.
Doud et al. (Jul. 3, 2018) "In Situ Formation of N-Heterocyclic Carbene-Bound Single-Molecule Junctions", Journal of the American Chemical Society, 140(28)8944-8949.
Gomez-Suarez et al. (2012) "Synthetic Routes to [Au(NHC)(OH)] (NHC = N-heterocyclic carbene) Complexes", Dalton Transactions, 41(18):5461-5463.
Holz et al. (2018) "Diastereoselective Synthesis, Structure and Reactivity Studies of Ferrocenyloxazoline Gold(i) and Gold(ii) Complexes", Dalton Transactions, 47(11):3880-3905.
Khan et al. (2016) "Synthesis, Structure and Cytotoxicity Evaluation of Complexes of N1-substituted-isatin-3-thiosemicarbazone with Copper(I) Halides", Inorganica Chimica Acta, 449:119-126.

(Continued)

*Primary Examiner* — Alexander R Pagano
(74) *Attorney, Agent, or Firm* — Fox Rothschild LLP; Nicholas Zachariades

(57) ABSTRACT

Provided herein are luminescent compounds, compositions including the same, and use and synthesis thereof.

25 Claims, 8 Drawing Sheets
(8 of 8 Drawing Sheet(s) Filed in Color)

(56) References Cited

OTHER PUBLICATIONS

Weerasiri et al. (Dec. 22, 2016) "Internal Alkyne Regio- and Chemoselectivity using a Zwitterionic N-Heterocyclic Carbene Gold Catalyst in a Silver-Free Alkyne Hydration Reaction", Advanced Synthesis & Catalysis, 358 (24):4106-4113.
Wozniak et al. (2018) "Comparing Interactions of a Three-Coordinate Pd Cation with Common Weakly Coordinating Anions", Organometallics, 37(14):2376-2385.

\* cited by examiner

FIG. 1

LUMINESCENT COMPOUND

CROSS REFERENCE TO RELATED APPLICATIONS

This application claims the priority and benefit of U.S. Provisional Application No. 62/933,841 filed Nov. 11, 2019, the contents of which are incorporated by reference in their entireties.

STATEMENT AS TO RIGHTS TO INVENTIONS MADE UNDER FEDERALLY SPONSORED RESEARCH AND DEVELOPMENT

This invention was made with Government support under grant numbers CHE-1565721 awarded by the National Science Foundation. The Government has certain rights in the invention.

BACKGROUND

Luminescent organic compounds can emit light in response to an electric current, during the course of chemical reaction, or upon irradiation of high frequency light (e.g., UV light). These compounds have been used in light-emitting diode (LED) or organic light-emitting diode (OLED). Some luminescent compounds emitting blue light has been reported to be less stable than compounds emitting red or green light, so rational design of novel compounds as for blue light emitting diode may be in foregoing demands.

SUMMARY OF THE INVENTION

In an aspect, provide herein are luminescent compositions including a compound (e.g., luminescent compound). The luminescent compound may have a structure of:

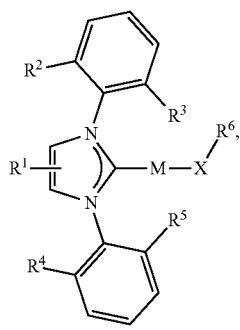

(I)

wherein:
$R^1$ is an anionic group;
Each $R^2$, $R^3$, $R^4$, and $R^5$ is independently is hydrogen, halogen, substituted or unsubstituted alkyl;
M is a metal or a metal ion;
X is a bond, —C($R^a R^b$)—, —N($R^c$)—, —NC—, —S($R^d$)—, —O—, —S—, or —P($R^e R^f$)—;
$R^6$ is hydrogen, halogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl, or
$R^6$ and any atom of X, $R^a$, $R^b$, $R^c$, $R^d$, $R^e$, and $R^f$ together with atoms connected thereto form substituted or unsubstituted cycloalkyl, substituted or unsubstituted heterocycloalkyl, substituted or unsubstituted aryl, or substituted or unsubstituted heteroaryl; and Each $R^a$, $R^b$, $R^c$, $R^d$, $R^e$, and $R^f$ is independently hydrogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl.

In some embodiments, the luminescent compound may further include a counterion (e.g., cations).

In some embodiments, the luminescent compound may have the structure of:

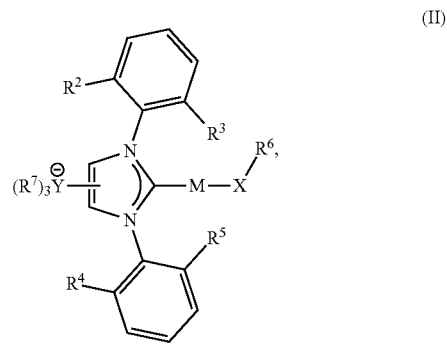

(II)

wherein:
Y is B or Al, and
$R^7$ is independently hydrogen, halogen, substituted or unsubstituted alkyl, substituted or unsubstituted heteroalkyl, substituted or unsubstituted cycloalkyl, substituted or unsubstituted aryl, or substituted or unsubstituted heteroaryl.

In some embodiments, $R^7$ is independently $R^8$-substituted or unsubstituted phenyl, $R^8$-substituted or unsubstituted pyrrolidinyl, or —N($R^8$)$_2$, $R^8$ is independently halogen, —CH$_3$, —OCH$_3$, —CH$_2$CH$_3$, —OCH$_2$CH$_3$, —CX$^1_3$, —CHX$^1_2$, —CH$_2$X$^1$, —OCX$^1_3$, —OCH$_2$X$^1$, or —OCHX$^1_2$, and X$^1$ is independently —F, —Cl, —Br, or —I.

In some embodiments, X is —SR$^d$—; and R$^d$ is —CH$_3$, or $R^6$ and $R^d$ together with atoms connected thereto form substituted or unsubstituted heterocycloalkyl.

In some embodiments, X is —NC—; and $R^6$ is hydrogen, or substituted or unsubstituted alkyl.

In some embodiments, X is —O— or —S—; and $R^6$ is hydrogen, substituted or unsubstituted alkyl, or substituted or unsubstituted phenyl.

In some embodiments, X is —N($R^c$)—; and each $R^6$ and $R^c$ is independently substituted or unsubstituted phenyl.

In some embodiments, X is a bond; and $R^6$ is substituted or unsubstituted heterocycloalkyl, or substituted or unsubstituted heteroaryl.

In some embodiments, X is —P($R^e R^f$)—, each $R^6$, $R^e$, and $R^f$ is independently

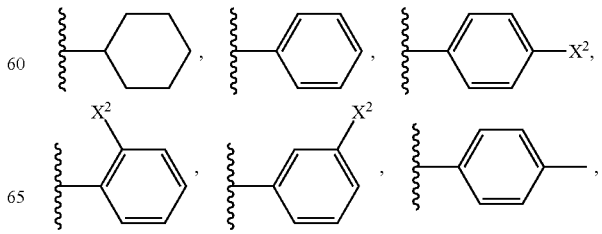

-continued

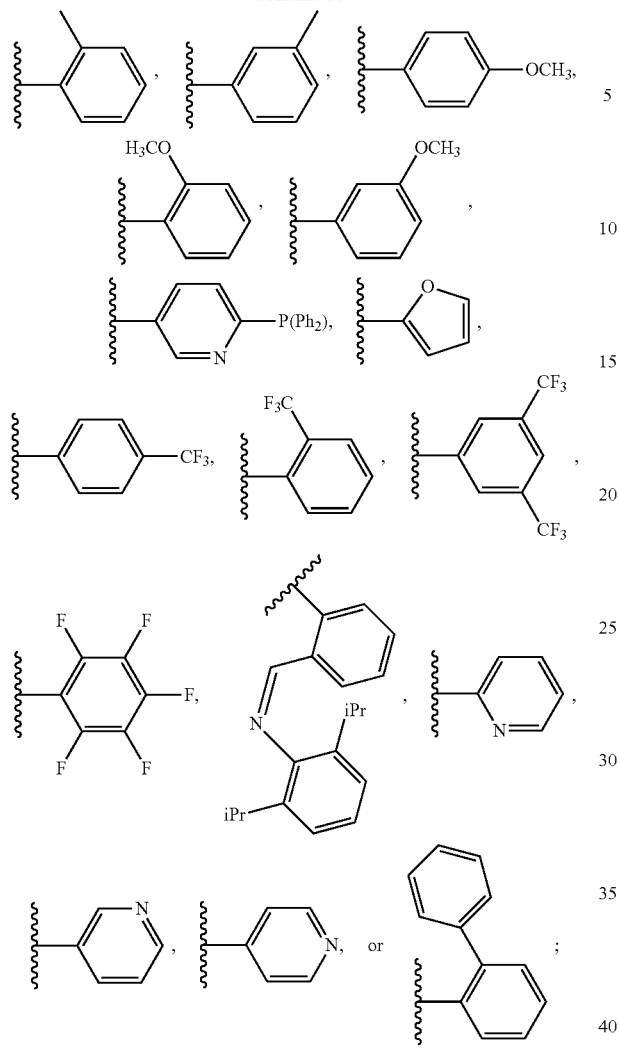

wherein $X^2$ is —F, —Cl, —Br, or —I.

In some embodiments, each $R^2$, $R^3$, $R^4$, and $R^5$ is independently is hydrogen, or unsubstituted $C_1$-$C_4$ alkyl.

In some embodiments, the luminescent compound has the structure of:

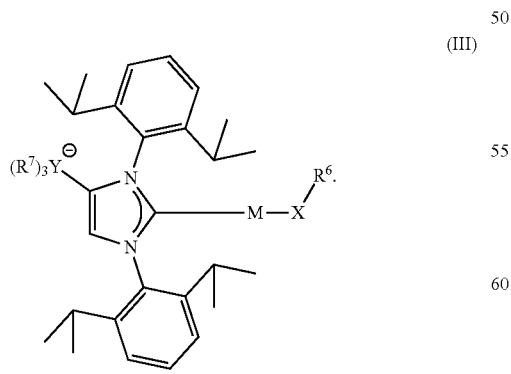

(III)

In some embodiments, M is Au, Cu, $Au^+$, $Cu^+$, Ag, or $Ag^+$.
In some embodiments, the counterion is $Na^+$, $K^+$, or $Li^+$.

Example luminescent compounds may include, but not be limited to:

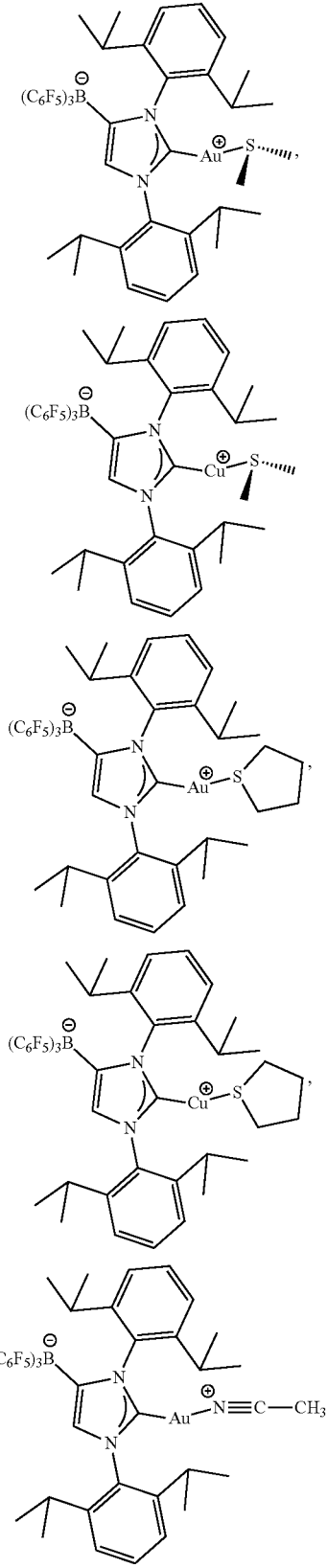

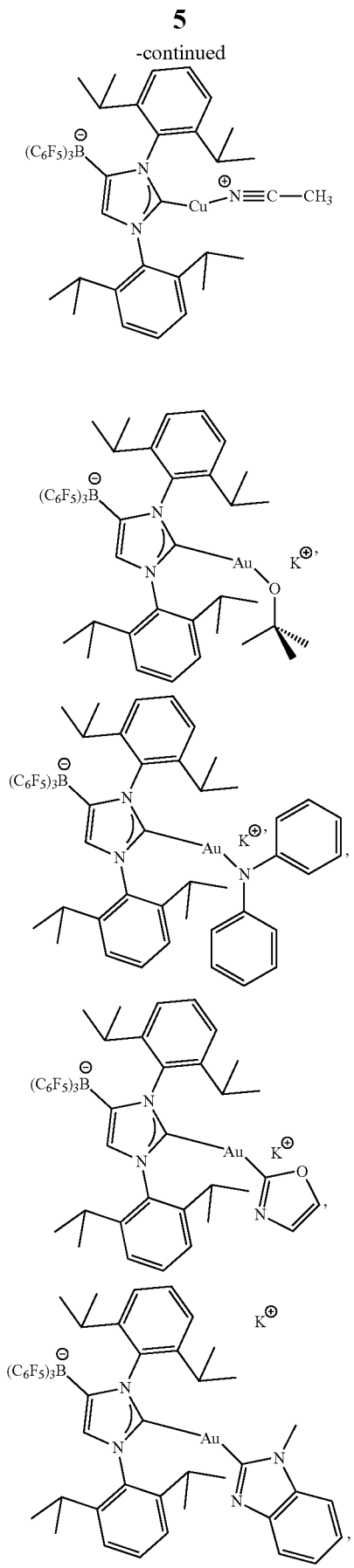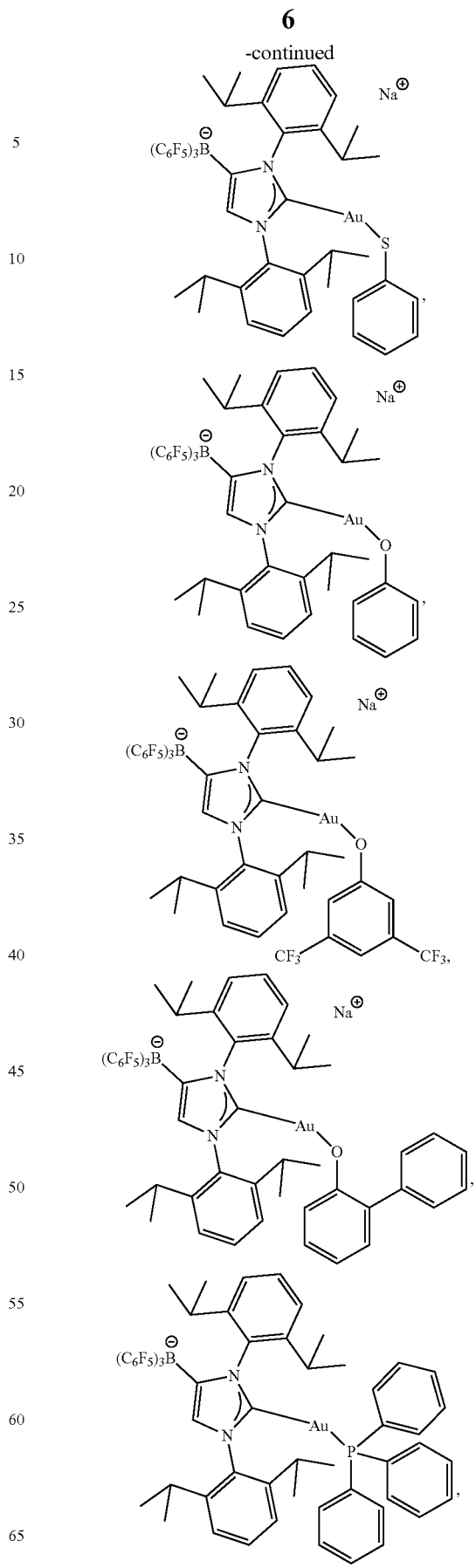

7
-continued
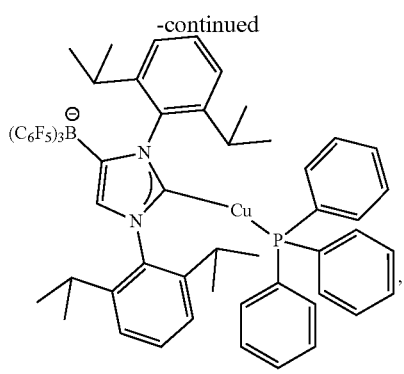
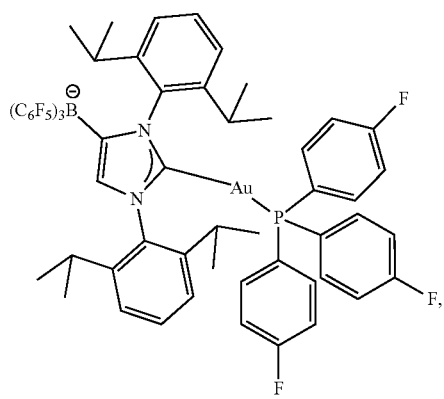
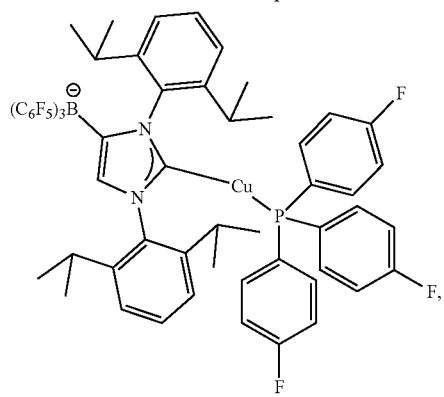
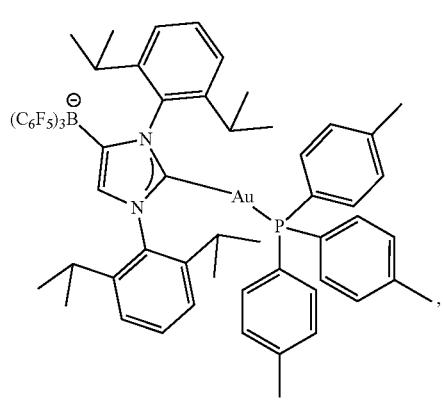
8
-continued
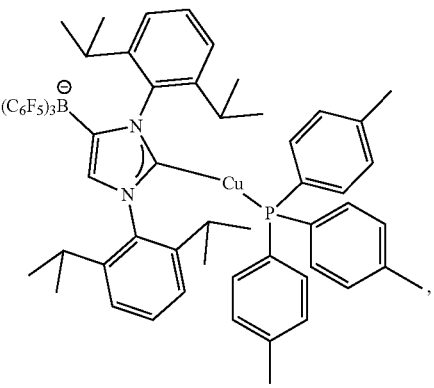
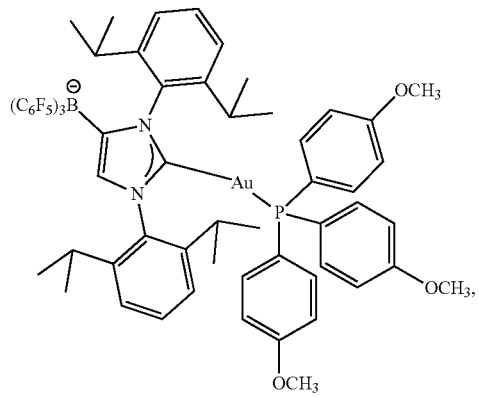
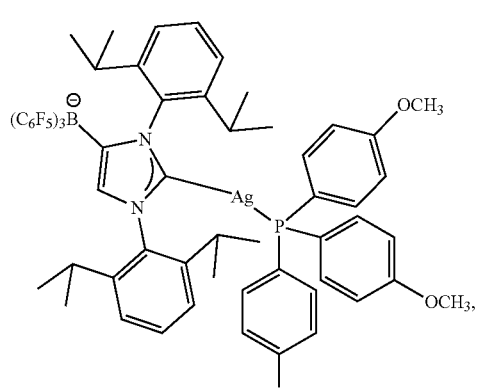
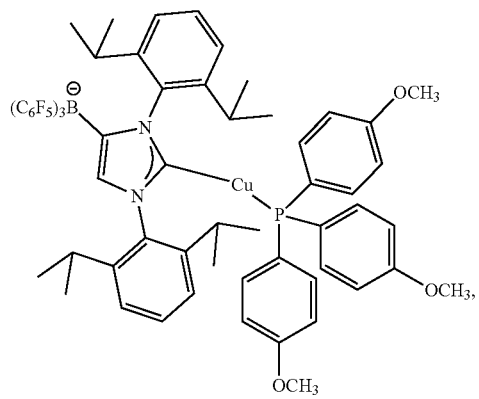

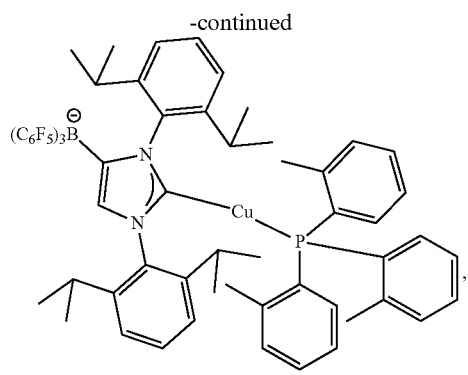
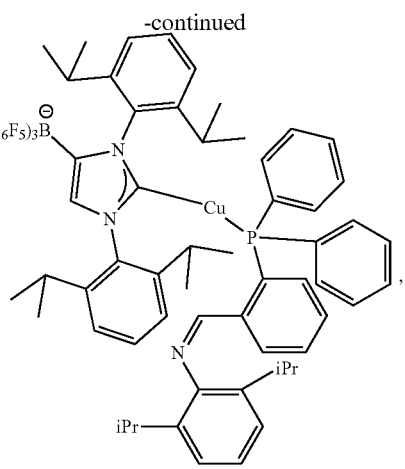
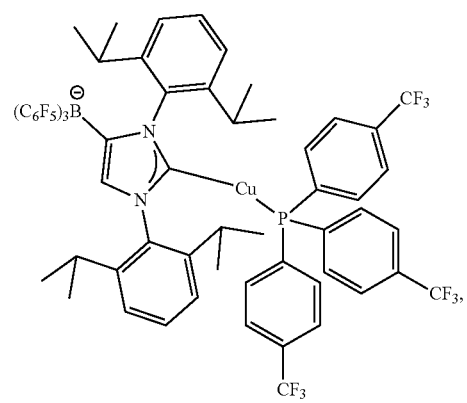
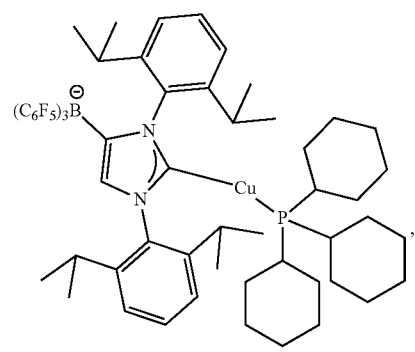
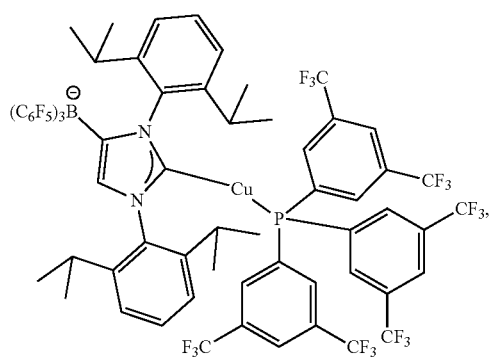
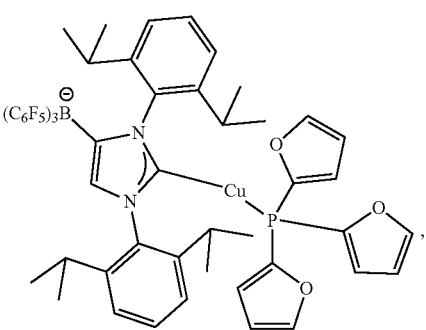
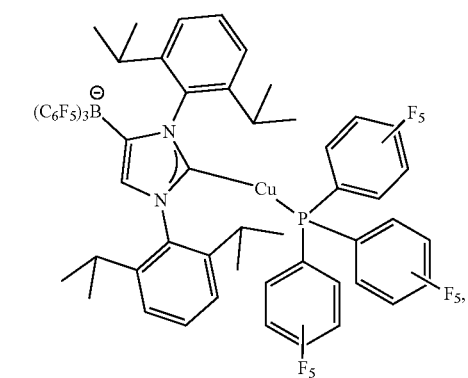
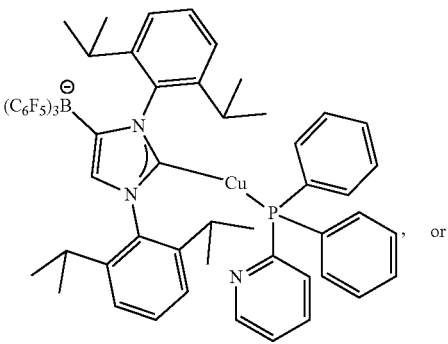

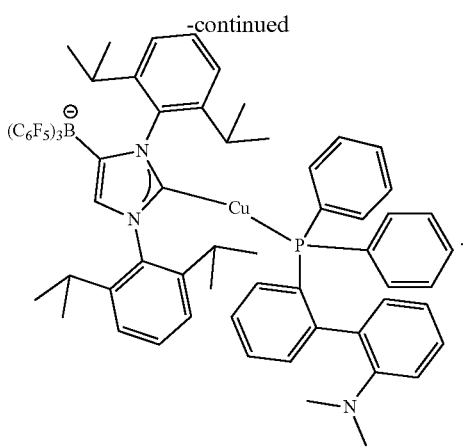

In some embodiments, the luminescent composition may further include a solvent component.

In some embodiments, the luminescent composition may be in a powder form.

In some embodiments, a wavelength of luminescence emission of the composition may be about 400 to 600 nm.

In an aspect, provided is a method of manufacturing a device. The method may include coating the luminescent composition as described herein on a substrate.

In an aspect, also provided is a device including the luminescent composition as described herein.

In an aspect, provided is a compound (e.g., N-heterocyclic carbene (NHC) metal complex). The compound may have a structure of:

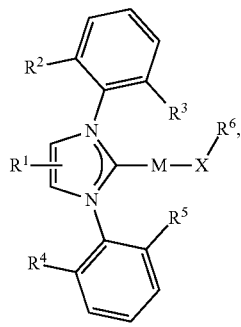

wherein:

$R^1$ is an anionic group;

Each $R^2$, $R^3$, $R^4$, and $R^5$ is independently is hydrogen, halogen, substituted or unsubstituted alkyl;

M is a metal or a metal ion;

X is a bond, —C($R^aR^b$)—, —N($R^c$)—, —NC—, —O—, —S—, or —P($R^eR^f$)—;

$R^6$ is hydrogen, halogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl, or $R^6$ and any atom of X, $R^a$, $R^b$, $R^c$, $R^d$, $R^e$, and $R^f$ together with atoms connected thereto form substituted or unsubstituted cycloalkyl, substituted or unsubstituted heterocycloalkyl, substituted or unsubstituted aryl, or substituted or unsubstituted heteroaryl;

Each $R^a$, $R^b$, $R^c$, $R^d$, $R^e$, and $R^f$ is independently hydrogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl.

In some embodiments, the compound may further include a counterion (e.g., cation).

In some embodiments, the compound is:

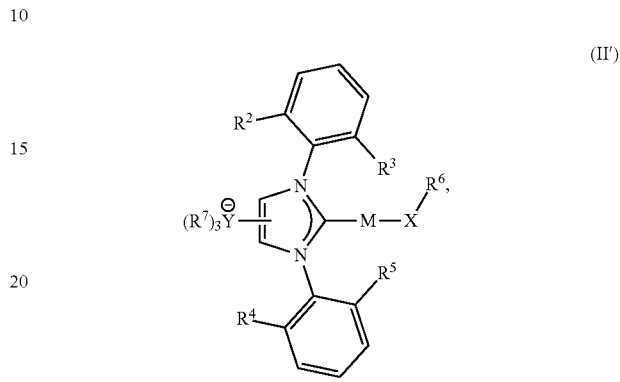

wherein:

Y is B or Al, and $R^7$ is independently hydrogen, halogen, substituted or unsubstituted alkyl, substituted or unsubstituted heteroalkyl, substituted or unsubstituted cycloalkyl, substituted or unsubstituted aryl, or substituted or unsubstituted heteroaryl.

In some embodiments, $R^7$ is independently $R^8$-substituted or unsubstituted phenyl, $R^8$-substituted or unsubstituted pyrrolidinyl, or —N($R^8$)$_2$; $R^8$ is halogen, —CH$_3$, —OCH$_3$, —CH$_2$CH$_3$, —OCH$_2$CH$_3$, —CX$^1_3$, —CHX$^1_2$, —CH$_2$X$^1$, —OCX$^1_3$, —OCH$_2$X$^1$, or —OCHX$^1_2$; and $X^1$ is —F, —Cl, —Br, or —I.

In some embodiments, X is —NC—; and $R^6$ is hydrogen, or substituted or unsubstituted alkyl.

In some embodiments, X is —O— or —S—; and $R^6$ is hydrogen, substituted or unsubstituted alkyl, or substituted or unsubstituted phenyl.

In some embodiments, X is —N($R^c$)—; and each $R^6$ and $R^c$ is independently substituted or unsubstituted phenyl.

In some embodiments, X is a bond; and $R^6$ is substituted or unsubstituted heterocycloalkyl, or substituted or unsubstituted heteroaryl.

In some embodiments, X is —P($R^eR^f$)—; each $R^6$, $R^e$, and $R^f$ is independently

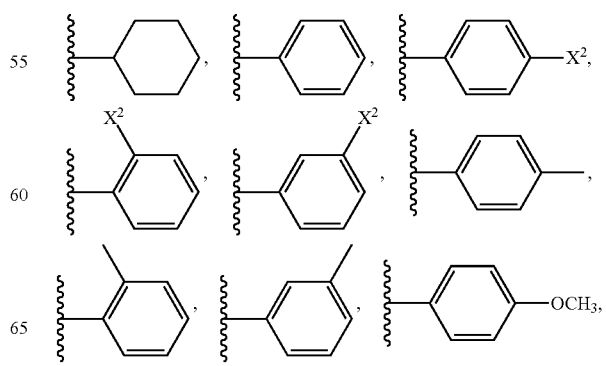

-continued

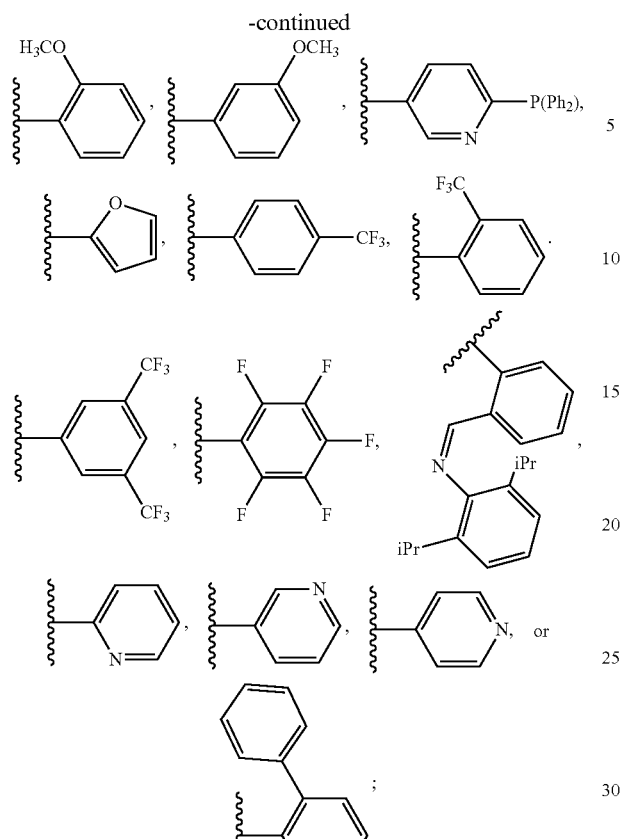

$X^2$ is —F, —Cl, —Br, or —I,
provided that at least one of $R^6$, $R^e$, and $R^f$ are not

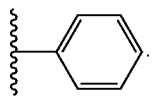

In some embodiments, each $R^2$, $R^3$, $R^4$, and $R^5$ is independently is hydrogen, or unsubstituted $C_1$-$C_4$ alkyl.

In some embodiments, the compound has the structure of:

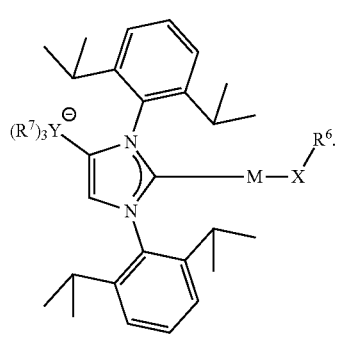

(III')

In some embodiments, M is Au, Cu, Au$^+$, Cu$^+$, Ag, or Ag$^+$.
In some embodiments, the counterion is Na$^+$, K$^+$, or Li$^+$.

Example compounds may include, but be not limited to:

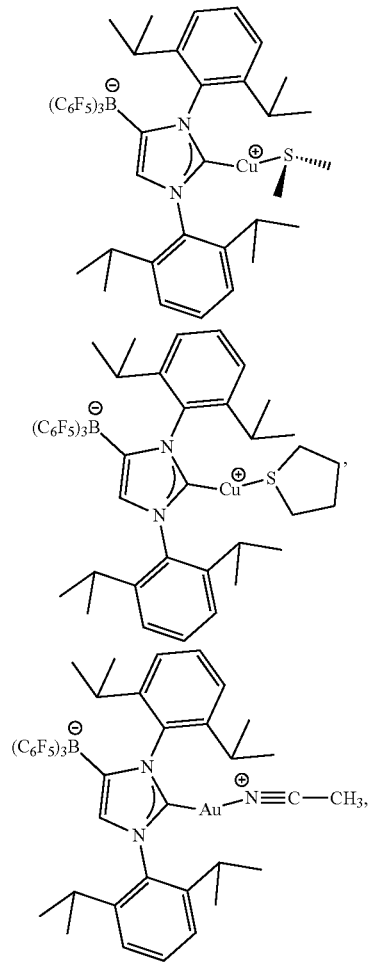

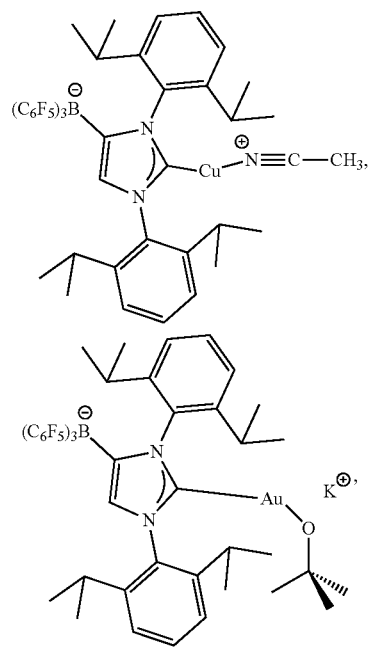

-continued
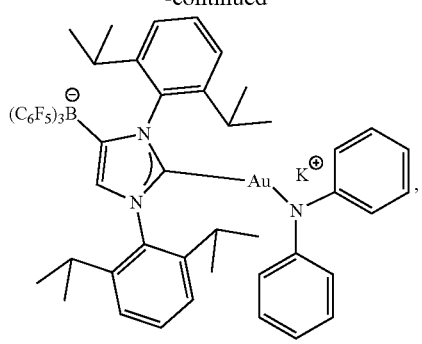
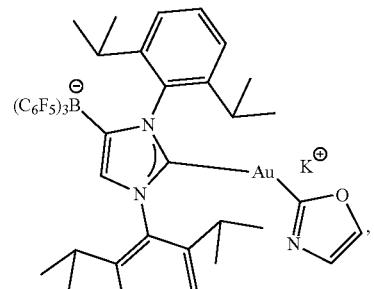
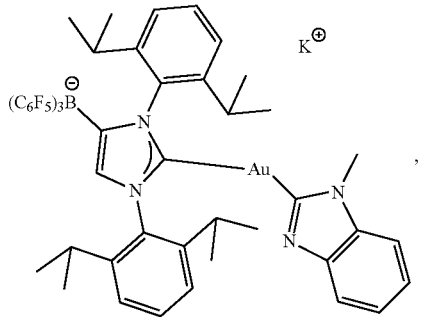
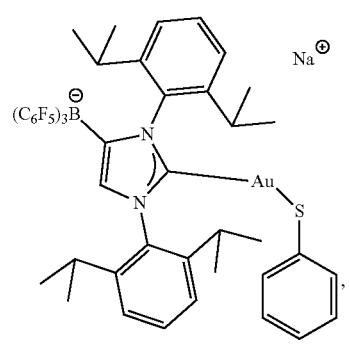
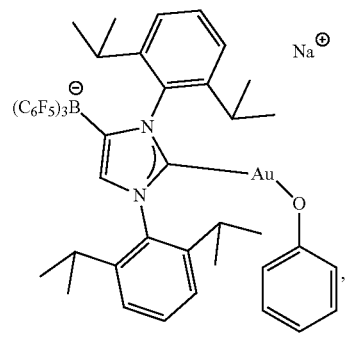
-continued
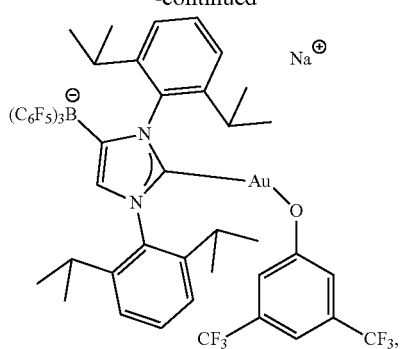
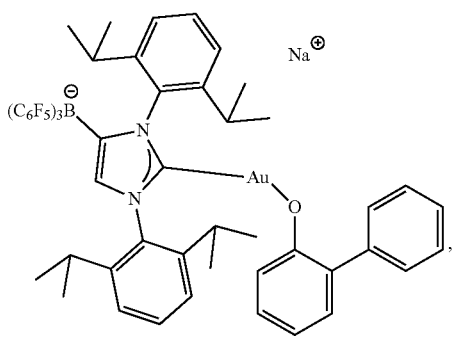
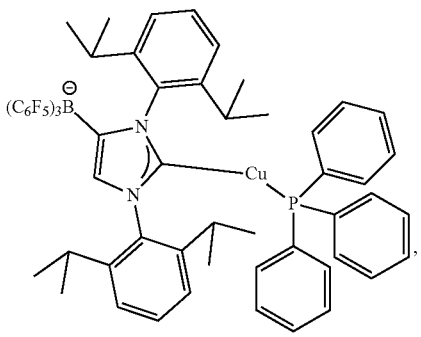
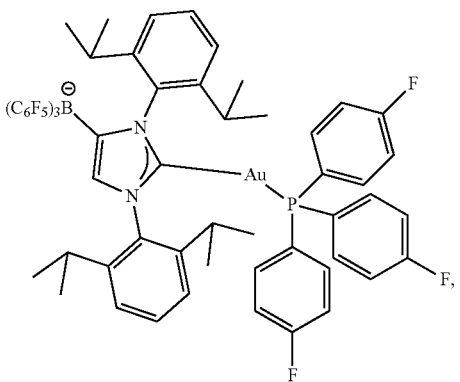

-continued
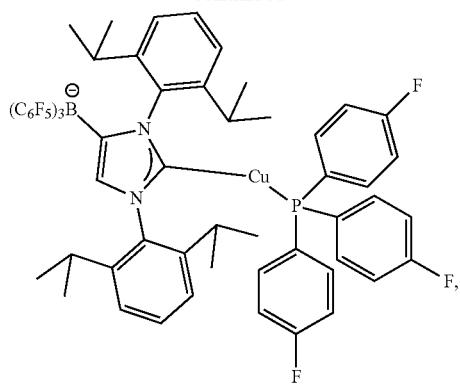
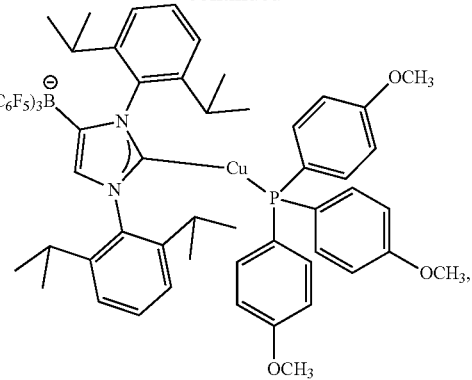
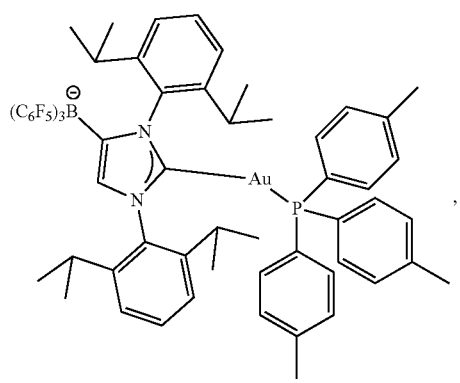
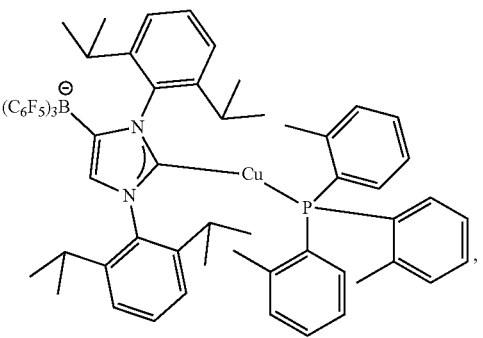
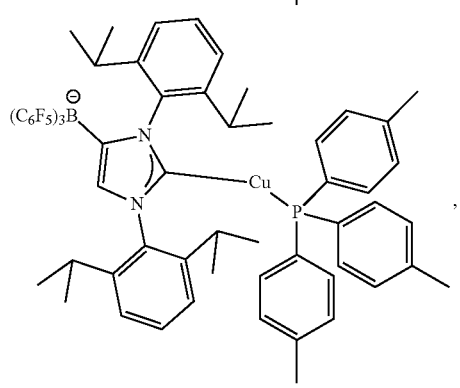
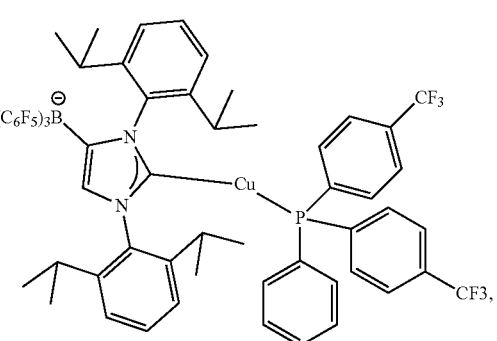
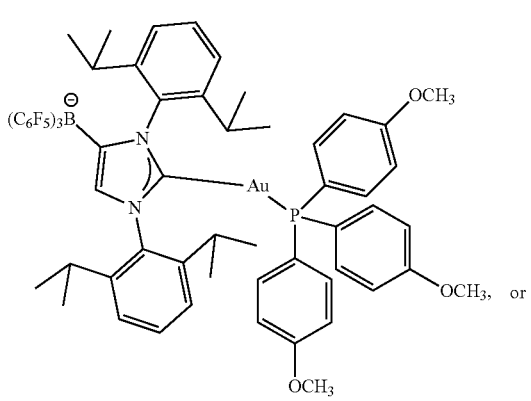
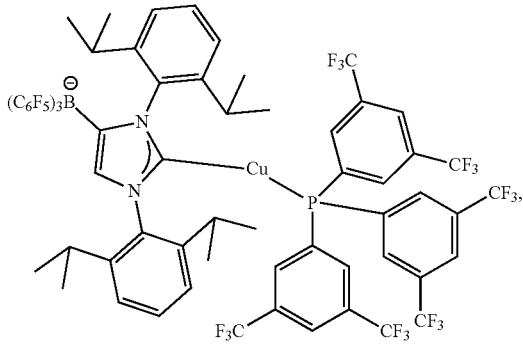

-continued
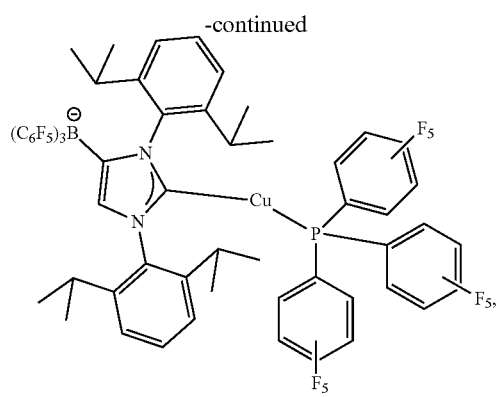
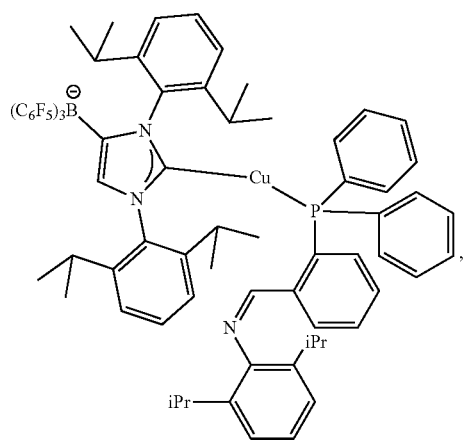
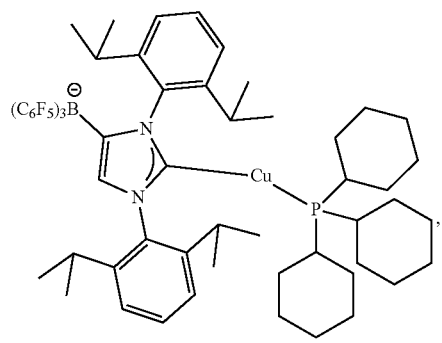
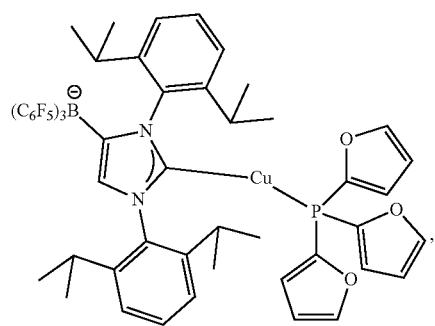
-continued
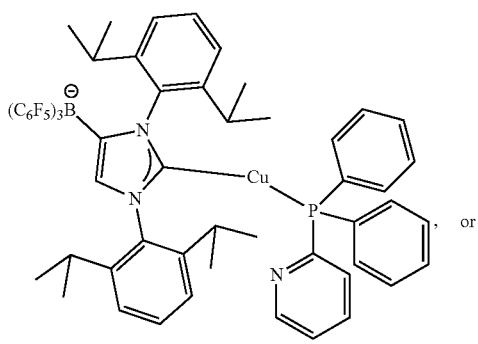, or
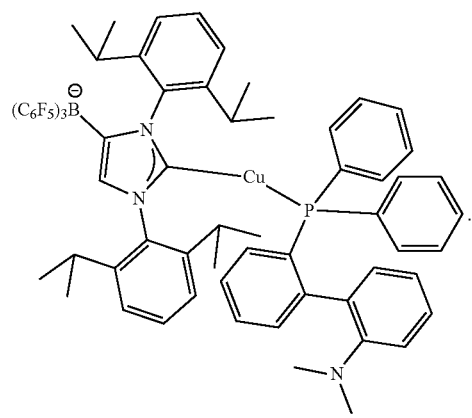.
In some embodiments, the compound is not
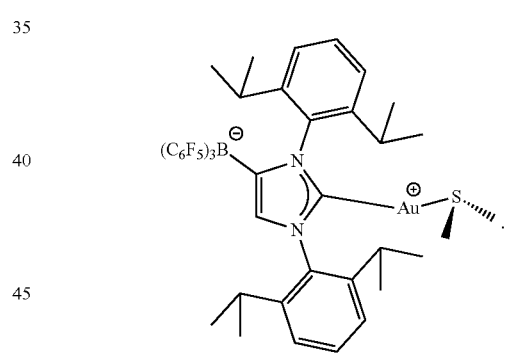
In some embodiments, the compound is not
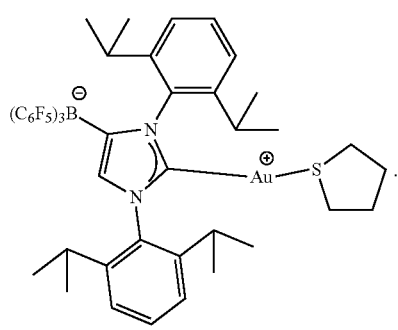.

In some embodiments, the compound is not

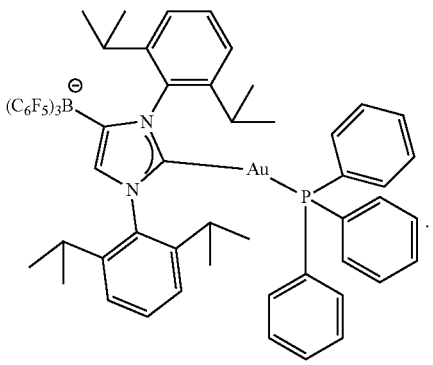

Other aspects of the invention are disclosed infra.

BRIEF DESCRIPTION OF DRAWING

The patent or application file contains at least one drawing executed in color. Copies of this patent or patent application publication with color drawings will be provided by the Office upon request and payment of the necessary fee.

Figure 1:
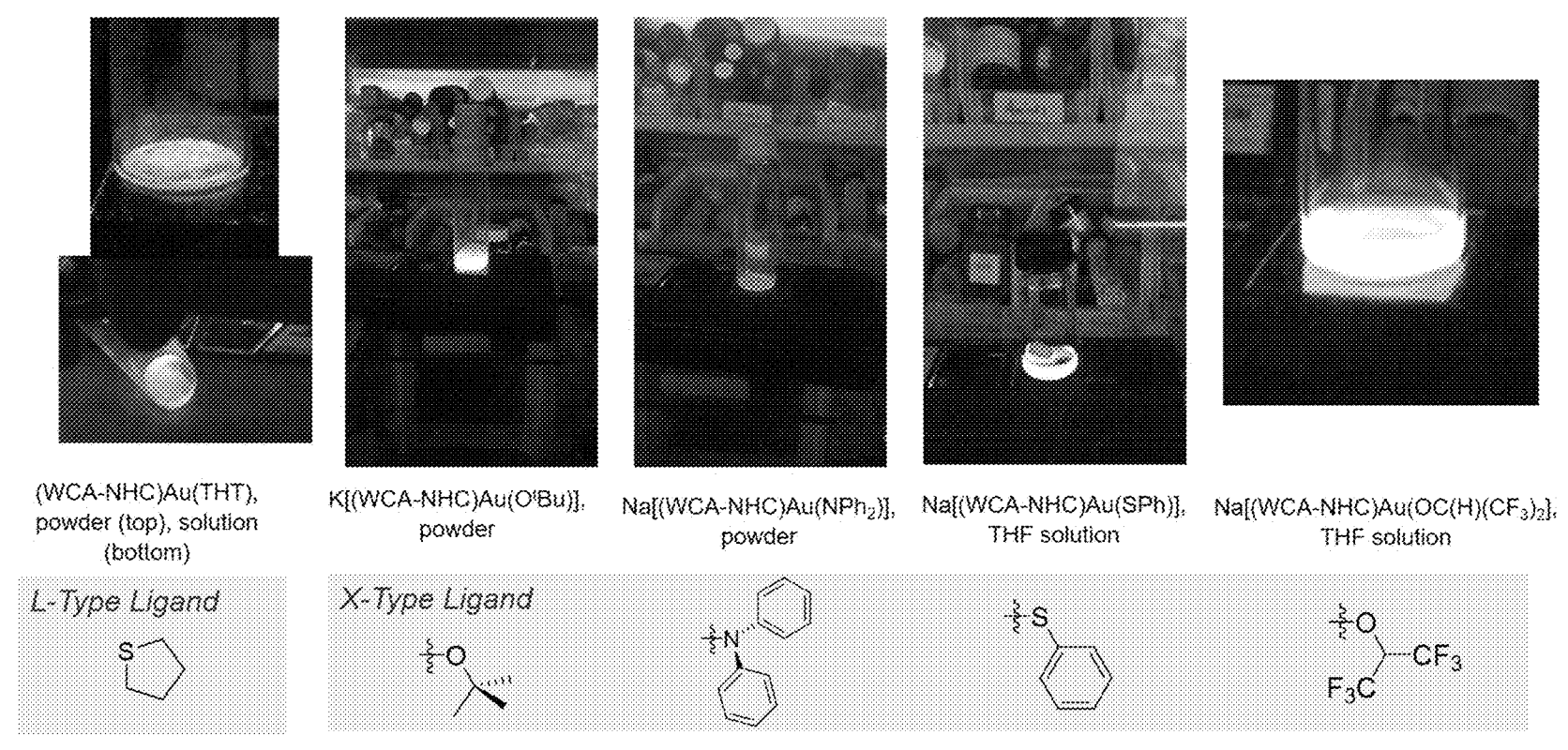

FIG. 1 shows luminescence of exemplary compounds (Au(I) complexes) according to an exemplary embodiment of the present invention.

DETAILED DESCRIPTION

Definition

Figure 2:
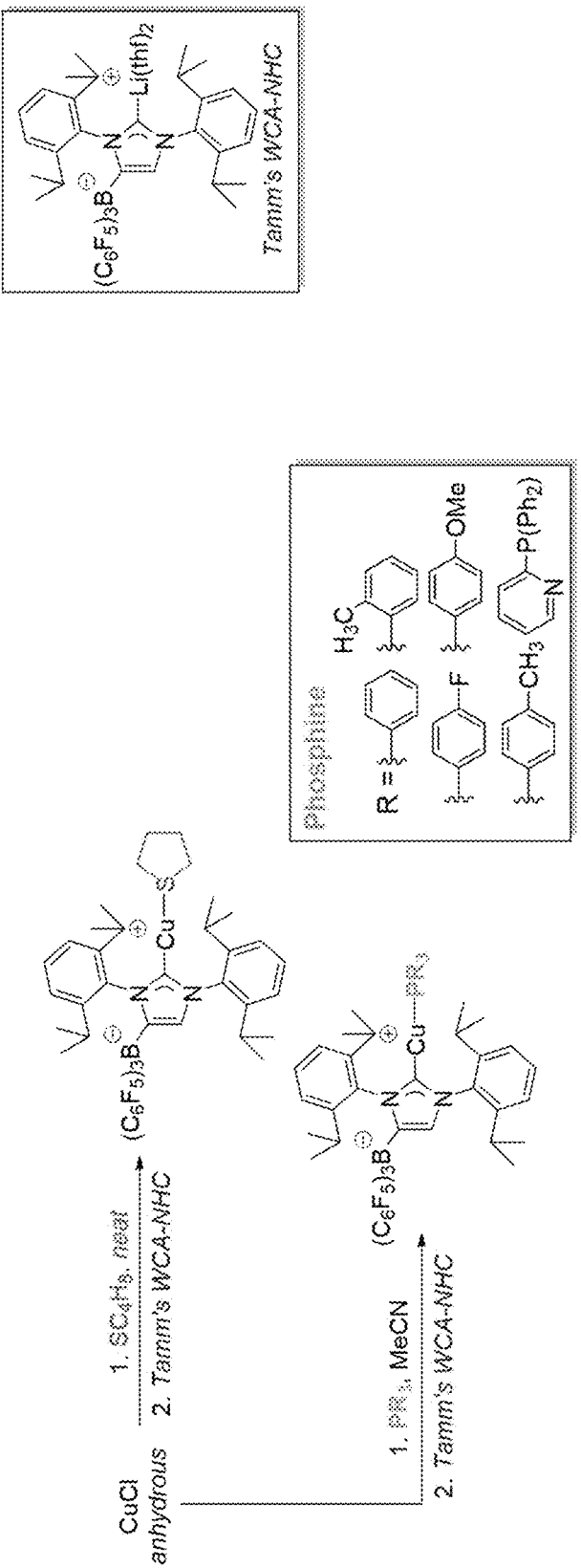
FIG. 2 shows an exemplary synthesis of Cu(I) complexes according to an exemplary embodiment of the present invention.
Figure 3:
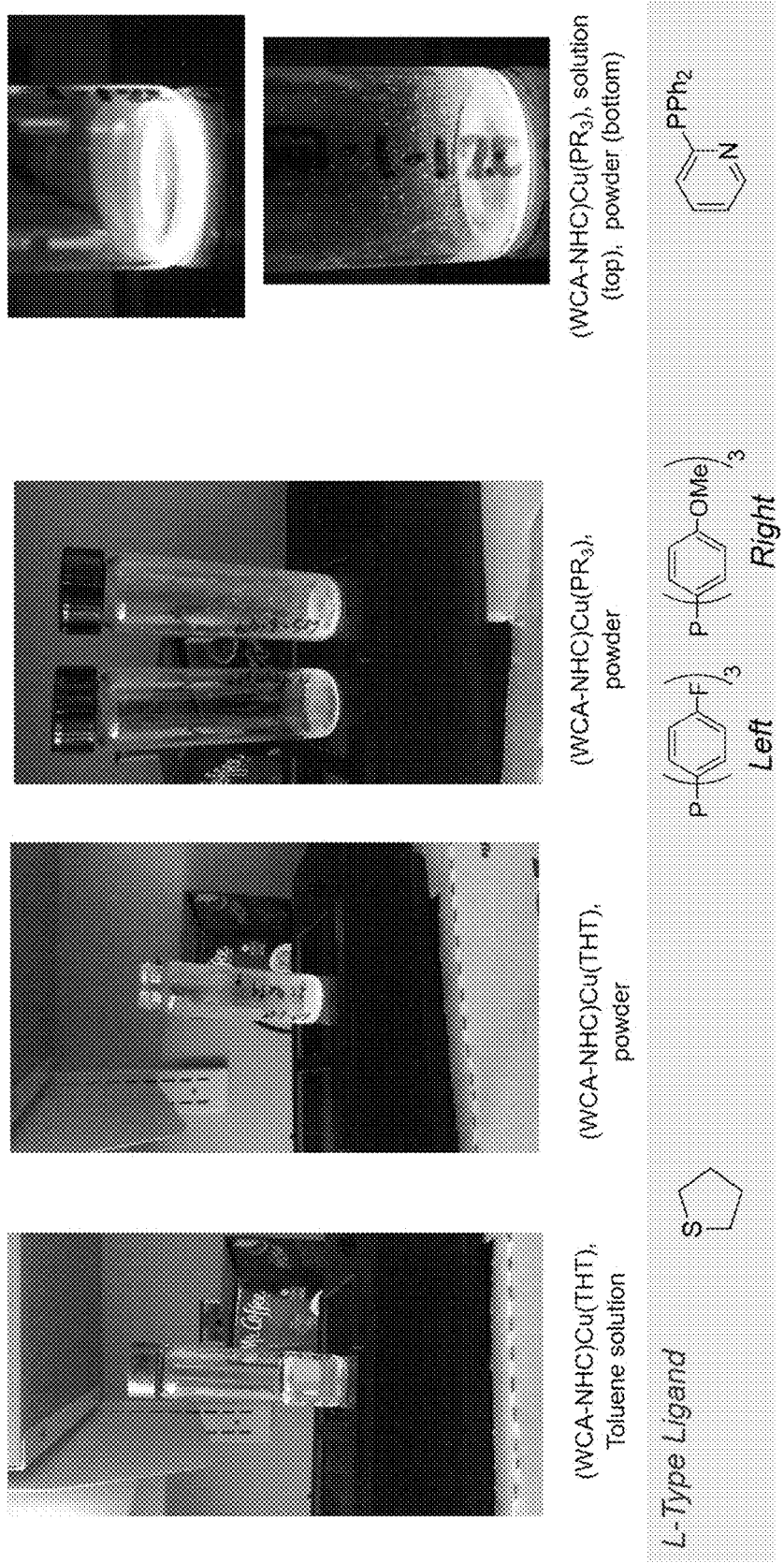
FIG. 3 shows luminescence of exemplary compounds (Cu(I) complexes) according to an exemplary embodiment of the present invention.
Figure 4:
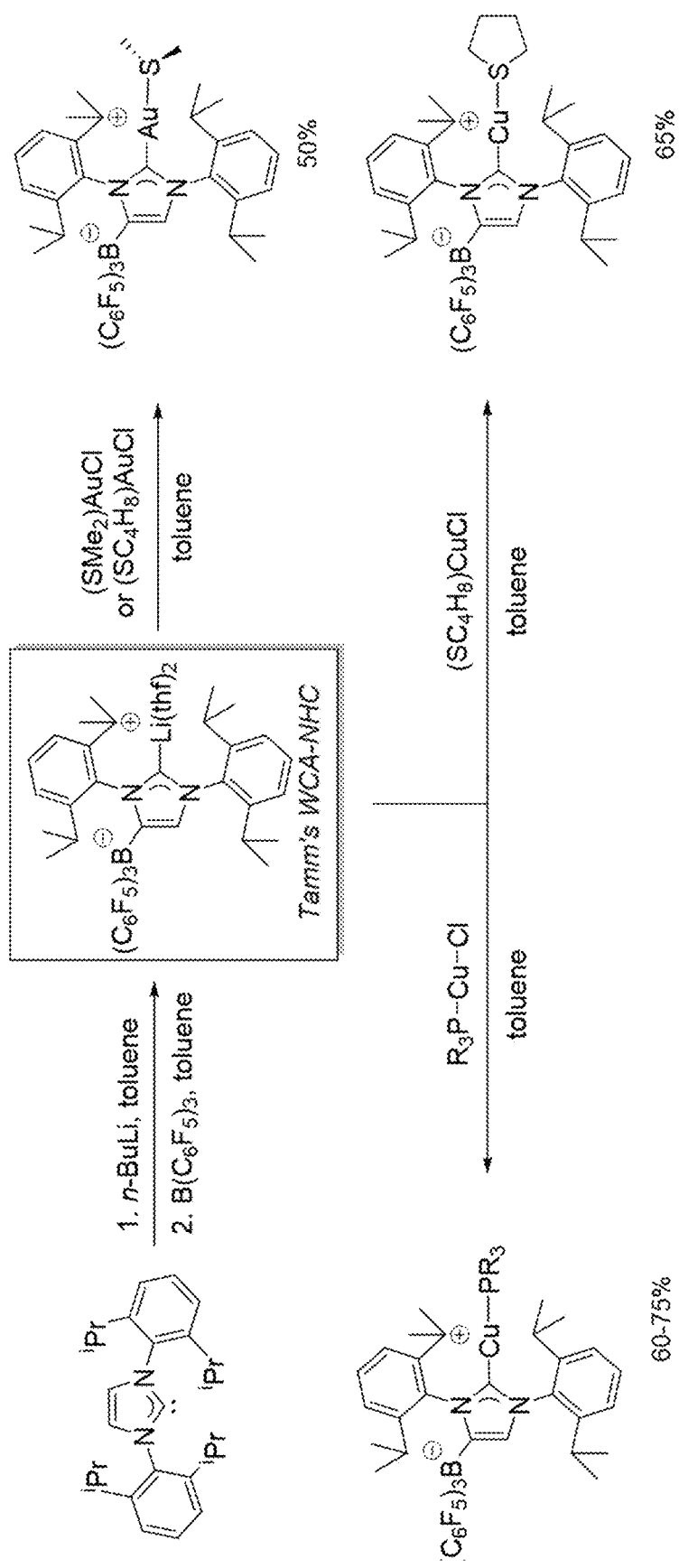
FIG. 4 shows an exemplary synthesis of Au (I) comples and Cu(I) complexes according to an exemplary embodiment of the present invention.

The abbreviations used herein have their conventional meaning within the chemical and biological arts. The chemical structures and formulae set forth herein are constructed according to the standard rules of chemical valency known in the chemical arts.

Where substituent groups are specified by their conventional chemical formulae, written from left to right, they equally encompass the chemically identical substituents that would result from writing the structure from right to left, e.g., —CH$_2$O— is equivalent to —OCH$_2$—.

The term "alkyl," by itself or as part of another substituent, means, unless otherwise stated, a straight (i.e., unbranched) or branched carbon chain (or carbon), or combination thereof, which may be fully saturated, mono- or polyunsaturated and can include mono-, di- and multivalent radicals. The alkyl may include a designated number of carbons (e.g., $C_1$-$C_{10}$ means one to ten carbons). Alkyl is an uncyclized chain. Examples of saturated hydrocarbon radicals include, but are not limited to, groups such as methyl, ethyl, n-propyl, isopropyl, n-butyl, t-butyl, isobutyl, sec-butyl, methyl, homologs and isomers of, for example, n-pentyl, n-hexyl, n-heptyl, n-octyl, and the like. An unsaturated alkyl group is one having one or more double bonds or triple bonds. Examples of unsaturated alkyl groups include, but are not limited to, vinyl, 2-propenyl, crotyl, 2-isopentenyl, 2-(butadienyl), 2,4-pentadienyl, 3-(1,4-pentadienyl), ethynyl, 1- and 3-propynyl, 3-butynyl, and the higher homologs and isomers. An alkoxy is an alkyl attached to the remainder of the molecule via an oxygen linker (—O—). An alkyl moiety may be an alkenyl moiety. An alkyl moiety may be an alkynyl moiety. An alkyl moiety may be fully saturated. An alkenyl may include more than one double bond and/or one or more triple bonds in addition to the one or more double bonds. An alkynyl may include more than one triple bond and/or one or more double bonds in addition to the one or more triple bonds.

In embodiments, the term "cycloalkyl" means a monocyclic, bicyclic, or a multicyclic cycloalkyl ring system. In embodiments, monocyclic ring systems are cyclic hydrocarbon groups containing from 3 to 8 carbon atoms, where such groups can be saturated or unsaturated, but not aromatic. In embodiments, cycloalkyl groups are fully saturated. Examples of monocyclic cycloalkyls include cyclopropyl, cyclobutyl, cyclopentyl, cyclopentenyl, cyclohexyl, cyclohexenyl, cycloheptyl, and cyclooctyl. Bicyclic cycloalkyl ring systems are bridged monocyclic rings or fused bicyclic rings. In embodiments, bridged monocyclic rings contain a monocyclic cycloalkyl ring where two non adjacent carbon atoms of the monocyclic ring are linked by an alkylene bridge of between one and three additional carbon atoms (i.e., a bridging group of the form $(CH_2)_w$, where w is 1, 2, or 3). Representative examples of bicyclic ring systems include, but are not limited to, bicyclo[3.1.1]heptane, bicyclo[2.2.1]heptane, bicyclo[2.2.2]octane, bicyclo[3.2.2]nonane, bicyclo[3.3.1]nonane, and bicyclo[4.2.1]nonane. In embodiments, fused bicyclic cycloalkyl ring systems contain a monocyclic cycloalkyl ring fused to either a phenyl, a monocyclic cycloalkyl, a monocyclic cycloalkenyl, a monocyclic heterocyclyl, or a monocyclic heteroaryl. In embodiments, the bridged or fused bicyclic cycloalkyl is attached to the parent molecular moiety through any carbon atom contained within the monocyclic cycloalkyl ring. In embodiments, cycloalkyl groups are optionally substituted with one or two groups which are independently oxo or thia. In embodiments, the fused bicyclic cycloalkyl is a 5 or 6 membered monocyclic cycloalkyl ring fused to either a phenyl ring, a 5 or 6 membered monocyclic cycloalkyl, a 5 or 6 membered monocyclic cycloalkenyl, a 5 or 6 membered monocyclic heterocyclyl, or a 5 or 6 membered monocyclic heteroaryl, wherein the fused bicyclic cycloalkyl is optionally substituted by one or two groups which are independently oxo or thia. In embodiments, multicyclic cycloalkyl ring systems are a monocyclic cycloalkyl ring (base ring) fused to either (i) one ring system selected from the group consisting of a bicyclic aryl, a bicyclic heteroaryl, a bicyclic cycloalkyl, a bicyclic cycloalkenyl, and a bicyclic heterocyclyl; or (ii) two other ring systems independently selected from the group consisting of a phenyl, a bicyclic aryl, a monocyclic or bicyclic heteroaryl, a monocyclic or bicyclic cycloalkyl, a monocyclic or bicyclic cycloalkenyl, and a monocyclic or bicyclic heterocyclyl. In embodiments, the multicyclic cycloalkyl is attached to the parent molecular moiety through any carbon atom contained within the base ring. In embodiments, multicyclic cycloalkyl ring systems are a monocyclic cycloalkyl ring (base ring) fused to either (i) one ring system selected from the group consisting of a bicyclic aryl, a bicyclic heteroaryl, a bicyclic cycloalkyl, a bicyclic cycloalkenyl, and a bicyclic heterocyclyl; or (ii) two other ring systems independently selected from the group consisting of a phenyl, a monocyclic heteroaryl, a monocyclic cycloalkyl, a monocyclic cycloalkenyl, and a monocyclic heterocyclyl. Examples of multicyclic cycloalkyl groups include, but are not limited to tetradecahydrophenanthrenyl, perhydrophenothiazin-1-yl, and perhydrophenoxazin-1-yl.

In embodiments, a cycloalkyl is a cycloalkenyl. The term "cycloalkenyl" is used in accordance with its plain ordinary meaning. In embodiments, a cycloalkenyl is a monocyclic, bicyclic, or a multicyclic cycloalkenyl ring system. In embodiments, monocyclic cycloalkenyl ring systems are cyclic hydrocarbon groups containing from 3 to 8 carbon atoms, where such groups are unsaturated (i.e., containing at least one annular carbon carbon double bond), but not aromatic. Examples of monocyclic cycloalkenyl ring systems include cyclopentenyl and cyclohexenyl. In embodiments, bicyclic cycloalkenyl rings are bridged monocyclic rings or a fused bicyclic rings. In embodiments, bridged monocyclic rings contain a monocyclic cycloalkenyl ring where two non adjacent carbon atoms of the monocyclic ring are linked by an alkylene bridge of between one and three additional carbon atoms (i.e., a bridging group of the form $(CH_2)_w$, where w is 1, 2, or 3). Representative examples of bicyclic cycloalkenyls include, but are not limited to, norbornenyl and bicyclo[2.2.2]oct 2 enyl. In embodiments, fused bicyclic cycloalkenyl ring systems contain a monocyclic cycloalkenyl ring fused to either a phenyl, a monocyclic cycloalkyl, a monocyclic cycloalkenyl, a monocyclic heterocyclyl, or a monocyclic heteroaryl. In embodiments, the bridged or fused bicyclic cycloalkenyl is attached to the parent molecular moiety through any carbon atom contained within the monocyclic cycloalkenyl ring. In embodiments, cycloalkenyl groups are optionally substituted with one or two groups which are independently oxo or thia. In embodiments, multicyclic cycloalkenyl rings contain a monocyclic cycloalkenyl ring (base ring) fused to either (i) one ring system selected from the group consisting of a bicyclic aryl, a bicyclic heteroaryl, a bicyclic cycloalkyl, a bicyclic cycloalkenyl, and a bicyclic heterocyclyl; or (ii) two ring systems independently selected from the group consisting of a phenyl, a bicyclic aryl, a monocyclic or bicyclic heteroaryl, a monocyclic or bicyclic cycloalkyl, a monocyclic or bicyclic cycloalkenyl, and a monocyclic or bicyclic heterocyclyl. In embodiments, the multicyclic cycloalkenyl is attached to the parent molecular moiety through any carbon atom contained within the base ring. In embodiments, multicyclic cycloalkenyl rings contain a monocyclic cycloalkenyl ring (base ring) fused to either (i) one ring system selected from the group consisting of a bicyclic aryl, a bicyclic heteroaryl, a bicyclic cycloalkyl, a bicyclic cycloalkenyl, and a bicyclic heterocyclyl; or (ii) two ring systems independently selected from the group consisting of a phenyl, a monocyclic heteroaryl, a monocyclic cycloalkyl, a monocyclic cycloalkenyl, and a monocyclic heterocyclyl.

In embodiments, a heterocycloalkyl is a heterocyclyl. The term "heterocyclyl" as used herein, means a monocyclic, bicyclic, or multicyclic heterocycle. The heterocyclyl monocyclic heterocycle is a 3, 4, 5, 6 or 7 membered ring containing at least one heteroatom independently selected from the group consisting of O, N, and S where the ring is saturated or unsaturated, but not aromatic. The 3 or 4 membered ring contains 1 heteroatom selected from the group consisting of O, N and S. The 5 membered ring can contain zero or one double bond and one, two or three heteroatoms selected from the group consisting of O, N and S. The 6 or 7 membered ring contains zero, one or two double bonds and one, two or three heteroatoms selected from the group consisting of O, N and S. The heterocyclyl monocyclic heterocycle is connected to the parent molecular moiety through any carbon atom or any nitrogen atom contained within the heterocyclyl monocyclic heterocycle. Representative examples of heterocyclyl monocyclic heterocycles include, but are not limited to, azetidinyl, azepanyl, aziridinyl, diazepanyl, 1,3 dioxanyl, 1,3 dioxolanyl, 1,3 dithiolanyl, 1,3 dithianyl, imidazolinyl, imidazolidinyl, isothiazolinyl, isothiazolidinyl, isoxazolinyl, isoxazolidinyl, morpholinyl, oxadiazolinyl, oxadiazolidinyl, oxazolinyl, oxazolidinyl, piperazinyl, piperidinyl, pyranyl, pyrazolinyl, pyrazolidinyl, pyrrolinyl, pyrrolidinyl, tetrahydrofuranyl, tetrahydrothienyl, thiadiazolinyl, thiadiazolidinyl, thiazolinyl, thiazolidinyl, thiomorpholinyl, 1,1 dioxidothiomorpholinyl (thiomorpholine sulfone), thiopyranyl, and trithianyl. The heterocyclyl bicyclic heterocycle is a monocyclic heterocycle fused to either a phenyl, a monocyclic cycloalkyl, a monocyclic cycloalkenyl, a monocyclic heterocycle, or a monocyclic heteroaryl. The heterocyclyl bicyclic heterocycle is connected to the parent molecular moiety through any carbon atom or any nitrogen atom contained within the monocyclic heterocycle portion of the bicyclic ring system. Representative examples of bicyclic heterocyclyls include, but are not limited to, 2,3 dihydrobenzofuran 2 yl, 2,3 dihydrobenzofuran 3 yl, indolin 1 yl, indolin 2 yl, indolin 3 yl, 2,3 dihydrobenzothien 2 yl, decahydroquinolinyl, decahydroisoquinolinyl, octahydro 1H indolyl, and octahydrobenzofuranyl. In embodiments, heterocyclyl groups are optionally substituted with one or two groups which are independently oxo or thia. In certain embodiments, the bicyclic heterocyclyl is a 5 or 6 membered monocyclic heterocyclyl ring fused to a phenyl ring, a 5 or 6 membered monocyclic cycloalkyl, a 5 or 6 membered monocyclic cycloalkenyl, a 5 or 6 membered monocyclic heterocyclyl, or a 5 or 6 membered monocyclic heteroaryl, wherein the bicyclic heterocyclyl is optionally substituted by one or two groups which are independently oxo or thia. Multicyclic heterocyclyl ring systems are a monocyclic heterocyclyl ring (base ring) fused to either (i) one ring system selected from the group consisting of a bicyclic aryl, a bicyclic heteroaryl, a bicyclic cycloalkyl, a bicyclic cycloalkenyl, and a bicyclic heterocyclyl; or (ii) two other ring systems independently selected from the group consisting of a phenyl, a bicyclic aryl, a monocyclic or bicyclic heteroaryl, a monocyclic or bicyclic cycloalkyl, a monocyclic or bicyclic cycloalkenyl, and a monocyclic or bicyclic heterocyclyl. The multicyclic heterocyclyl is attached to the parent molecular moiety through any carbon atom or nitrogen atom contained within the base ring. In embodiments, multicyclic heterocyclyl ring systems are a monocyclic heterocyclyl ring (base ring) fused to either (i) one ring system selected from the group consisting of a bicyclic aryl, a bicyclic heteroaryl, a bicyclic cycloalkyl, a bicyclic cycloalkenyl, and a bicyclic heterocyclyl; or (ii) two other ring systems independently selected from the group consisting of a phenyl, a monocyclic heteroaryl, a monocyclic cycloalkyl, a monocyclic cycloalkenyl, and a monocyclic heterocyclyl. Examples of multicyclic heterocyclyl groups include, but are not limited to 10H-phenothiazin-10-yl, 9,10-dihydroacridin-9-yl, 9,10-dihydroacridin-10-yl, 10H- phenoxazin-10-yl, 10,11-dihydro-5H-dibenzo[b,f]azepin-5-yl, 1,2,3,4-tetrahydropyrido[4,3-g]isoquinolin-2-yl, 12H-benzo[b]phenoxazin-12-yl, and dodecahydro-1H-carbazol-9-yl.

The term "alkylene," by itself or as part of another substituent, means, unless otherwise stated, a divalent radical derived from an alkyl, as exemplified, but not limited by, —$CH_2CH_2CH_2CH_2$—. Typically, an alkyl (or alkylene) group will have from 1 to 24 carbon atoms, with those groups having 10 or fewer carbon atoms being preferred herein. A "lower alkyl" or "lower alkylene" is a shorter chain alkyl or alkylene group, generally having eight or fewer carbon atoms. The term "alkenylene," by itself or as part of another substituent, means, unless otherwise stated, a divalent radical derived from an alkene.

The term "heteroalkyl," by itself or in combination with another term, means, unless otherwise stated, a stable straight or branched chain, or combinations thereof, including at least one carbon atom and at least one heteroatom (e.g., O, N, P, Si, and S), and wherein the nitrogen and sulfur atoms may optionally be oxidized, and the nitrogen heteroatom may optionally be quaternized. The heteroatom(s) (e.g., N, S, Si, or P) may be placed at any interior position of the heteroalkyl group or at the position at which the alkyl group is attached to the remainder of the molecule. Heteroalkyl is an uncyclized chain. Examples include, but are not limited to: —$CH_2$—$CH_2$—O—$CH_3$, —$CH_2$—$CH_2$—NH—$CH_3$, —$CH_2$—$CH_2$—N($CH_3$)—$CH_3$, —$CH_2$—S—$CH_2$-CTE, —$CH_2$—$CH_2$, —S(O)—$CH_3$, —$CH_2$—$CH_2$—S(O)$_2$—$CH_3$, —CH=CHO—$CH_3$, —Si($CH_3$)$_3$, —$CH_2$—CH=N—$OCH_3$, —CH=CH—N($CH_3$)—$CH_3$, —O—$CH_3$, —O—$CH_2$—$CH_3$, and —CN. Up to two or three heteroatoms may be consecutive, such as, for example, —$CH_2$—NH—$OCH_3$ and —$CH_2$—O—Si($CH_3$)$_3$. A heteroalkyl moiety may include one heteroatom (e.g., O, N, S, Si, or P). A heteroalkyl moiety may include two optionally different heteroatoms (e.g., O, N, S, Si, or P). A heteroalkyl moiety may include three optionally different heteroatoms (e.g., O, N, S, Si, or P). A heteroalkyl moiety may include four optionally different heteroatoms (e.g., O, N, S, Si, or P). A heteroalkyl moiety may include five optionally different heteroatoms (e.g., O, N, S, Si, or P). A heteroalkyl moiety may include up to 8 optionally different heteroatoms (e.g., O, N, S, Si, or P). The term "heteroalkenyl," by itself or in combination with another term, means, unless otherwise stated, a heteroalkyl including at least one double bond. A heteroalkenyl may optionally include more than one double bond and/or one or more triple bonds in additional to the one or more double bonds. The term "heteroalkynyl," by itself or in combination with another term, means, unless otherwise stated, a heteroalkyl including at least one triple bond. A heteroalkynyl may optionally include more than one triple bond and/or one or more double bonds in additional to the one or more triple bonds. Similarly, the term "heteroalkylene," by itself or as part of another substituent, means, unless otherwise stated, a divalent radical derived from heteroalkyl, as exemplified, but not limited by, —$CH_2$—$CH_2$—S—$CH_2$—$CH_2$— and —$CH_2$—S—$CH_2$—$CH_2$—NH—$CH_2$—. For heteroalkylene groups, heteroatoms can also occupy either or both of the chain termini (e.g., alkyleneoxy, alkylenedioxy, alkyleneamino, alkylenediamino, and the like). Still further, for alkylene and heteroalkylene linking groups, no orientation of the linking group is implied by the direction in which the formula of the linking group is written. For example, the formula —C(O)$_2$R'— represents both —C(O)$_2$R'— and —R'C(O)$_2$—. As described above, heteroalkyl groups, as used herein, include those groups that are attached to the remainder of the molecule through a heteroatom, such as —C(O)R', —C(O)NR', —NR'R", —OR', —SR', and/or —SO$_2$R'. Where "heteroalkyl" is recited, followed by recitations of specific heteroalkyl groups, such as —NR'R" or the like, it will be understood that the terms heteroalkyl and —NR'R" are not redundant or mutually exclusive. Rather, the specific heteroalkyl groups are recited to add clarity. Thus, the term "heteroalkyl" should not be interpreted herein as excluding specific heteroalkyl groups, such as —NR'R" or the like.

The terms "cycloalkyl" and "heterocycloalkyl," by themselves or in combination with other terms, mean, unless otherwise stated, cyclic versions of "alkyl" and "heteroalkyl," respectively. Cycloalkyl and heterocycloalkyl are not aromatic. Additionally, for heterocycloalkyl, a heteroatom can occupy the position at which the heterocycle is attached to the remainder of the molecule. Examples of cycloalkyl include, but are not limited to, cyclopropyl, cyclobutyl, cyclopentyl, cyclohexyl, 1-cyclohexenyl, 3-cyclohexenyl, cycloheptyl, and the like. Examples of heterocycloalkyl include, but are not limited to, 1-(1,2,5,6-tetrahydropyridyl), 1-piperidinyl, 2-piperidinyl, 3-piperidinyl, 4-morpholinyl, 3-morpholinyl, tetrahydrofuran-2-yl, tetrahydrofuran-3-yl, tetrahydrothien-2-yl, tetrahydrothien-3-yl, 1-piperazinyl, 2-piperazinyl, and the like. A "cycloalkylene" and a "heterocycloalkylene," alone or as part of another substituent, means a divalent radical derived from a cycloalkyl and heterocycloalkyl, respectively.

The terms "halo" or "halogen," by themselves or as part of another substituent, mean, unless otherwise stated, a fluorine, chlorine, bromine, or iodine atom. Additionally, terms such as "haloalkyl" are meant to include monohaloalkyl and polyhaloalkyl. For example, the term "halo($C_1$-$C_4$)alkyl" includes, but is not limited to, fluoromethyl, difluoromethyl, trifluoromethyl, 2,2,2-trifluoroethyl, 4-chlorobutyl, 3-bromopropyl, and the like.

The term "acyl" means, unless otherwise stated, —C(O)R where R is a substituted or unsubstituted alkyl, substituted or unsubstituted cycloalkyl, substituted or unsubstituted heteroalkyl, substituted or unsubstituted heterocycloalkyl, substituted or unsubstituted aryl, or substituted or unsubstituted heteroaryl.

The term "aryl" means, unless otherwise stated, a polyunsaturated, aromatic, hydrocarbon substituent, which can be a single ring or multiple rings (preferably from 1 to 3 rings) that are fused together (i.e., a fused ring aryl) or linked covalently. A fused ring aryl refers to multiple rings fused together wherein at least one of the fused rings is an aryl ring. The term "heteroaryl" refers to aryl groups (or rings) that contain at least one heteroatom such as N, O, or S, wherein the nitrogen and sulfur atoms are optionally oxidized, and the nitrogen atom(s) are optionally quaternized. Thus, the term "heteroaryl" includes fused ring heteroaryl groups (i.e., multiple rings fused together wherein at least one of the fused rings is a heteroaromatic ring). A 5,6-fused ring heteroarylene refers to two rings fused together, wherein one ring has 5 members and the other ring has 6 members, and wherein at least one ring is a heteroaryl ring. Likewise, a 6,6-fused ring heteroarylene refers to two rings fused together, wherein one ring has 6 members and the other ring has 6 members, and wherein at least one ring is a heteroaryl ring. And a 6,5-fused ring heteroarylene refers to two rings fused together, wherein one ring has 6 members and the other ring has 5 members, and wherein at least one ring is a heteroaryl ring. A heteroaryl group can be attached to the remainder of the molecule through a carbon or heteroatom. Non-limiting examples of aryl and heteroaryl groups include phenyl, naphthyl, pyrrolyl, pyrazolyl, pyridazinyl, triazinyl, pyrimidinyl, imidazolyl, pyrazinyl, purinyl, oxazolyl, isoxazolyl, thiazolyl, furyl, thienyl, pyridyl, pyrimidyl, benzothiazolyl, benzoxazoyl benzimidazolyl, benzofuran, isobenzofuranyl, indolyl, isoindolyl, benzothiophenyl, isoquinolyl, quinoxalinyl, quinolyl, 1-naphthyl, 2-naphthyl, 4-biphenyl, 1-pyrrolyl, 2-pyrrolyl, 3-pyrrolyl, 3-pyrazolyl, 2-imidazolyl, 4-imidazolyl, pyrazinyl, 2-oxazolyl, 4-oxazolyl, 2-phenyl-4-oxazolyl, 5-oxazolyl, 3-isoxazolyl, 4-isoxazolyl, 5-isoxazolyl, 2-thiazolyl, 4-thiazolyl, 5-thiazolyl, 2-furyl, 3-furyl, 2-thienyl, 3-thienyl, 2-pyridyl, 3-pyridyl, 4-pyridyl, 2-pyrimidyl, 4-pyrimidyl, 5-benzothiazolyl, purinyl, 2-benzimidazolyl, 5-indolyl, 1-isoquinolyl, 5-isoquinolyl, 2-quinoxalinyl, 5-quinoxalinyl, 3-quinolyl, and 6-quinolyl. Substituents for each of the above noted aryl and heteroaryl ring systems are selected from the group of acceptable substituents described below. An "arylene" and a "heteroarylene," alone or as part of another substituent, mean a divalent radical derived from an aryl and heteroaryl, respectively. A heteroaryl group substituent may be —O— bonded to a ring heteroatom nitrogen.

Spirocyclic rings are two or more rings wherein adjacent rings are attached through a single atom. The individual rings within spirocyclic rings may be identical or different. Individual rings in spirocyclic rings may be substituted or unsubstituted and may have different substituents from other individual rings within a set of spirocyclic rings. Possible substituents for individual rings within spirocyclic rings are the possible substituents for the same ring when not part of spirocyclic rings (e.g. substituents for cycloalkyl or heterocycloalkyl rings). Spirocyclic rings may be substituted or unsubstituted cycloalkyl, substituted or unsubstituted cycloalkylene, substituted or unsubstituted heterocycloalkyl or substituted or unsubstituted heterocycloalkylene and individual rings within a spirocyclic ring group may be any of the immediately previous list, including having all rings of one type (e.g. all rings being substituted heterocycloalkylene wherein each ring may be the same or different substituted heterocycloalkylene). When referring to a spirocyclic ring system, heterocyclic spirocyclic rings means a spirocyclic rings wherein at least one ring is a heterocyclic ring and wherein each ring may be a different ring. When referring to a spirocyclic ring system, substituted spirocyclic rings means that at least one ring is substituted and each substituent may optionally be different.

The symbol " $\sim\!\!\sim\!\!\sim$ " denotes the point of attachment of a chemical moiety to the remainder of a molecule or chemical formula.

alkylarylene is unsubstituted.

Each of the above terms (e.g., "alkyl," "heteroalkyl," "cycloalkyl," "heterocycloalkyl," "aryl," and "heteroaryl") includes both substituted and unsubstituted forms of the indicated radical. Preferred substituents for each type of radical are provided below.

Substituents for the alkyl and heteroalkyl radicals (including those groups often referred to as alkylene, alkenyl, heteroalkylene, heteroalkenyl, alkynyl, cycloalkyl, heterocycloalkyl, cycloalkenyl, and heterocycloalkenyl) can be one or more of a variety of groups selected from, but not limited to, —OR', =O, =NR', =N—OR', —NR'R", —SR$^1$, -halogen, —SiR'R"R'", —OC(O)R', —C(O)R', —CO$_2$R', —CONR'R", —OC(O)NR'R", —NR"C(O)R', —NR'—C(O)NR"R'", —NR"C(O)$_2$R', —NR—C(NR'R"R'")=NR"", —NR—C(NR'R")=NR'", —S(O)R', —S(O)$_2$R', —S(O)$_2$NR'R", —NRSO$_2$R', —NR'NR"R'", —ONR'R", —NR'C(O)NR"NR'"R"", —CN, —NO$_2$, —NR'SO$_2$R", —NR'C(O)R", —NR'C(O)—OR", —NR'OR", in a number ranging from zero to (2m'+1), where m' is the total number of carbon atoms in such radical. R, R', R", R'", and R"" each preferably independently refer to hydrogen, substituted or unsubstituted heteroalkyl, substituted or unsubstituted cycloalkyl, substituted or unsubstituted heterocycloalkyl, substituted or unsubstituted aryl (e.g., aryl substituted with 1-3 halogens), substituted or unsubstituted heteroaryl, substituted or unsubstituted alkyl, alkoxy, or thioalkoxy groups, or arylalkyl groups. When a compound described herein includes more than one R group, for example, each of the R groups is independently selected as are each R', R", R'", and R"" group when more than one of these groups is present. When R' and R" are attached to the same nitrogen atom, they can be combined with the nitrogen atom to form a 4-, 5-, 6-, or 7-membered ring. For example, —NR'R" includes, but is not limited to, 1-pyrrolidinyl and 4-morpholinyl. From the above discussion of substituents, one of skill in the art will understand that the term "alkyl" is meant to include groups including carbon atoms bound to groups other than hydrogen groups, such as haloalkyl (e.g., —CF$_3$ and —CH$_2$CF$_3$) and acyl (e.g., —C(O)CH$_3$, —C(O)CF$_3$, —C(O)CH$_2$OCH$_3$, and the like). Similar to the substituents described for the alkyl radical, substituents for the aryl and heteroaryl groups are varied and are selected from, for example: —OR', —NR'R", —SR', -halogen, —SiR'R"R'", —OC(O)R', —C(O)R', —CO$_2$R', —CONR'R", —OC(O)NR'R", —NR"C(O)R', —NR'—C(O)NR"R'", —NR"C(O)$_2$R', —NR—C(NR'R"R'")=NR"", —NR—C(NR'R")=NR'", —S(O)R', —S(O)$_2$R', —S(O)$_2$NR'R", —NRSO$_2$R', —NR'NR"R'", —ONR'R", —NR'C(O)NR"NR'"R"", —CN, —NO$_2$, —R', —N$_3$, —CH(Ph)$_2$, fluoro(C$_1$-C$_4$)alkoxy, and fluoro(C$_1$-C$_4$)alkyl, —NR'SO$_2$R", —NR'C(O)R", —NR'C(O)—OR", —NR'OR", in a number ranging from zero to the total number of open valences on the aromatic ring system; and where R', R", R'", and R"" are preferably independently selected from hydrogen, substituted or unsubstituted alkyl, substituted or unsubstituted heteroalkyl, substituted or unsubstituted cycloalkyl, substituted or unsubstituted heterocycloalkyl, substituted or unsubstituted aryl, and substituted or unsubstituted heteroaryl. When a compound described herein includes more than one R group, for example, each of the R groups is independently selected as are each R', R", R'", and R"" groups when more than one of these groups is present.

Substituents for rings (e.g. cycloalkyl, heterocycloalkyl, aryl, heteroaryl, cycloalkylene, heterocycloalkylene, arylene, or heteroarylene) may be depicted as substituents on the ring rather than on a specific atom of a ring (commonly referred to as a floating substituent). In such a case, the substituent may be attached to any of the ring atoms (obeying the rules of chemical valency) and in the case of fused rings or spirocyclic rings, a substituent depicted as associated with one member of the fused rings or spirocyclic rings (a floating substituent on a single ring), may be a substituent on any of the fused rings or spirocyclic rings (a floating substituent on multiple rings). When a substituent is attached to a ring, but not a specific atom (a floating substituent), and a subscript for the substituent is an integer greater than one, the multiple substituents may be on the same atom, same ring, different atoms, different fused rings, different spirocyclic rings, and each substituent may optionally be different. Where a point of attachment of a ring to the remainder of a molecule is not limited to a single atom (a floating substituent), the attachment point may be any atom of the ring and in the case of a fused ring or spirocyclic ring, any atom of any of the fused rings or spirocyclic rings while obeying the rules of chemical valency. Where a ring, fused rings, or spirocyclic rings contain one or more ring heteroatoms and the ring, fused rings, or spirocyclic rings are shown with one more floating substituents (including, but not limited to, points of attachment to the remainder of the molecule), the floating substituents may be bonded to the heteroatoms. Where the ring heteroatoms are shown bound to one or more hydrogens (e.g. a ring nitrogen with two bonds to ring atoms and a third bond to a hydrogen) in the structure or formula with the floating substituent, when the heteroatom is bonded to the floating substituent, the substituent will be understood to replace the hydrogen, while obeying the rules of chemical valency.

Two or more substituents may optionally be joined to form aryl, heteroaryl, cycloalkyl, or heterocycloalkyl groups. Such so-called ring-forming substituents are typically, though not necessarily, found attached to a cyclic base structure. In one embodiment, the ring-forming substituents are attached to adjacent members of the base structure. For example, two ring-forming substituents attached to adjacent members of a cyclic base structure create a fused ring structure. In another embodiment, the ring-forming substituents are attached to a single member of the base structure. For example, two ring-forming substituents attached to a single member of a cyclic base structure create a spirocyclic structure. In yet another embodiment, the ring-forming substituents are attached to non-adjacent members of the base structure.

Two of the substituents on adjacent atoms of the aryl or heteroaryl ring may optionally form a ring of the formula -T-C(O)—(CRR')$_q$—U—, wherein T and U are independently —NR—, —O—, —CRR'—, or a single bond, and q is an integer of from 0 to 3. Alternatively, two of the substituents on adjacent atoms of the aryl or heteroaryl ring may optionally be replaced with a substituent of the formula -A-(CH$_2$)$_r$—B—, wherein A and B are independently —CRR'—, —O—, —NR—, —S—, —S(O)—, —S(O)$_2$—, —S(O)$_2$NR'—, or a single bond, and r is an integer of from 1 to 4. One of the single bonds of the new ring so formed may optionally be replaced with a double bond. Alternatively, two of the substituents on adjacent atoms of the aryl or heteroaryl ring may optionally be replaced with a substituent of the formula —(CRR')$_s$—X'—(C"R"R'")$_d$—, where s and d are independently integers of from 0 to 3, and X' is —O—, —NR'—, —S—, —S(O)—, —S(O)$_2$—, or —S(O)$_2$NR'—. The substituents R, R', R", and R'" are preferably independently selected from hydrogen, substituted or unsubstituted alkyl, substituted or unsubstituted heteroalkyl, substituted or unsubstituted cycloalkyl, substituted or unsubstituted heterocycloalkyl, substituted or unsubstituted aryl, and substituted or unsubstituted heteroaryl.

As used herein, the terms "heteroatom" or "ring heteroatom" are meant to include oxygen (O), nitrogen (N), sulfur (S), phosphorus (P), and silicon (Si).

A "substituent group," as used herein in the substituted moiety, means a group selected from the following moieties:
(A) oxo,
halogen, —CCl$_3$, —CBr$_3$, —CF$_3$, —CI$_3$, —CN, —OH, —NH$_2$, —COOH, —CONH$_2$, —NO$_2$, —SH, —SO$_3$H, —SO$_4$H, —SO$_2$NH$_2$, —NHNH$_2$, —ONH$_2$, —NHC(O)NHNH$_2$, —NHC(O)NH$_2$, —NHSO$_2$H, —NHC(O)H, —NHC(O)OH, —NHOH, —OCCl$_3$, —OCF$_3$, —OCBr$_3$, —OCI$_3$, —OCHCl$_2$, —OCHBr$_2$, —OCHI$_2$, —OCHF$_2$, unsubstituted alkyl (e.g., C$_1$-C$_8$ alkyl, C$_1$-C$_6$ alkyl, or C$_1$-C$_4$ alkyl), unsubstituted heteroalkyl (e.g., 2 to 8 membered heteroalkyl, 2 to 6 membered heteroalkyl, or 2 to 4 membered heteroalkyl), unsubstituted cycloalkyl (e.g., C$_3$-C$_8$ cycloalkyl, C$_3$-C$_6$ cycloalkyl, or C$_5$-C$_6$ cycloalkyl), unsubstituted heterocycloalkyl (e.g., 3 to 8 membered heterocycloalkyl, 3 to 6 membered heterocycloalkyl, or 5 to 6 membered heterocycloalkyl), unsubstituted aryl (e.g., C$_6$-C$_{10}$ aryl, C$_{10}$ aryl, or phenyl), or unsubstituted heteroaryl (e.g., 5 to 10 membered heteroaryl, 5 to 9 membered heteroaryl, or 5 to 6 membered heteroaryl), and (B) alkyl, heteroalkyl, cycloalkyl, heterocycloalkyl, aryl, heteroaryl, substituted with at least one substituent selected from:
(i) oxo,
halogen, —CCl$_3$, —CBr$_3$, —CF$_3$, —CI$_3$, —CN, —OH, —NH$_2$, —COOH, —CONH$_2$, —NO$_2$, —SH, —SO$_3$H, —SO$_4$H, —SO$_2$NH$_2$, —NHNH$_2$, —ONH$_2$, —NHC(O)NHNH$_2$, —NHC(O)NH$_2$, —NHSO$_2$H, —NHC(O)H, —NHC(O)OH, —NHOH, —OCCl$_3$, —OCF$_3$, —OCBr$_3$, —OCI$_3$, —OCHCl$_2$, —OCHBr 2, —OCHI$_2$, —OCHF$_2$, unsubstituted alkyl (e.g., C$_1$-C$_8$ alkyl, C$_1$-C$_6$ alkyl, or C$_1$-C$_4$ alkyl), unsubstituted heteroalkyl (e.g., 2 to 8 membered heteroalkyl, 2 to 6 membered heteroalkyl, or 2 to 4 membered heteroalkyl), unsubstituted cycloalkyl (e.g., C$_3$-C$_8$ cycloalkyl, C$_3$-C$_6$ cycloalkyl, or C$_5$-C$_6$ cycloalkyl), unsubstituted heterocycloalkyl (e.g., 3 to 8 membered heterocycloalkyl, 3 to 6 membered heterocycloalkyl, or 5 to 6 membered heterocycloalkyl), unsubstituted aryl (e.g., C$_6$-C$_{10}$ aryl, C$_{10}$ aryl, or phenyl), or unsubstituted heteroaryl (e.g., 5 to 10 membered heteroaryl, 5 to 9 membered heteroaryl, or 5 to 6 membered heteroaryl), and (ii) alkyl, heteroalkyl, cycloalkyl, heterocycloalkyl, aryl, heteroaryl, substituted with at least one substituent selected from:
(a) oxo,
halogen, —CCl$_3$, —CBr$_3$, —CF$_3$, —CI$_3$, —CN, —OH, -MB, —COOH, —CONH$_2$, -MB, —SH, —SO$_3$H, —SO$_4$H, —SO$_2$NH$_2$, —NHNH$_2$, —ONH$_2$, —NHC(O)NHNH$_2$, —NHC(O)NH$_2$, —NHSO$_2$H, —NHC(O)H, —NHC(O)OH, —NHOH, —OCCl$_3$, —OCF$_3$, —OCBr$_3$, —OCl$_2$, —OCH Cl$_2$, —OCHBr$_2$, —OCHI$_2$, —OCHF$_2$, unsubstituted alkyl (e.g., C$_1$-C$_8$ alkyl, C$_1$-C$_6$ alkyl, or C$_1$-C$_4$ alkyl), unsubstituted heteroalkyl (e.g., 2 to 8 membered heteroalkyl, 2 to 6 membered heteroalkyl, or 2 to 4 membered heteroalkyl), unsubstituted cycloalkyl (e.g., C$_3$-C$_8$ cycloalkyl, C$_3$-C$_6$ cycloalkyl, or C$_5$-C$_6$ cycloalkyl), unsubstituted heterocycloalkyl (e.g., 3 to 8 membered heterocycloalkyl, 3 to 6 membered heterocycloalkyl, or 5 to 6 membered heterocycloalkyl), unsubstituted aryl (e.g., C$_6$-C$_{10}$ aryl, C$_{10}$ aryl, or phenyl), or unsubstituted heteroaryl (e.g., 5 to 10 membered heteroaryl, 5 to 9 membered heteroaryl, or 5 to 6 membered heteroaryl), and (b) alkyl, heteroalkyl, cycloalkyl, heterocycloalkyl, aryl, heteroaryl, substituted with at least one substituent selected from: oxo,
halogen, —CCl$_3$, —CBr$_3$, —CF$_3$, —CI$_3$, —CN, —OH, —NH$_2$, —COOH, —CONH$_2$, —NO$_2$, —SH, —SO$_3$ H, —SO$_4$H, —SO$_2$NH$_2$, —NHNH$_2$, —ONH$_2$, —NHC(O)NHNH$_2$, —NHC(O)NH$_2$, —NHSO$_2$H, —NHC(O)H, —NHC(O)OH, —NHOH, —OCCl$_3$, —OCF$_3$, —OCBr$_3$, —OCI$_3$, —OCHCl$_2$, —OCHBr$_2$, —OCHI$_2$, —OCHF$_2$, unsubstituted alkyl (e.g., C$_1$-C$_8$ alkyl, C$_1$-C$_6$ alkyl, or C$_1$-C$_4$ alkyl), unsubstituted heteroalkyl (e.g., 2 to 8 membered heteroalkyl, 2 to 6 membered heteroalkyl, or 2 to 4 membered heteroalkyl), unsubstituted cycloalkyl (e.g., $C_3$-$C_8$ cycloalkyl, $C_3$-$C_6$ cycloalkyl, or $C_5$-$C_6$ cycloalkyl), unsubstituted heterocycloalkyl (e.g., 3 to 8 membered heterocycloalkyl, 3 to 6 membered heterocycloalkyl, or 5 to 6 membered heterocycloalkyl), unsubstituted aryl (e.g., $C_6$-$C_{10}$ aryl, $C_{10}$ aryl, or phenyl), or unsubstituted heteroaryl (e.g., 5 to 10 membered heteroaryl, 5 to 9 membered heteroaryl, or 5 to 6 membered heteroaryl).

As used herein, the terms "luminescence" are meant to a process or a property that a material or a substance emits light, without radiation of heat, in the visible range, for example, red (e.g., wavelength of about 620-740 nm), green (e.g., wavelength of about 520-570 nm), or blue (e.g., wavelength of about 435-500 nm), upon biological or chemical reaction, electrical stimulation (e.g., electric current), irradiation by high frequency photon or the like. In certain embodiments, the luminescence may be fluorescence or phosphorescence. In certain embodiments, the luminescence may occur upon irradiation of UV light. In certain embodiments, the luminescence may be generated by a compound of N-heterocyclic carbene (MIC) metal complex or a salt thereof.

Luminescent Compounds

N-heterocyclic carbene (NHC) gold complex has only been known as a catalyst in a chemical reaction, for example, in an alkyne hydration reaction of terminal and internal alkyne (Weerasiri, K., et al, Adv. Synth. Catal. 358 (24), 2016, 4106-4113). Some NHC complex including at least one weakly coordinating anionic substituents or ligands are demonstrated to have luminescent property in aspects and examples of the present disclosure.

In one aspect, provided is a luminescent compound. The luminescent compounds may have luminescence emission having a wavelength of about 400 to 600 nm, of about 420-550 nm, or particularly of about 430-500 nm.

In one preferred aspect, the luminescent compound may be a compound having a structure of:

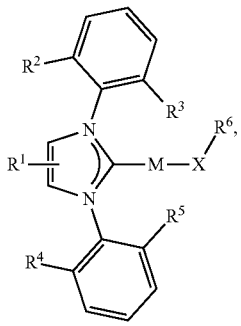

(I)

wherein:
$R^1$ is an anionic group;
each $R^2$, $R^3$, $R^4$, and $R^5$ is independently is hydrogen, halogen, substituted or unsubstituted alkyl;
M is a metal or a metal ion;
X is a bond, —C($R^aR^b$)—, —N($R^c$)—, —NC—, —S($R^d$)—, —O—, —S—, or —P($R^eR^f$)—;
$R^6$ is hydrogen, halogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl, or $R^6$ and any atom of X, $R^a$, $R^b$, $R^c$, $R^d$, $R^e$, and $R^f$ together with atoms connected thereto form substituted or unsubstituted cycloalkyl, substituted or unsubstituted heterocycloalkyl, substituted or unsubstituted aryl, or substituted or unsubstituted heteroaryl; and each $R^a$, $R^b$, $R^c$, $R^d$, $R^e$, and $R^f$ is independently hydrogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl.

In embodiments, a bond between M and X may be a coordinate covalent bond. For example, the bond may be formed via the Lewis acid-base interaction, e.g., between a donor (Lewis base) and an electron acceptor (Lewis acid).

In embodiments, M is Au, Cu, Au⁺, Cu⁺, Ag, or Ag⁺. In embodiments, M is Au. In embodiments, M is Cu. In embodiments, M is Ag. In embodiments, M is Au⁺. In embodiments, M is Cu⁺. In embodiments, M is Ag⁺.

In embodiments, the compound may further include a counterion. For example, the counterion may include one or more cations. In embodiments, the counterion may include Na⁺, K⁺, or Li⁺. In embodiments, the counterion may be Na⁺. In embodiments, the counterion may be K⁺. In embodiments, the counterion may be Li⁺. In embodiments, the counterion may include $Mg^{2+}$, $Ca^{2+}$, or $Mn^{2+}$. In embodiments, the counterion may be $Mg^{2+}$. In embodiments, the counterion may be $Ca^{2+}$. In embodiments, the counterion may be $Mn^{2+}$. In embodiments, the counterion may be a solvate, for example, a solvate with tetrahydrofuran (thf).

In some embodiments, the compound is:

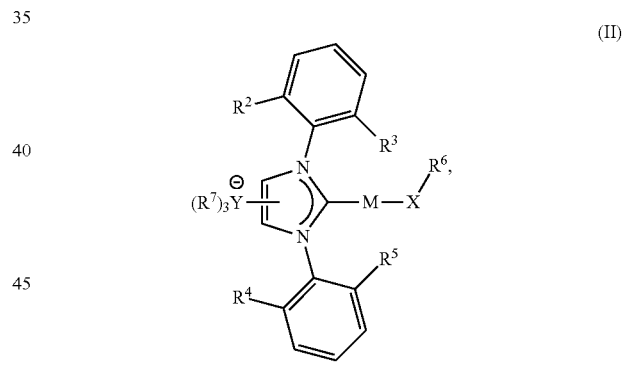

(II)

wherein:
Y is B or Al, and
$R^7$ is independently hydrogen, halogen, substituted or unsubstituted alkyl, substituted or unsubstituted heteroalkyl, substituted or unsubstituted cycloalkyl, substituted or unsubstituted aryl, or substituted or unsubstituted heteroaryl.

In embodiments, Y is B. In embodiments, Y is Al.

In embodiments, $R^7$ is independently $R^8$-substituted or unsubstituted phenyl, $R^8$-substituted or unsubstituted pyrrolidinyl, or —N($R^8$)$_2$. In embodiments, $R^8$ is independently halogen, —CH$_3$, —OCH$_3$, —CH$_2$CH$_3$, —OCH$_2$CH$_3$, —CX$^1_3$, —CX$^1_2$, —OCX$^1_3$, —OCX$^1_3$, —OCH$_2$X$^1$, or —OCHX$^1_2$; and X$^1$ is independently —F, —Cl, —Br, or —I.

In embodiments, $R^7$ is independently unsubstituted phenyl. In embodiments, $R^7$ is independently $R^8$-substituted phenyl. In embodiments, $R^7$ is substituted phenyl having one or more $R^8$ substitutents.

In embodiments, $R^8$ is independently halogen (e.g., F, Cl, Br or I). In embodiments, $R^8$ is independently unsubstituted alkyl, e.g., $C_1$-$C_4$ alkyl. In embodiments, $R^8$ is independently unsubstituted methyl. In embodiments, $R^8$ is independently unsubstituted ethyl. In embodiments, $R^8$ is independently unsubstituted propyl. In embodiments, $R^8$ is independently unsubstituted isopropyl. In embodiments, $R^8$ is independently unsubstituted butyl. In embodiments, $R^8$ is independently unsubstituted tert-butyl. In embodiments, $R^8$ is independently haloalkyl, e.g., $C_1$-$C_4$ alkyl substituted with one or more halogens. In embodiments, $R^8$ is independently —$CF_3$, —$CCl_3$, —$CBr_3$, —$CI_3$, —$CHF_2$, —$CHCl_2$, —$CHBr_2$, —$CHI_2$, —$CH_2F$, —$CH_2Cl$, —$CH_2Br$, or —$CH_2I$. In embodiments, $R^8$ is —$OCH_3$, or —$OCH_2CH_3$. In embodiments, $R^8$ is independently —$OCF_3$, —$OCCl_3$, —$OCBr_3$, —$OCI_3$, —$OCHF_2$, —$OCHCl_2$, —$OCHBr_2$, —$OCHI_2$, —$OCH_2F$, —$OCH_2Cl$, —$OCH_2Br$, or —$OCH_2I$.

In embodiments, $R^7$ is

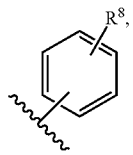

wherein $R^8$ is independently halogen (e.g., F, Cl, Br, or I), —$CH_3$, —$CH_2CH_3$, —$OCH_3$, or —$OCH_2CH_3$. For example, $R^7$ is

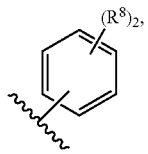

wherein $R^8$ is independently halogen, —$CH_3$, —$CH_2CH_3$, —$OCH_3$, —$OCH_2CH_3$, —$CF_3$, —$CCl_3$, —$CBr_3$, —$CI_3$, —$CHF_2$, —$CHCl_2$, —$CHBr_2$; —$CHI_2$, —$CH_2F$, —$CH_2Cl$, —$CH_2Br$, or —$CH_2I$. In embodiments, $R^7$ is —$C_6F_5$.

In embodiments, $R^7$ is independently —$N(R^8)_2$. In embodiments, $R^8$ is independently halogen (e.g., F, Cl, Br, or I). In embodiment, $R^8$ is F, Cl, Br, or I. In embodiments, $R^8$ is independently unsubstituted alkyl, e.g., $C_1$-$C_4$ alkyl. In embodiments, $R^8$ is independently unsubstituted methyl. In embodiments, $R^8$ is independently unsubstituted ethyl. In embodiments, $R^8$ is independently unsubstituted propyl. In embodiments, $R^8$ is independently unsubstituted isopropyl. In embodiments, $R^8$ is independently unsubstituted butyl. In embodiments, $R^8$ is independently unsubstituted tert-butyl.

In embodiments, $R^7$ is independently $R^8$-substituted or unsubstituted pyrrolidinyl. In embodiments, $R^7$ is independently unsubstituted pyrrolidinyl.

In some embodiments, X is —$SR^d$—. In embodiments, $R^d$ is independently unsubstituted alkyl, e.g., $C_1$-$C_4$ alkyl. In embodiments, $R^d$ is independently unsubstituted methyl. In embodiments, $R^d$ is independently unsubstituted ethyl. In embodiments, $R^d$ is independently unsubstituted propyl. In embodiments, $R^d$ is independently unsubstituted isopropyl. In embodiments, $R^d$ is independently unsubstituted butyl. In embodiments, $R^d$ is independently unsubstituted tert-butyl.

In embodiments, $R^6$ and $R^d$ together with atoms connected thereto form substituted or unsubstituted heterocycloalkyl. In embodiments, $R^6$ and $R^d$ together with atoms connected thereto form unsubstituted heterocycloalkyl. In embodiments, $R^6$ and $R^d$ together with atoms connected thereto form

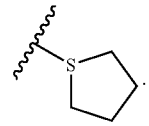

In some embodiments, X is —NC—. In embodiments, X is —NC—. In embodiments, $R^6$ is hydrogen. In embodiments, $R^6$ is substituted or unsubstituted alkyl. In embodiments, $R^6$ is unsubstituted $C_1$-$C_4$ alkyl. In embodiments, $R^6$ is independently unsubstituted methyl. In embodiments, $R^6$ is independently unsubstituted ethyl. In embodiments, $R^6$ is independently unsubstituted propyl. In embodiments, $R^6$ is independently unsubstituted isopropyl. In embodiments, $R^6$ is independently unsubstituted butyl. In embodiments, $R^6$ is independently unsubstituted tert-butyl.

In some embodiments, X is —O—. In some embodiments, —S—. In embodiments, $R^6$ is hydrogen. In embodiments, $R^6$ is substituted or unsubstituted alkyl. In embodiments, $R^6$ is unsubstituted $C_1$-$C_4$ alkyl. In embodiments, $R^6$ is unsubstituted methyl. In embodiments, $R^6$ is unsubstituted ethyl. In embodiments, $R^6$ is unsubstituted propyl. In embodiments, $R^6$ is unsubstituted isopropyl. In embodiments, $R^6$ is unsubstituted butyl. In embodiments, $R^6$ is unsubstituted tert-butyl. In embodiments, $R^6$ is $C_1$-$C_4$ haloalkyl. In embodiments, $R^6$ is —$CHF_2$, —$CHCl_2$—$CHBr_2$, —$CHI_2$, —$CH_2F$, —$CH_2Cl$, —$CH_2Br$, or —$CH_2I$. In embodiments, $R^6$ is —$CH_2CF_3$, —$CH_2CCl_3$, —$CH_2CBr_3$, or —$CH_2CI_3$. In embodiments, $R^6$ is —$CH(CF_3)_2$, —$CH(CCl_3)_2$, —$CH(CBr_3)_2$, or —$CH(CI_3)_2$. In embodiments, $R^6$ is unsubstituted phenyl. In embodiments, $R^6$ is substituted phenyl.

In some embodiments, X is —$N(R^c)$—. In embodiments, each $R^6$ and $R^c$ is independently substituted or unsubstituted phenyl. In embodiments, $R^6$ is substituted or unsubstituted phenyl. In embodiments, $R^c$ is substituted or unsubstituted phenyl. In embodiments, $R^6$ is unsubstituted phenyl. In embodiments, $R^c$ is unsubstituted phenyl. In embodiments, $R^6$ is substituted phenyl. In embodiments, $R^c$ is substituted phenyl.

In some embodiments, X is a bond. In embodiments, $R^6$ is substituted or unsubstituted heterocycloalkyl, or substituted or unsubstituted heteroaryl. In embodiments, $R^6$ is substituted or unsubstituted heterocycloalkyl. In embodiments, $R^6$ is substituted heterocycloalkyl. In embodiments, $R^6$ is unsubstituted heterocycloalkyl. In embodiments, $R^6$ is

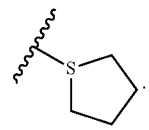

In embodiments, R⁶ is

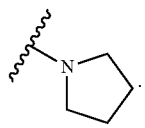

In embodiments, R⁶ is

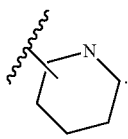

In embodiments, R⁶ is

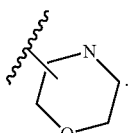

In embodiments, R⁶ is

In embodiments, R⁶ is substituted or unsubstituted heteroaryl. In embodiments, R⁶ is unsubstituted heteroaryl. In embodiments, R⁶ is substituted heteroaryl. In embodiments, R⁶ is

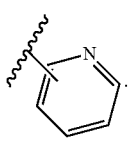

In embodiments, R⁶ is

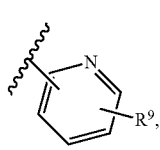

wherein R⁹ is substituted or unsubstituted alkyl, or substituted or unsubstituted heteroalkyl. In embodiments, R⁶ is

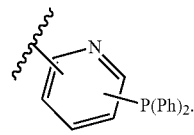

In embodiments, R⁶ is

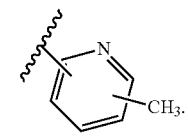

In embodiments, R⁶ is

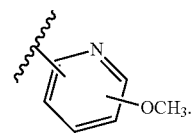

In some embodiments, X is —P(RᵉRᶠ)—. In embodiments, each R⁶, Rᵉ, and Rᶠ is independently substituted or unsubstituted cycloalkyl, or substituted or unsubstituted aryl. In embodiments, each R⁶, Rᵉ, and Rᶠ is independently substituted or unsubstituted cycloalkyl. In embodiments, each R⁶, Rᵉ, and Rᶠ is independently unsubstituted cycloalkyl. In embodiments, each R⁶, Rᵉ, and Rᶠ is independently substituted cycloalkyl. In embodiments, each R⁶, Rᵉ, and Rᶠ is independently substituted or unsubstituted aryl. In embodiments, each R⁶, Rᵉ, and Rᶠ is independently unsubstituted aryl. In embodiments, each R⁶, Rᵉ, and Rᶠ is independently substituted phenyl. In embodiments, each R⁶, Rᵉ, and Rᶠ is independently substituted or unsubstituted phenyl. In embodiments, each R⁶, Rᵉ, and Rᶠ is independently selected from the group consisting of:

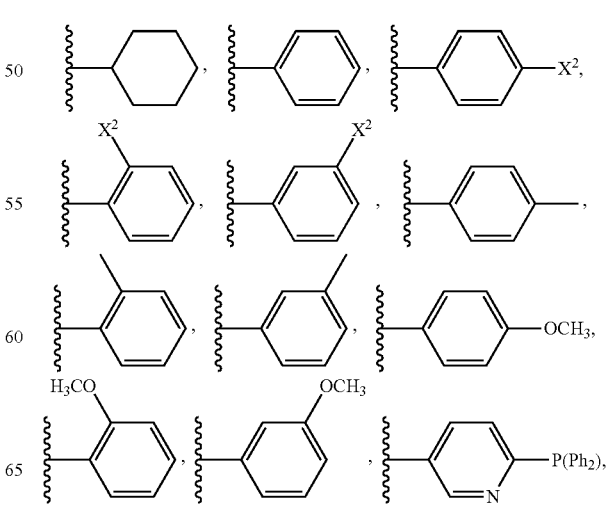

-continued

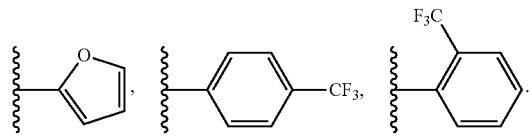

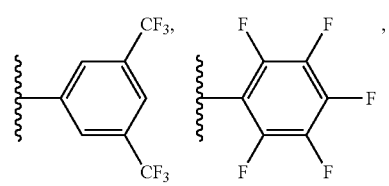

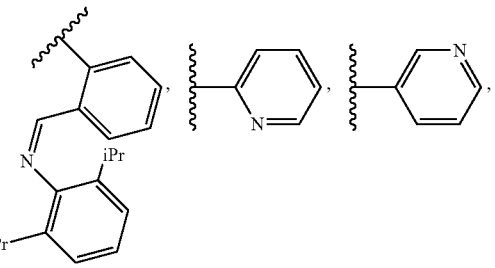

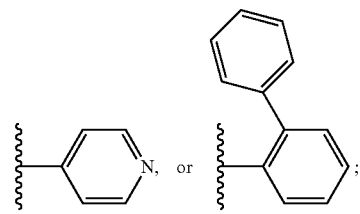

In embodiments, each $R^2$, $R^3$, $R^4$, and $R^5$ is independently is hydrogen, or unsubstituted $C_1$-$C_4$ alkyl. In embodiments, $R^2$ is hydrogen. In embodiments, $R^2$ is unsubstituted $C_1$-$C_4$ alkyl. In embodiments, $R^2$ is unsubstituted methyl. In embodiments, $R^2$ is unsubstituted ethyl. In embodiments, $R^2$ is unsubstituted propyl. In embodiments, $R^2$ is unsubstituted isopropyl. In embodiments, $R^2$ is unsubstituted butyl. In embodiments, $R^2$ is unsubstituted tert-butyl.

In embodiments, $R^3$ is hydrogen. In embodiments, $R^3$ is unsubstituted $C_1$-$C_4$ alkyl. In embodiments, $R^3$ is unsubstituted methyl. In embodiments, $R^3$ is unsubstituted ethyl. In embodiments, $R^3$ is unsubstituted propyl. In embodiments, $R^3$ is unsubstituted isopropyl. In embodiments, $R^3$ is unsubstituted butyl. In embodiments, $R^3$ is unsubstituted tert-butyl.

In embodiments, $R^4$ is hydrogen. In embodiments, $R^4$ is unsubstituted $C_1$-$C_4$ alkyl. In embodiments, $R^4$ is unsubstituted methyl. In embodiments, $R^4$ is unsubstituted ethyl. In embodiments, $R^4$ is unsubstituted propyl. In embodiments, $R^4$ is unsubstituted isopropyl. In embodiments, $R^4$ is unsubstituted butyl. In embodiments, $R^4$ is unsubstituted tert-butyl.

In embodiments, $R^5$ is hydrogen. In embodiments, $R^5$ is unsubstituted $C_1$-$C_4$ alkyl. In embodiments, $R^5$ is unsubstituted methyl. In embodiments, $R^5$ is unsubstituted ethyl. In embodiments, $R^5$ is unsubstituted propyl. In embodiments, $R^5$ is unsubstituted isopropyl. In embodiments, $R^5$ is unsubstituted butyl. In embodiments, $R^5$ is unsubstituted tert-butyl.

In embodiments, the luminescent compound has the structure of:

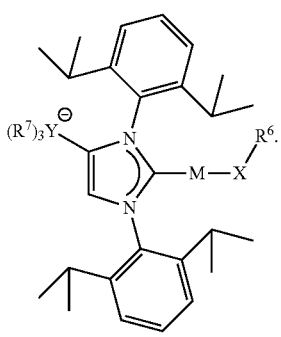

(III)

M, X, Y, $R^7$ are described above.

Examples of the luminescent compound may include, but not be limited to:

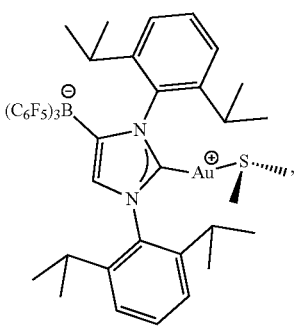

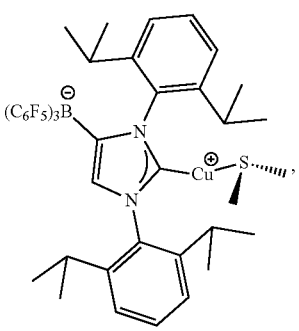

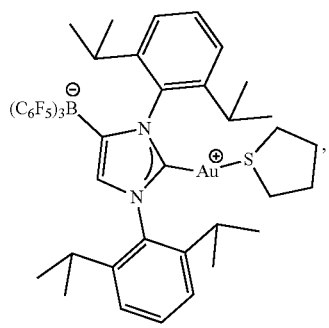

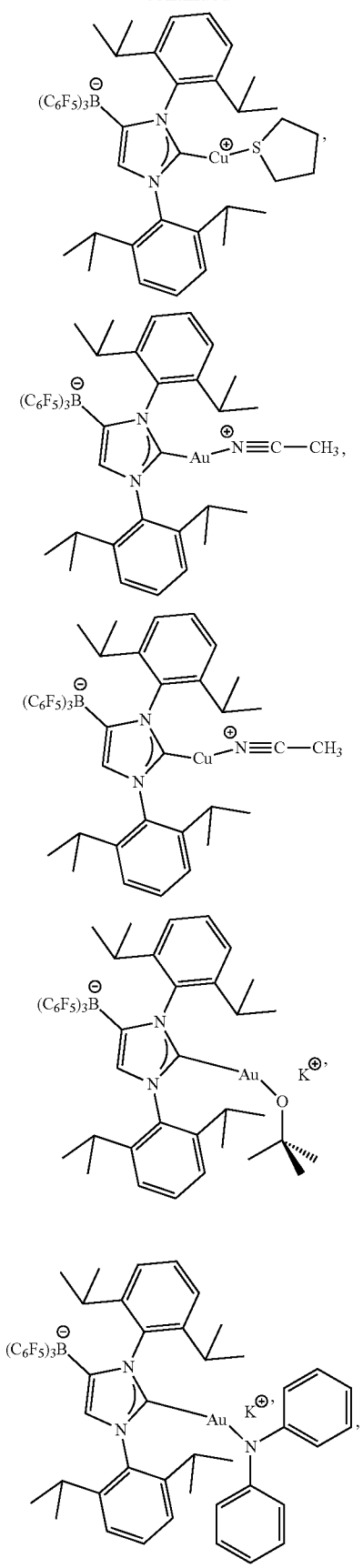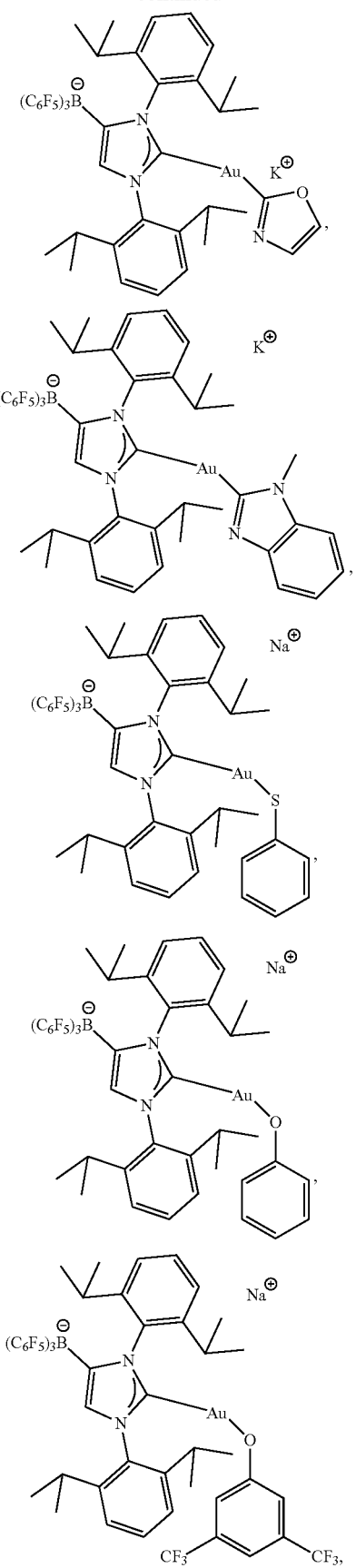

| 41 | 42 |
|---|---|
| -continued | -continued |
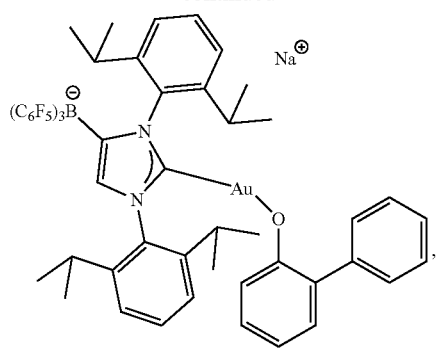
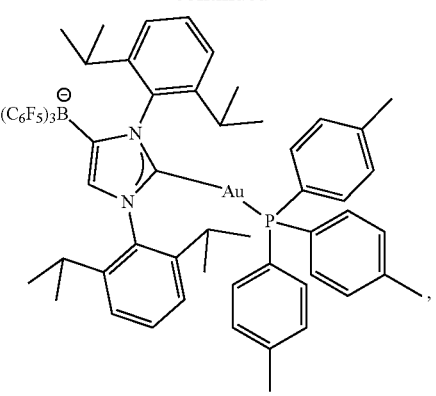
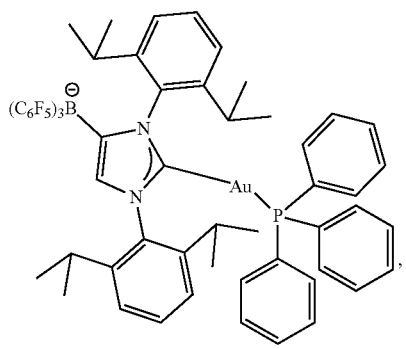
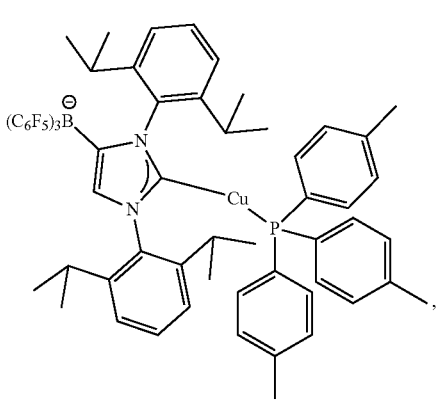
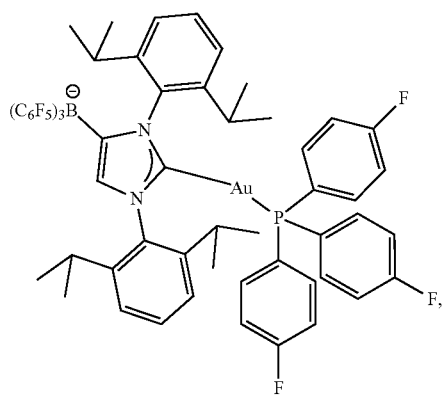
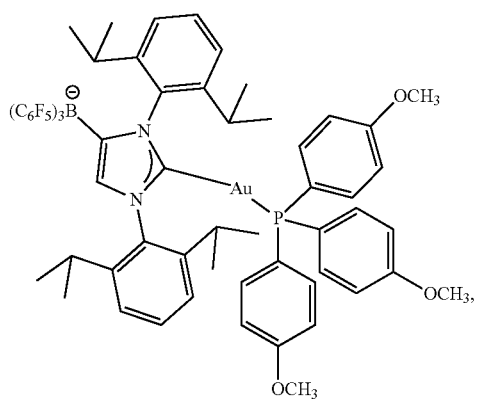
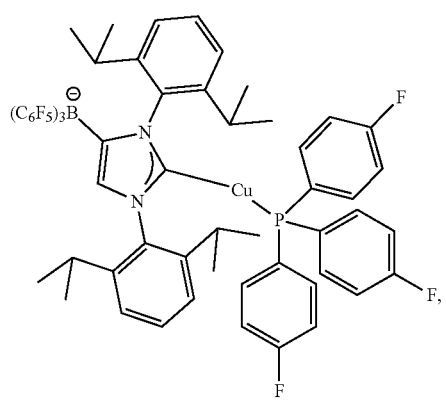
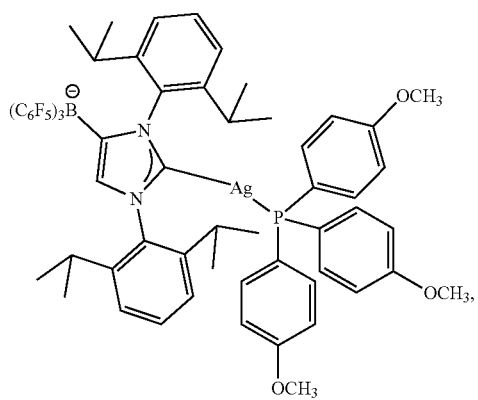

-continued
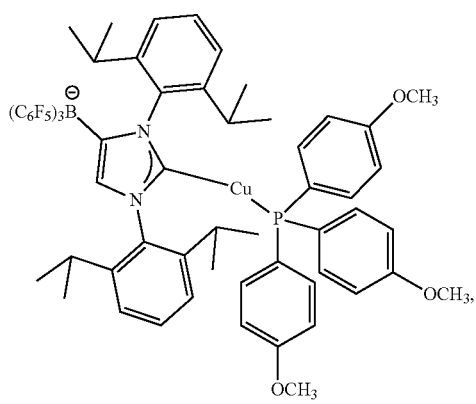
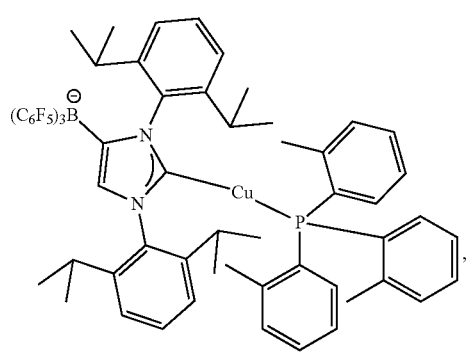
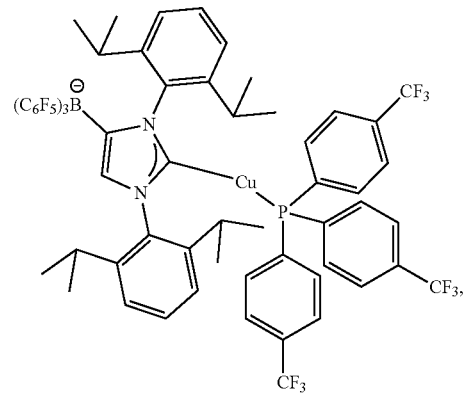
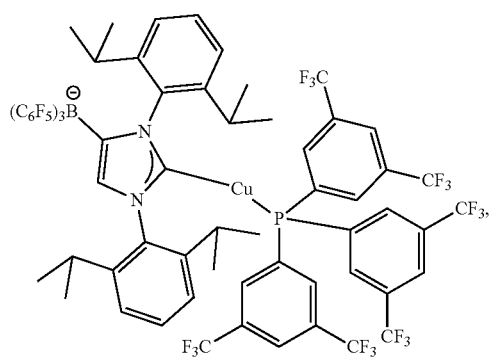
-continued
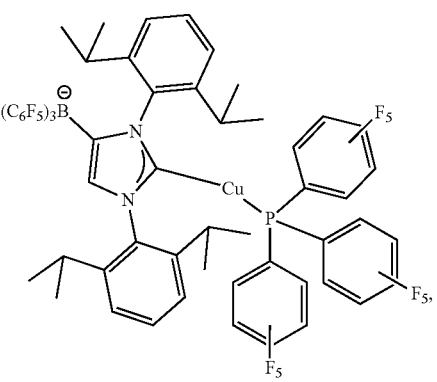
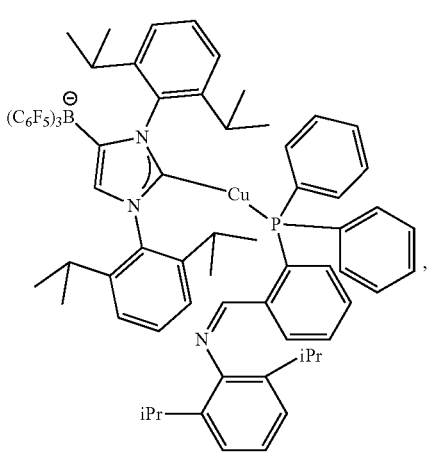
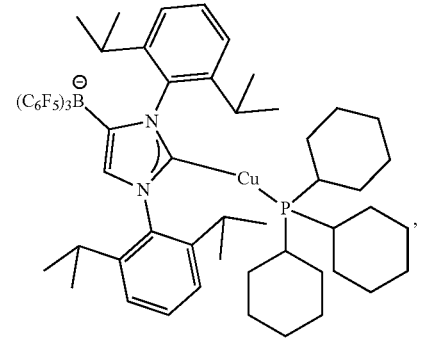
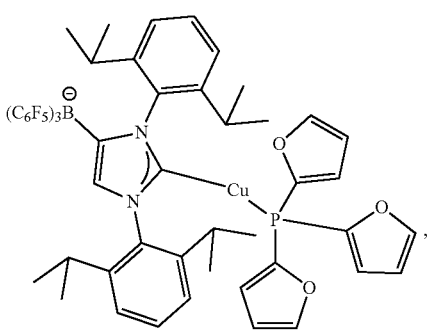

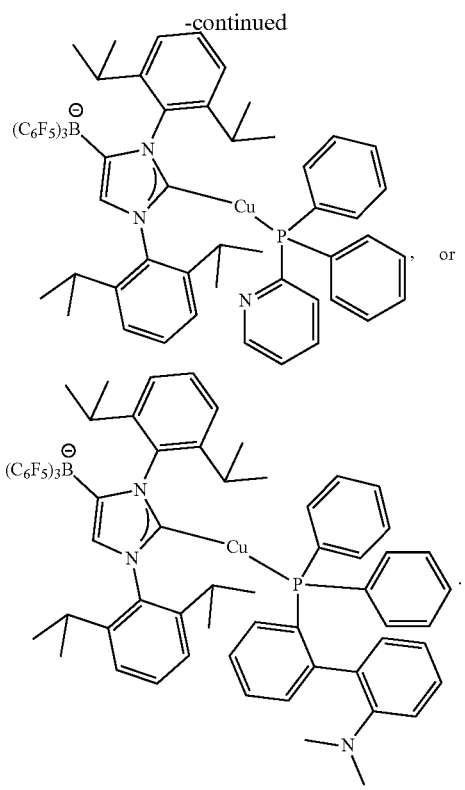

-continued

Luminescent Composition

In an aspect, provided is a luminescent composition that may include one or more luminescent compounds described above.

In embodiments, the luminescent composition may include a solvent component. Exemplary solvent components may include, but not be limited to, tetrahydrofurane (thf), methylene chloride, toluene, diethyl ether, or combinations thereof. In embodiments, the luminescent composition may have suitable viscosity for application, for example, by coating, painting, spraying, or immersing, on a substrate.

In embodiments, the luminescent composition may be in a powder form. For example, the composition may include the luminescent compound obtained by crystallization and/or recrystallization. In embodiments, the powder form of the luminescent compound may be particles having a size of about 1 μm to 1 mm, of about 1 μm to 900 μm, of about 1 μm to 800 μm, of about 1 μm to 700 μm, of about 1 μm to 600 μm, of about 1 μm to 500 μm, of about 1 μm to 400 μm, of about 1 μm to 300 μm, of about 1 μm to 200 μm, or of about 1 μm to 100 μm. In certain embodiments, the powder form of the luminescent compound may be particles having a size of about 1 μm to 200 μm. In certain embodiments, the powder form of the luminescent compound may be particles having a size of about 1 μm to 100 μm.

In embodiments, the luminescent composition may further include additives, for example, binder (e.g., polymer resin), pigments or dyes, fillers, antioxidants, anti-aging agents, UV protecting agents, emulsifiers, adhesives, and the like.

Device

In an aspect, provided is a device that may include the luminescent composition as described herein. The device may include an organic light-emitting diode (OLED) that includes the luminescent compounds or the compositions including the same. Exemplary device may include, bur not be limited to, a panel, a film, a display device, a handheld device, a device for vehicle, a lighting device, and the like.

In an aspect, provided is a method of manufacturing the device as described herein. The method may include applying the luminescent composition on a substrate. For example, the substrate may include, but not be limited to, a glass (e.g., glass plate), a polymer (e.g., film), plastic, metal (e.g., steel, foil and the like), paper, fabric, fibers, ceramic, carbon materials (e.g., carbon nanotubes) or the like. The method may include various application processes for the luminescent composition described herein, for example, spraying, painting, coating, immersing, dripping, and the like.

EXAMPLE

Synthesis

Example 1: Preparation of Cu(I) Complex

All manipulations including chemical synthesis in this section were carried out in a Vacuum Atmospheres inert atmosphere glovebox or using standard Schlenk techniques. CENTEC Elemental Analysis Facility at the University of Rochester, funded by NSF CHE-1565721 was used to obtain analytical data. NMR spectra were collected using Bruker Avance III 500 and 400 MHz instruments. $^1$H NMR chemical shifts (δ, ppm) were referenced to residual protiosolvent resonances and $^{13}$C NMR chemical shifts were referenced to deuterated solvent peak. All deuterated NMR solvents (Cambridge isotope laboratories were dried over activated 4 Å molecular sieves 48 h before use. Dichloromethane (DCM), pentane, tetrahydrofuran (THF), and toluene were purified using a commercial solvent purification system. Tris(pentafluorophenyl)borane was sublimed prior to use at 100 mTorr, 90° C. Anhydrous copper (I) chloride was purchased from Stream Chemicals, Inc. All other chemicals were used as received. BNHC, (THT)CuCl, and (PPh3)CuCl were synthesized from reported procedures.

NMR Spectra: Preparation of (THT)CuCl. This compound was prepared following a reported procedure (J. Am. Chem. Soc. 2018, 140, 28, 8944). In an inert atmosphere glovebox, anhydrous CuCl (50 mg, 0.506 mmol) was stirred in 4 mL of tetrahydrothiophene (THT) for 12 h. The reaction mixture was filtered through Celite and the product precipitated out solution with the addition of pentane. The white solid was collected by filtration and washed with diethyl ether in 80% yield. 1H NMR (500 MHz, Methylene Chloride-d2) δ 2.83 (d, J=6.1 Hz, 4H), 1.93 (p, J=3.3 Hz, 4H). 13C NMR (126 MHz, CD$_2$Cl$_2$) δ 32.71, 31.43.

Preparation of(THT)CuCl. This compound was prepared following a reported procedure. J. Am. Chem. Soc. 2018, 140, 28, 8944 In an inert atmosphere glovebox, anhydrous CuCl (50 mg, 0.506 mmol) was stirred in 4 mL of tetrahydrothiophene (THT) for 12 h. The reaction mixture was filtered through Celite and the product precipitated out solution with the addition of pentane. The white solid was collected by filtration and washed with diethyl ether in 80% yield. $^1$H NMR (500 MHz, Methylene Chloride-d$_2$) δ 2.83 (d, j=6.1 Hz, 4H), 1.93 (p, j=3.3 Hz, 4H). $^{13}$C NMR (126 MHz, CD$_2$Cl$_2$) δ 32.71, 31.43.

Preparation of(PPh3)CuCl. This compound was prepared following a reported procedure (Khan, A., et al., *Inorganica ChimicaActa*, 2016, vol. 449, p. 119-126).

Preparation of P(o-tolyl)₃CuCl. To a stirred suspension of CuCl (49 mg, 0.500 mmol, 1.00 equiv) in acetonitrile, was added P(o-tolyl)₃ (152 mg, 0.500 mmol, 1 equiv) to afford a white suspension. After stirring for 4 hours at room temperature, the white suspension was removed from the glovebox, and the solid was collected over a plastic frit, washed with hexanes, and dried in vacuo in 62% yield. ³H NMR (400 MHz, Methylene Chloride-d₂) δ 7.43 (t, j=7.4 Hz, 3H), 7.39-7.33 (m, 3H), 7.17 (t, j=7.5 Hz, 3H), 6.83-6.76 (m, 3H), 2.61 (s, 9H). ¹³C NMR (126 MHz, CD₂Cl₂) δ 143.21, 143.09, 133.41, 133.37, 131.99, 131.93, 131.35, 127.19, 127.05, 126.99, 126.85, 23.23, 23.11. ³¹P NMR (162 MHz, CD₂Cl₂) δ-18.11.

Preparation of P(p-tolyl)₃CuCl. To a stirred suspension of CuCl (49 mg, 0.500 mmol, 1.00 equiv) in acetonitrile, was added P(p-tolyl)₃ (152 mg, 0.500 mmol, 1 equiv) to afford a white suspension. After stirring for 4 hours at room temperature, the white suspension was removed from the glovebox, the solid was collected over a plastic frit, washed with hexanes, and dried in vacuo in 70% yield. ¹H NMR (500 MHz, Methylene Chloride-d₂) δ 7.37 (d, J=7.4 Hz, 6H), 7.11 (d, J=7.8 Hz, 6H), 2.33 (s, 9H). ¹³C NMR (126 MHz, CD₂Cl₂) δ 140.72, 134.20, 129.79, 21.50. ³¹P NMR (203 MHz, CD₂Cl₂) δ-3.62.

Preparation of((CH₃OC₆H₄)₃P)CuCl. To a stirred suspension of CuCl (49 mg, 0.500 mmol, 1.00 equiv) in acetonitrile, was added ((CH₃OC₆H₄)₃P (176 mg, 0.500 mmol, 1 equiv) to afford a white suspension. After stirring for 4 hours at room temperature, the white suspension was removed from the glovebox, and the solid was collected over a plastic frit, washed with hexanes, and dried in vacuo in 80% yield. ³H NMR (500 MHz, Methylene Chloride-d₂) δ 7.42 (t, J=9.3 Hz, 6H), 6.84 (d, J=8.5 Hz, 6H), 3.77 (s, 9H). ¹³C NMR (126 MHz, CD₂Cl₂) δ 161.60, 135.72, 135.59, 114.69, 114.62, 55.61.

Preparation of((FC₆H₄)₃P)CuCl. To a stirred suspension of CuCl (49 mg, 0.500 mmol, 1.00 equiv) in acetonitrile, was added P(FPh)₃ (158 mg, 0.500 mmol, 1 equiv) to afford a homogenous solution. After stirring for overnight at room temperature, the white suspension was removed from the glovebox, and the solid was collected over a plastic frit, washed with hexanes, and dried in vacuo in 55% yield. ³H NMR (500 MHz, Methylene Chloride-d₂) δ 7.53-7.41 (m, 6H), 6.98 (t, J=8.5 Hz, 6H). ¹³C NMR (126 MHz, CD₂Cl₂) δ 165.48, 163.49, 136.40, 136.33, 136.27, 136.20, 128.59, 128.57, 128.30, 128.28, 116.51, 116.42, 116.34, 116.25.

Preparation of(IPr)CuCl. A 40 mL scintillation vial was charged with N,N'-bis(2,6-diisopropylphenyl)imidazole-2-ylidene (242.5 mg, 0.5706 mmol, 1.05 equiv), anhydrous copper (I) chloride (54 mg, 0.5434 mmol, 1.00 equiv) and sodium tert-butoxide (55 mg, 0.5706 mmol, 1.05). To the vial was added 20 mL of THT, and the solution was let to stir for 2.5 hours at room temperature. The reaction mixture was removed from the glovebox, filtered through celite over a plastic frit, and concentrated down to afford a white solid in 70% yield. ³H NMR (500 MHz, Methylene Chloride-d₂) δ 7.54 (t, J=7.8 Hz, 2H), 7.35 (d, J=7.8 Hz, 4H), 7.19 (s, 2H), 2.61-2.51 (m, 4H), 1.28 (d, J=6.9 Hz, 12H), 1.23 (d, J=6.9 Hz, 12H).

((C₆H₅)₂(2-C₅H₄N)P)CuCl. ¹H NMR (500 MHz, Methylene Chloride-d₂) δ 9.13 (s, 1H), 7.70 (t, J=7.8 Hz, 1H), 7.44 (t, J=6.5 Hz, 1H), 7.34 (t, J=7.2 Hz, 2H), 7.22 (q, J=8.8, 7.4 Hz, 7H), 7.18-7.10 (m, 1H).

Preparation of(BNHC)Cu(PPh₃). (PPh₃)CuCl (16 mg, 0.04535 mmol, 1.00 equiv) was added to a stirred solution of BNHC (50 mg, 0.04762 mmol, 1.05 equiv) in 10 mL of toluene in a scintillation vial at room temperature and was let to stir overnight. The solution was filtered through Celite and concentrated down to afford a white solid. X-ray quality crystals of the title compound were afforded by the slow diffusion of pentane into a saturated dichloromethane solution at room temperature in 72% yield. ¹H NMR (500 MHz, Methylene Chloride-d₂) δ 7.49-7.37 (m, 5H), 7.27 (ddd, J=10.0, 6.2, 2.2 Hz, 9H), 7.10 (d, 7=7.8 Hz, 2H), 6.81 (ddd, J=12.2, 8.1, 1.4 Hz, 5H), 6.46 (s, 1H), 2.95 (h, 7=6.8 Hz, 2H), 2.71 (p, 7=6.9 Hz, 2H), 1.11 (d, 7=6.9 Hz, 6H), 1.03 (dd, 7=9.3, 6.8 Hz, 12H), 0.93 (d, 7=6.7 Hz, 6H). ¹³C NMR (126 MHz, CD₂Cl₂) δ 147.79, 146.73, 135.15, 133.83, 131.83, 129.88, 129.69, 128.54, 128.17, 124.15, 123.46, 28.53, 28.23, 24.64, 21.60. ³¹P NMR (203 MHz, CD₂Cl₂) δ 7.54. ¹H NMR (161 MHz, CD₂Cl₂) δ–16.17. Anal. Calcd. For C₆₃H₅₀BCuF₁₅N₂P. 1.35 CH₂Cl₂: C, 57.68%; H, 3.96%; N, 2.09%. Found: C, 57.848%; H, 4.265%; N, 1.792%.

Preparation of(BNHC)Cu(P(o-tolyl)₃. (P(o-tolyl)₃)CuCl (16 mg, 0.04535 mg, 1.00 equiv) was added to a stirred solution of BNHC (40 mg, 0.04762 mmol, 1.05 equiv) in 10 mL of toluene in a scintillation vial at room temperature and was let to stir for 4 hours. The solution was filtered through Celite and concentrated down to afford a white solid. X-ray quality crystals of the title compound were afforded by the slow diffusion of pentane into a saturated dichloromethane solution at room temperature in 70% yield. ³¹P NMR (162 MHz, CD₂Cl₂) δ–3.61. Anal. Calcd. For C₆₆H₅₅BCuF₁₅N₂P. 1.00 C₇H₈: C, 64.54%; H, 4.67%; N, 2.06%; Found: C, 64.511%; H, 4.738%; N, 1.9727%.

Preparation of(BNHC)Cu(THT). (THT)CuCl (13.4 mg, 0.07165 mmol, 1.00 equiv) was added to a stirred solution of BNHC (79 mg, 0.07523 mmol, 1.05 equiv) in 15 mL of toluene in a scintillation vial at –35° C. and was let to stir for 3 h. The solution was removed from the glovebox, filtered through Celite and concentrated down to afford a white solid. X-ray quality crystals of the title compound were afforded by the slow diffusion of hexane into a saturated toluene solution at room temperature in 58% yield. ¹H NMR (400 MHz, Methylene Chloride-d₂) δ 7.43 (t, J=7.8 Hz, 1H), 7.36 (t, J=7.7 Hz, 1H), 7.25 (d, J=7.8 Hz, 2H), 7.09 (d, J=7.8 Hz, 2H), 6.40 (s, 1H), 2.95 (hept, J=6.6 Hz, 2H), 2.67 (hept, J=13.7, 6.7 Hz, 2H), 2.55 (m, 4H), 1.74-1.64 (m, 4H), 1.22-1.10 (m, 18H), 0.95 (d, J=6.7 Hz, 6H). ¹³C NMR (101 MHz, CD₂Cl₂) δ 147.63, 146.56, 137.57, 135.16, 130.30, 129.91, 129.36, 128.55, 125.62, 124.23, 123.48, 35.55, 31.07, 28.48, 28.03, 27.84, 25.12, 24.13, 21.67, 21.55. ¹H NMR (161 MHz, CD₂Cl₂) 5-16.21. Anal. Calcd. For C₄₉H₄₂BCuF₁₅N₂S. 1.00 C₇H₈: C, 58.88%; H, 4.41%; N, 2.45%; Found: C, 58.771%; H, 4.399%; N, 2.364%.

Preparation of(BNHC)Cu(P(p-tolyl)₃). (p-tolyl)₃PCuCl (30 mg, 0.07437 mmol, 1.00 equiv) was added to a stirred solution of BNHC (79 mg, 0.07523 mmol, 1.05 equiv) in 10 mL of toluene in a scintillation vial at room temperature and was let to stir over night. The solution was removed from the glovebox, filtered through Celite and concentrated down to afford a white solid. Clear, colorless crystals of the title compound were afforded by the slow diffusion of hexane into a saturated toluene solution at room temperature in 55% yield. ³H NMR (400 MHz, Methylene Chloride-d₂) δ 7.46 (td, J=7.8, 5.6 Hz, 2H), 7.25 (d, J=7.8 Hz, 2H), 7.10 (d, J=7.8 Hz, 2H), 7.07-7.04 (m, 5H), 6.67 (dd, J=12.0, 8.1 Hz, 6H), 6.44 (s, 1H), 2.95 (hept, J=5.8 Hz, 2H), 2.70 (hept, J=7.0, 6.5 Hz, 2H), 2.32 (s, 9H), 1.11 (d, J=6.8 Hz, 6H), 1.07-1.00 (m, 12H), 0.93 (d, J=6.7 Hz, 6H). ³¹P NMR (162 MHz, CD₂Cl₂) δ 5.37.

Preparation of (BNHC)Cu(P(CH₃OC₆H₄)₃). (P((CH₃OC₆H₄)₃)CuCl (16 mg, 0.04535 mg, 1.00 equiv) was added to a stirred solution of BNHC (40 mg, 0.04762 mmol, 1.05 equiv) in 10 mL of toluene in a scintillation vial at room temperature and was let to stir for 4 hours. The solution was removed from the glovebox, filtered through Celite and concentrated down to afford a white solid. Clear, colorless crystals of the title compound were afforded by the slow diffusion of hexane into a saturated toluene solution at room temperature in 60% yield. $^3$H NMR (400 MHz, Methylene Chloride-d$_2$) δ 7.49-7.43 (m, 2H), 7.26 (d, J=7.8 Hz, 2H), 7.10 (d, J=7.8 Hz, 2H), 6.73 (ddd, J=21.8, 8.9, 2.2 Hz, 12H), 6.44 (s, 1H), 3.78 (s, 9H), 2.96 (hept, J=6.3 Hz, 2H), 2.71 (hept, J=6.9 Hz, 2H), 1.11 (d, J=6.8 Hz, 6H), 1.05 (dd, 7=6.7, 5.0 Hz, 12H), 0.93 (d, J=6.7 Hz, 6H). $^{13}$C NMR (101 MHz, CD$_2$Cl$_2$) δ 162.41, 147.86, 146.78, 135.26, 135.10, 130.27, 129.79, 124.13, 123.43, 120.31, 119.79, 115.21, 115.09, 55.80, 28.55, 28.23, 28.05, 24.69, 24.51, 21.64. $^{31}$P NMR (162 MHz, CD$_2$Cl$_2$) δ 3.44. Anal. Calcd. For C$_{63}$H$_{46}$BCuF$_{18}$N$_2$P: C, 59.19%; H, 3.63%; N, 2.19%; Found: C, 58.938%; H, 3.475%; N, 2.137%.

Preparation of(BNHC)Cu(P(p-F—C$_6$H$_4$)$_3$. ((FC$_6$H$_4$)$_3$P) CuCl (15 mg, 0.04535 mg, 1.00 equiv) was added to a stirred solution of BNHC (40 mg, 0.04762 mmol, 1.05 equiv) in 10 mL of toluene in a scintillation vial at room temperature and was let to stir for 4 hours. The solution was removed from the glovebox, filtered through Celite and concentrated down to afford a white solid. Clear, colorless crystals of the title compound were afforded by the slow diffusion of hexane into a saturated toluene solution at room temperature in 58% yield. $^3$H NMR (400 MHz, Methylene Chloride-d$_2$) δ 7.48 (q, J=7.3 Hz, 1H), 7.27 (d, J=7.7 Hz, 1H), 7.12 (d, J=7.7 Hz, 1H), 7.01 (t, J=8.1 Hz, 3H), 6.82-6.72 (m, 3H), 6.48 (s, OH), 2.97 (hept, J=6.4, 5.7 Hz, 1H), 2.69 (dq, J=11.5, 5.8, 4.8 Hz, 1H), 1.12 (d, J=6.7 Hz, 3H), 1.04 (t, J=7.8 Hz, 6H), 0.94 (d, J=6.6 Hz, 3H). $^{31}$P NMR (162 MHz, CD$_2$Cl$_2$) δ 4.76. Anal. Calcd. For C$_{63}$H$_{46}$BCuF$_{18}$N$_2$P. 1.00 CH$_2$Cl$_2$: C, 57.51%; H, 4.11%; N, 2.13%; Found: C, 57.584%; H, 3.905%; N, 1.917%.

Preparation of(BNHC)Cu(P-furyl). ((furyl)$_3$P)CuCl (24 mg, 0.07143 mg, 1.00 equiv) was added to a stirred solution of BNHC (75 mg, 0.07500 mmol, 1.05 equiv) in 10 mL of toluene in a scintillation vial at room temperature and was let to stir for 4 hours. The solution was removed from the glovebox, filtered through Celite and concentrated down to afford a white solid. Clear, colorless crystals of the title compound were afforded by the slow diffusion of hexane into a saturated toluene solution at room temperature in 65% yield. $^3$H NMR (500 MHz, Methylene Chloride-d$_2$) δ 7.60 (s, 3H), 7.44 (dt, j=27.0, 7.8 Hz, 2H), 7.28 (d, j=7.7 Hz, 2H), 7.11 (d, j=7.7 Hz, 2H), 6.48 (s, 1H), 6.38 (s, 3H), 6.27 (s, 3H), 3.00 (dt, j=13.1, 6.4 Hz, 2H), 2.74 (dt, j=13.3, 6.6 Hz, 2H), 1.16 (t, j=6.8 Hz, 18H), 0.97 (d, j=6.5 Hz, 6H). $^{13}$C NMR (126 MHz, CD$_2$Cl$_2$) δ 150.14, 147.91, 146.82, 140.37, 139.74, 138.06, 137.12, 135.99, 135.06, 130.75, 130.41, 130.01, 124.70, 124.49, 124.27, 123.49, 111.96, 111.89, 28.58, 28.35, 28.10, 24.92, 24.29, 21.61. $^{31}$P NMR (202 MHz, CD$_2$Cl$_2$) δ −55.59.

Preparation of(BNHC)CuP(C$_6$H$_5$)$_2$(2-C$_5$H$_4$N). $^1$H NMR (500 MHz, Methylene Chloride-d$_2$) δ 8.25 (d, J=4.8 Hz, 1H), 7.58 (tdd, J=7.8, 3.0, 1.8 Hz, 1H), 7.48-7.40 (m, 4H), 7.29-7.24 (m, 7H), 7.11 (d, J=7.8 Hz, 2H), 6.88-6.82 (m, 5H), 6.44 (s, 1H), 2.96 (h, J=6.7 Hz, 2H), 2.72 (hept, J=6.8 Hz, 2H), 1.11 (d, 7=6.8 Hz, 6H), 1.05 (dd, 7=11.5, 6.9 Hz, 12H), 0.93 (d, 7=6.7 Hz, 6H). $^{31}$P NMR (203 MHz, CD$_2$Cl$_2$) δ 5.62.

Example 2: Preparation of Au(I) Complex

Unless otherwise stated, air-free manipulations were performed under a dry N$_2$ atmosphere using a Vacuum Atmospheres inert atmosphere glovebox or using standard Schlenk techniques. Analytical data were obtained from the CENTC Elemental Analysis Facility at the University of Rochester. Bruker Avance III 500 and 400 MHz instruments were used to collect NMR spectra. $^1$H NMR chemical shifts (4, ppm) are referenced to residual protiosolvent resonances and $^{13}$C NMR chemical shifts are referenced to the deuterated solvent peak. All deuterated NMR solvents (Cambridge Isotope Laboratories) were dried over activated 4 Å molecular sieves for 48 h before use. Tris(pentafluorophenyl)borane (B(C$_6$F$_5$)$_3$) was purified via sublimation (100 mTorr, 90° C.) prior to use. Dichloromethane (DCM), tetrahydrofuran (THF), pentane, diethyl ether and toluene were purified using a commercial solvent purification system. [Ag(IPr)Cl], [Au(SMe$_2$)Cl], [Au(THT)Cl], [Au(IPr)Cl], BNHC, [Au(BNHC)(SMe$_2$)] and [Pd(IPr)(C(O)C$_9$H$_6$N)Cl][6] were all synthesized from literature procedures (De Fremont, P., et al., Organometallics 2005, 24 (26), 6301-6309; Holz, J., et al., Dalt. Trans. 2018, 47 (11), 3880-3905; Gómez-Suárez, A., et al., Dalt. Trans. 2012, 41 (18), 5461-5463; De Fremont, P., et al., Organometallics 2005, 24 (10), 2411-2418; Weerasiri, K. C., et al., Adv. Synth. Catal. 2016, 358 (24), 4106-4113; and Wozniak, D. I., et al., Organometallics 2018, 37 (14), 2376-2385). All other chemicals were used as received from commercial suppliers without further purification.

Synthesis of Sodium 2-phenylphenoxide

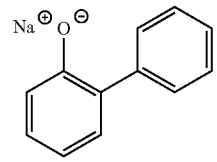 [SMILES: [Na+] ; [O-]c1ccccc1-c1ccccc1]

A scintillation vial was charged with 2-phenylphenol (0.170 mg, 1 mmol, 1 equiv) in 8 mL of THF. To this solution was added sodium hydride (0.025 mg, 1.05 mmol, 1.05 equiv). The vial was capped with a septum and punctured with a syringe needle to vent H$_2$ gas. The clear solution was let to stir at room temperature overnight. The solution was filtered through celite and concentrated under vacuum to afford a white solid in 67% yield. $^1$H NMR (500 MHz, DMSO-d$_6$) δ 7.89-7.79 (m, 1H), 7.19 (t, J=7.7 Hz, 2H), 7.03-6.98 (m, 2H), 6.95 (dd, J=7.4, 2.0 Hz, 1H), 6.70-6.64 (m, 2H), 6.14 (d, J=7.4 Hz, 1H), 5.90 (t, J=6.7 Hz, 1H). $^{13}$C NMR (126 MHz, DMSO) δ 165.99, 142.36, 129.06, 128.49, 128.13, 127.48, 127.18, 124.33, 119.62, 110.36.

Synthesis of Sodium 3,5-bis-(trifluoromethyl)phenoxide

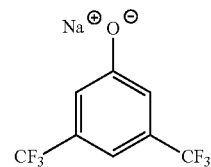 [SMILES: [Na+] ; [O-]c1cc(C(F)(F)F)cc(C(F)(F)F)c1]

A scintillation vial was charged with 3,5-bis-(trifluromethyl)phenol (0.230 mg, 1 mmol, 1 equiv) in 8 mL of THF.

To this solution was added sodium hydride (0.025 mg, 1.05 mmol, 1.05 equiv) and septum capped with a syringe needle to vent H$_2$ gas. The clear solution was let to stir at room temperature overnight. It was filtered through celite and concentrated under vacuum and triturated with pentane to afford a white solid in 72% yield. $^1$H NMR (500 MHz, DMSO-fife) δ 6.37 (s, 2H), 6.18 (s, 1H). $^{13}$C NMR (126 MHz, DMSO-d$_6$) δ 172.20, 130.71, 130.47, 130.23, 129.99, 125.85, 123.69, 118.52.

Synthesis of Sodium 1,1,1,3,3,3-hexafluoro-2-propanoxide

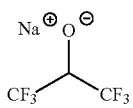

A scintillation vial was charged with 1,1,1,3,3,3-hexafluoro-2-propanol (0.500 mL, 4.76 mmol, 1 equiv) in 12 mL of THF. To this solution was added sodium hydride (0.120 mg, 5.00 mmol, 1.05 equiv) and septum capped with a syringe needle to vent H$_2$ gas. The clear solution was let to stir at room temperature overnight. It was filtered through celite and concentrated under vacuum and triturated with pentane to afford a white solid in 79% yield. The spectroscopic data is consistent with the literature (Cradlebaugh, J. A. et al., *Org. Biomol. Chem.* 2004, 2083-2086).

Preparation of Na[(BNHC)Au(OC$_6$H$_5$)]

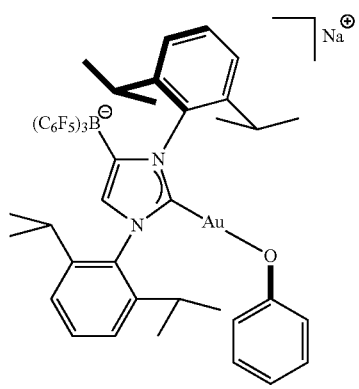

A scintillation vial was charged with (BNHC)Au(SMe$_2$) (45 mg, 0.0372 mmol, 1 equiv), and NaOC$_6$H$_5$ (8.6 mg, 0.0744 mmol, 2 equiv) in 2 mL of THF, and stirred for 2 hours at room temperature in the absence of light. The faint yellow solution was filtered through Celite and the solvent was removed under vacuum to afford a goo. The crude product was recrystallized from methylene chloride/pentane by vapor diffusion at room temperature in 48% yield. $^1$H NMR (500 MHz, Methylene Chloride-d$_2$) δ 7.45 (t, J=7.8 Hz, 1H), 7.39 (t, J=7.7 Hz, 1H), 7.25 (d, J=7.8 Hz, 2H), 7.07 (d, J=7.8 Hz, 2H), 6.82 (t, J=7.9 Hz, 2H), 6.52 (t, J=7.3 Hz, 1H), 6.38 (s, 1H), 6.02 (d, J=8.6 Hz, 2H), 2.93 (hept, J=6.7 Hz, 2H), 2.70 (hept, J=6.8 Hz, 2H), 1.30 (d, J=6.8 Hz, 6H), 1.24 (d, J=6.9 Hz, 6H), 1.13 (d, J=6.9 Hz, 6H), 0.90 (d, J=6.7 Hz, 6H). $^{13}$C NMR (126 MHz, CD$_2$Cl$_2$) δ 165.86, 163.73, 150.17, 147.97, 146.80, 137.43, 135.47, 130.14, 129.47, 124.11, 123.41, 118.18, 117.32, 68.73, 28.58, 28.10, 26.88, 25.73, 24.45, 24.18, 22.27. Anal. Calcd for C$_{51}$H$_{40}$AuBF$_{15}$N$_2$ONa+2 THF: C, 52.23; H, 4.16; N, 2.06. Found: C, 52.465; H, 4.350; N, 1.936.

Preparation of Na[(BNHC)Au(OC$_8$H$_3$F$_6$)]

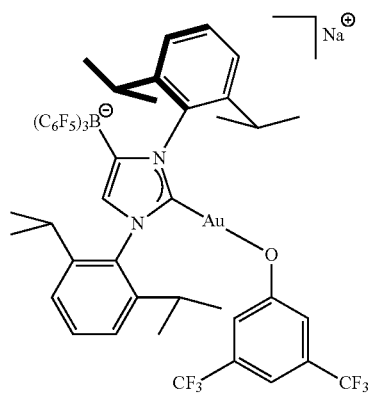

A scintillation vial was charged with (BNHC)Au(SMe$_2$) (45 mg, 0.0372 mmol, 1 equiv), and Sodium 3,5-bis-(trifluoromethyl)phenoxide (23.4 mg, 0.0744 mmol, 2 equiv) in 2 mL of THF, and stirred overnight at room temperature. The faint yellow solution was filtered through Celite and the solvent was removed under vacuum to afford a goo. The crude product was recrystallized from methylene chloride/pentane by vapor diffusion method at room temperature in 52% yield. $^1$H NMR (500 MHz, Methylene Chloride-d$_2$) δ 7.43 (t, J=7.7 Hz, 1H), 7.36 (t, J=7.7 Hz, 1H), 7.24 (d, J=7.8 Hz, 2H), 7.08-7.04 (m, 3H), 6.63 (s, 2H), 6.40 (s, 1H), 2.93 (p, J=6.7 Hz, 2H), 2.71-2.64 (m, 2H), 1.31 (d, J=6.8 Hz, 6H), 1.24 (d, J=6.9 Hz, 6H), 1.13 (d, J=6.8 Hz, 6H), 0.91 (d, J=6.7 Hz, 6H). $^{13}$C NMR (126 MHz, CD$_2$Cl$_2$) δ 166.80, 148.18, 146.56, 135.05, 130.39, 129.76, 124.13, 123.34, 68.76, 28.57, 28.06, 26.93, 25.72, 24.49, 24.13, 22.20. Anal. Calcd for C$_{53}$H$_{38}$AuBF$_{21}$N$_2$ONa+2 THF: C, 49.15; H, 3.52; N, 1.88. Found: C, 48.809; H, 3.488; N, 1.682.

Preparation of Na[Au(BNHC)(OC$_{12}$H$_9$)]

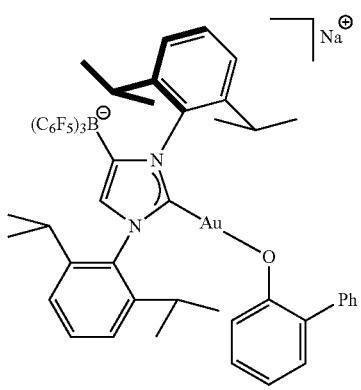

A scintillation vial was charged with (BNHC)Au(SMe$_2$) (45 mg, 0.0372 mmol, 1 equiv), and Sodium 2-phenylphenoxide (14.3 mg, 0.0744 mmol, 2 equiv) in 2 mL of THF, and stirred overnight at room temperature. The faint yellow solution was filtered through Celite and the solvent was removed under vacuum to afford a goo. The crude product was recrystallized from methylene chloride/pentane by vapor diffusion method at room temperature in 40% yield. $^3$H NMR (500 MHz, Methylene Chloride-d$_2$) δ 7.48-7.33 (m, 7H), 7.33-7.29 (m, 4H), 7.28-7.24 (m, 2H), 7.09 (d, J=7.8 Hz, 2H), 6.99 (td, J=7.5, 0.9 Hz, 1H), 6.95 (dd, J=7.4, 1.8 Hz, 1H), 6.83-6.73 (m, 1H), 6.62 (td, J=7.4, 1.1 Hz, 1H), 6.38 (s, 1H), 6.05 (dd, J=8.2, 0.9 Hz, 1H), 2.94 (hept, J=6.6 Hz, 2H), 2.72 (hept, J=6.8 Hz, 2H), 1.32 (d, J=6.8 Hz, 6H), 1.25 (d, J=7.0 Hz, 6H), 1.13 (d, J=6.8 Hz, 6H), 0.92 (d, J=6.7 Hz, 6H). $^{13}$C NMR (126 MHz, CD$_2$Cl$_2$) δ 162.69, 148.01, 146.87, 140.73, 135.54, 130.15, 129.67, 129.57, 127.70, 124.17, 123.47, 120.56, 117.66, 68.56, 34.55, 28.61, 28.14, 26.95, 25.67, 24.51, 24.16, 22.76, 22.29, 14.23. Anal. Calcd for C$_{51}$H$_{44}$AuBF$_{15}$N$_2$ONa+2 THF: C, 54.48; H, 4.22; N, 1.95. Found: C, 54.089; H, 4.152; N, 1.517.

Preparation of Na[(BNHC)Au(SC$_6$H$_5$)]

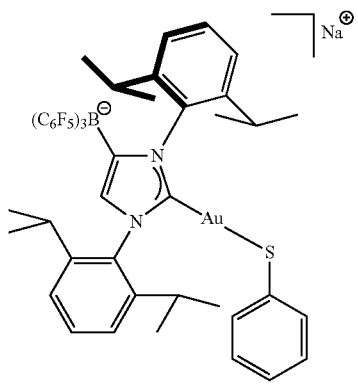

A scintillation vial was charged with (BNHC)Au(SMe$_2$) (45 mg, 0.0372 mmol, 1 equiv), and NaSC$_6$H$_5$ (9.8 mg, 0.0744 mmol, 2 equiv) in 2 mL of THF, and stirred for 2 hours at room temperature. The faint yellow solution was filtered through Celite and the solvent was removed under vacuum to afford a goo. The crude product was recrystallized from methylene chloride/pentane by vapor diffusion method at room temperature in 51% yield. $^1$H NMR (500 MHz, Methylene Chloride-d$_2$) δ 7.40 (t, J=7.7 Hz, 1H), 7.29 (t, J=7.7 Hz, 1H), 7.14 (d, J=7.8 Hz, 2H), 6.91 (d, J=7.8 Hz, 2H), 6.69 (t, J=7.8 Hz, 1H), 6.25 (s, 1H), 6.08 (d, J=8.2 Hz, 1H), 2.74 (hept, J=6.7 Hz, 2H), 2.55 (hept, J=6.8 Hz, 2H), 1.04 (d, J=6.8 Hz, 5H), 0.99 (dd, J=11.2, 6.9 Hz, 12H), 0.82 (d, J=6.7 Hz, 6H). $^{13}$C NMR (126 MHz, CD$_2$Cl$_2$) δ 178.24, 147.46, 146.41, 135.04, 132.84, 130.12, 129.60, 128.29, 125.68, 124.00, 123.26, 68.98, 28.41, 27.95, 26.90, 25.83, 24.57, 24.04, 22.75, 22.26, 14.22. Anal. Calcd for C$_{51}$H$_{40}$AuBF$_{15}$N$_2$SNa: C, 50.81; H, 3.34; N, 2.32. Found: C, 49.546; H, 3.607; N, 2.101.

Preparation of K[(BNHC)Au(O$^t$Bu)]

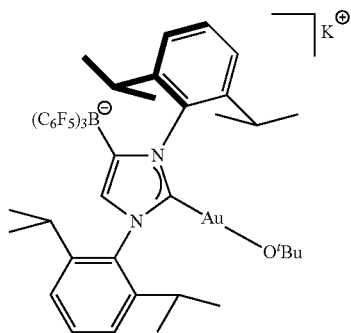

In a glovebox, a scintillation vial was charged with BNHC)Au(DMS (0.50 mg, 0.04314 mmol, 1 equiv) and KO$^t$Bu (5 mg, 0.04548, 1.1 equiv) in THF and was stirred for 2 h in the absence of light. The golden solution was filtered through celite and concentrated under vacuum to afford a goo-like solid. Anal. Calcd for C$_{49}$H$_{44}$AuBF$_{15}$N$_2$OK. 2 THF: C, 50.16; H, 4.286; N, 2.12. Found: C, 49.784; H, 4.108; N, 1.708.

Preparation of Na[(BNHC)Au(OHC$_3$F$_6$)]. In a glovebox, a scintillation vial was charged with (BNHC)Au(THT) and NaOC(H)(CF$_3$)$_2$ in THF and was stirred overnight in the absence of light. The solution was concentrated down to afford a goo-like solid. After trituration with 3-2 mL portions of pentane, a white solid was obtained in 72% yield. X-ray quality crystal were obtained from the slow diffusion of pentane into a saturated $^1$H NMR (500 MHz, Methylene Chloride-d$_2$) δ 7.42 (t, J=7.7 Hz, 1H), 7.35 (t, J=7.7 Hz, 1H), 7.23 (d, J=7.8 Hz, 2H), 7.06 (d, J=7.8 Hz, 2H), 6.36 (s, 1H), 3.95 (dt, J=12.1, 6.2 Hz, 1H), 2.89 (p, J=6.8 Hz, 2H), 2.66 (p, J=6.9 Hz, 2H), 1.32 (d, j=6.8 Hz, 6H), 1.25 (d, j=6.9 Hz, 6H), 1.12 (d, j=6.9 Hz, 6H), 0.89 (d, j=6.6 Hz, 6H). Anal. Calcd for C$_{48}$H$_{36}$AuBF$_{21}$N$_2$O. 1.85 THF. 0.8 CH$_2$Cl$_2$: C, 50.81; H, 3.34; N, 2.32. Found: C, 49.546; H, 3.607; N, 2.101.

Example 3; Luminescence

Excitation and emission spectra were collected using a SPEX FluoroMAx-2 fluorimeter (Horiba Jobin Yvon). The emission spectra were collected with the excitation wavelength set to 365 nm and the excitation spectra were collected with the emission wavelength set to 410 nm. In a screw capped sealed quartz cuvette, 10$^{-5}$ M solutions of the series of complexes were prepared in a glovebox and dissolved in dichloromethane that was purified using a commercial solvent purification system. The screw-capped quartz cuvettes were then removed from the glovebox, and the emission and excitation spectra were recorded.

Example 4: Preparation of Cu(I) Complex

Figure 5A:
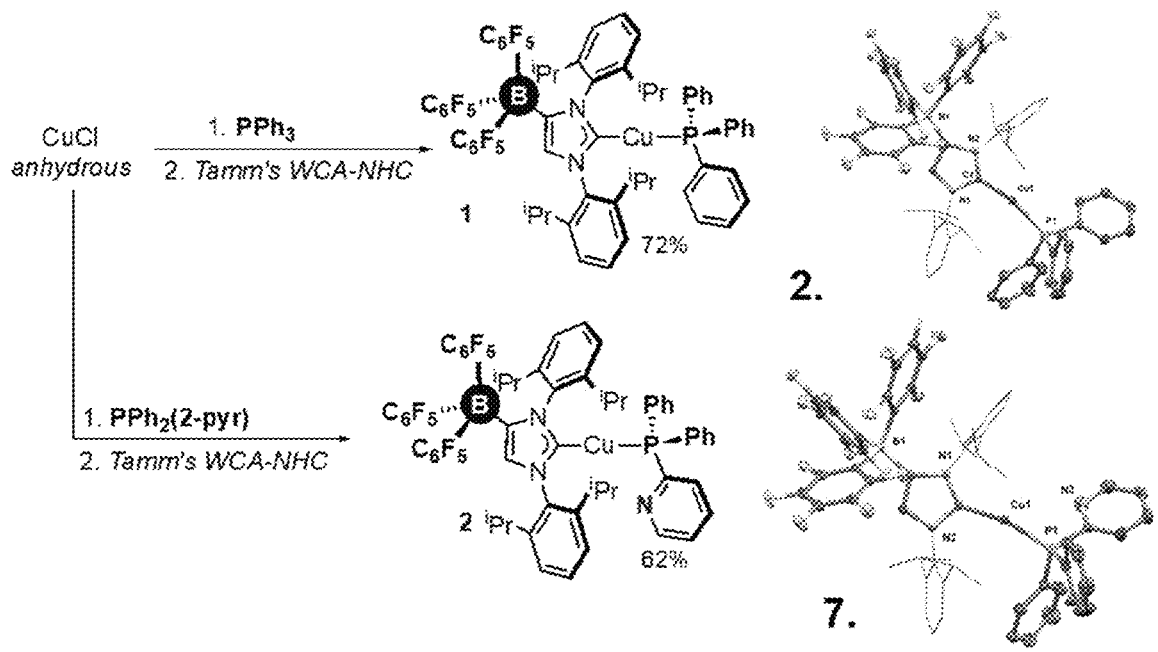
FIG. 5A shows synthesis of Zwitterionic Cu(I) Complexes 1 and 2 and ORTEP Diagrams.
Figure 5B:
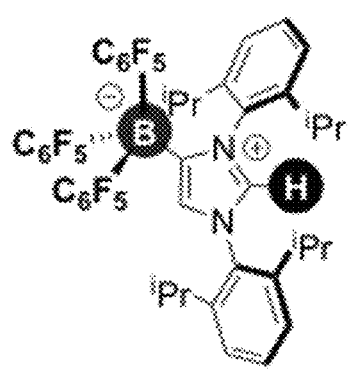
FIG. 5B shows Zwtterion and Emission Spectra thereof.
Figure 5B:
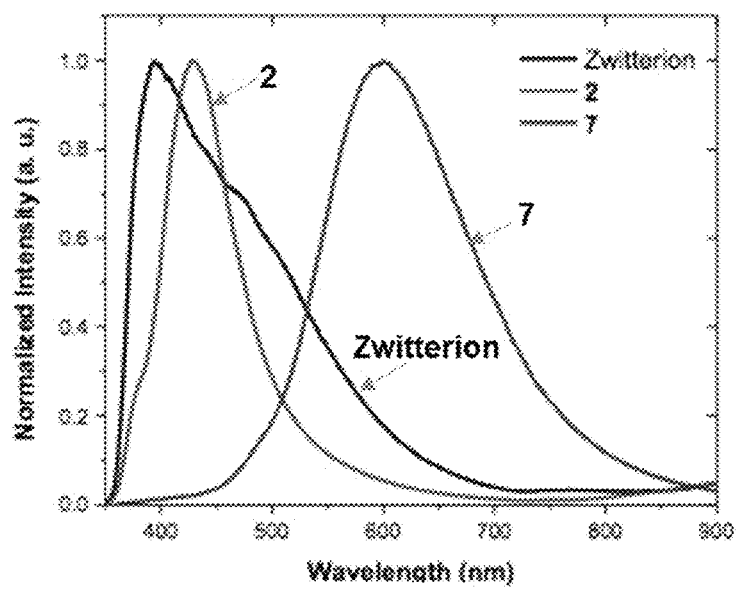
Figure 5C:
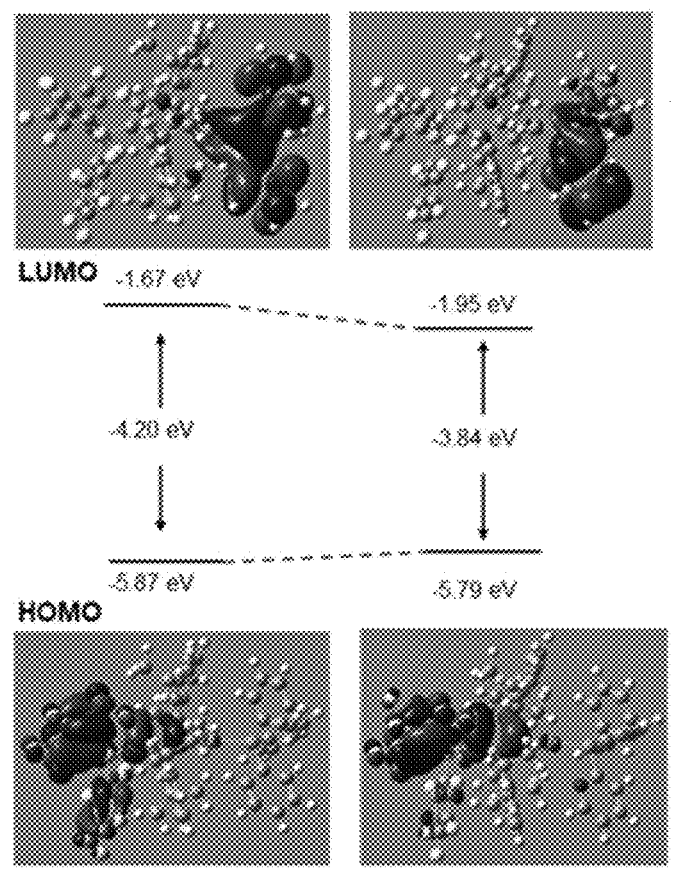
FIG. 5C shows TD-DFT of complexes 1 and 2.
Figure 5D:
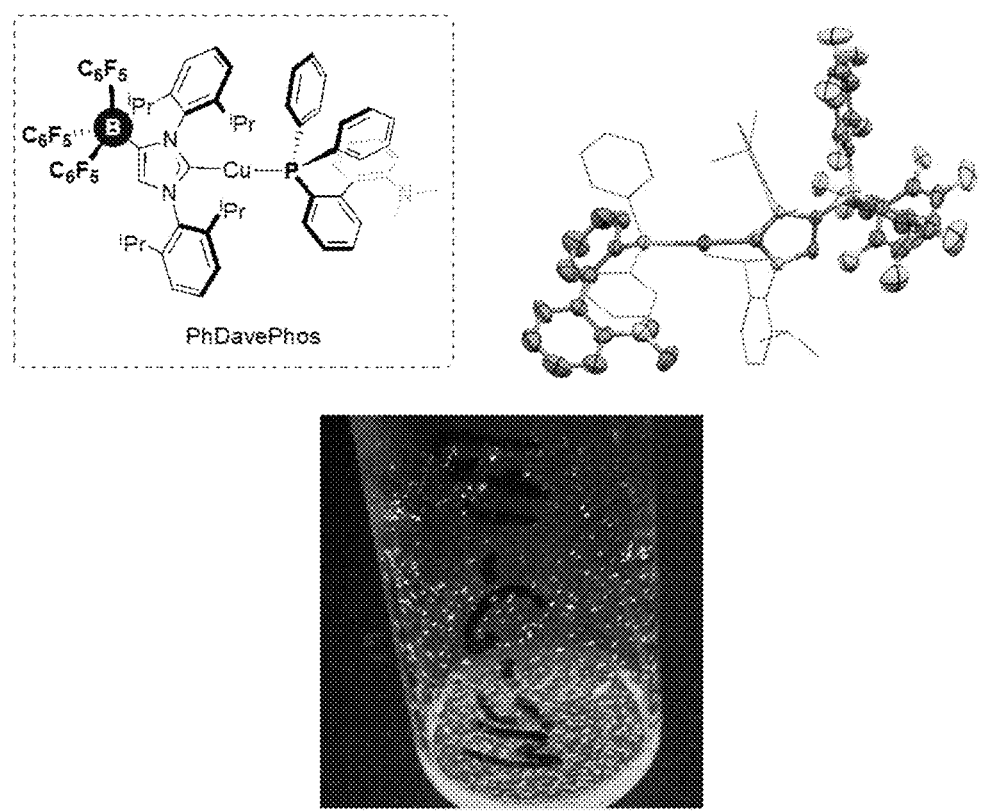
FIG. 5D shows Chemdraw of (WCA-NHC)—Cu—(Ph) DavePhos, its crystal structure, and blue emission of crystals.
Figure 6:
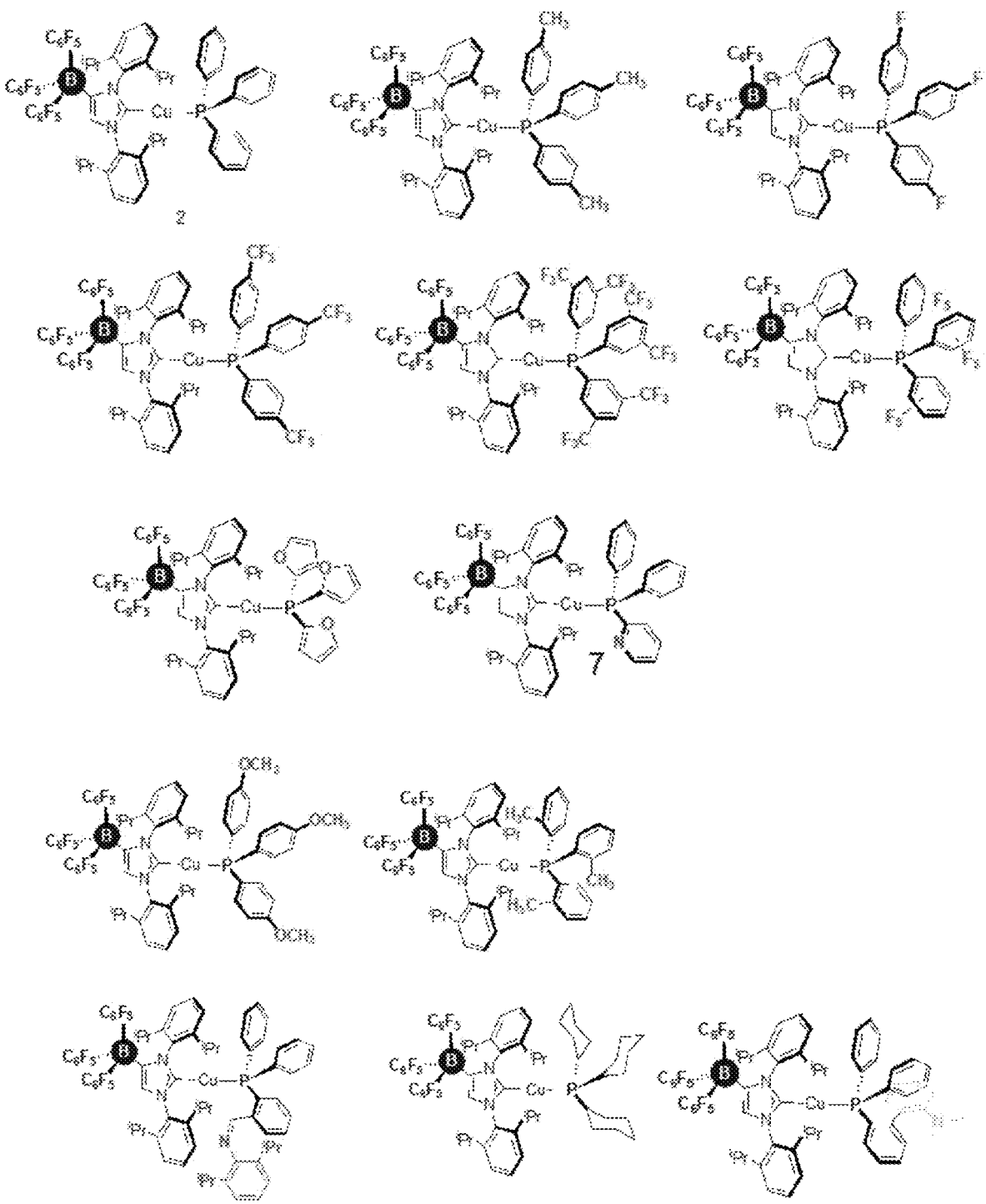
FIG. 6 shows additional exemplary compounds of the present invention.

Since the WCA-NHC ligand has been used in a variety of catalytic reactions, its role in photoemission has not been previously reported. We have prepared air and moisture stable over 20 Zwitterionic 2-coordinate Cu(I) complexes were prepared and characterized via $^1$H, $^{13}$C, $^{31}$P{$^1$H}, Elemental analysis, and some by X-ray Crystallography. However, we became interested to see how the ancillary ligand affects the emission wavelength, we decided to compare triphenylphosphine with diphenyl(2-pyridiyl) phosphine (FIG. 5A). In collaboration with Universal Display Corporation (UDC), we have obtained the emission spectra of complexes 2 and 7 (FIG. 5B). Density functional theory (DFT) and time-dependent DFT (TD-DFT) calculations performed on complexes 1 and 2 delineate the frontier orbital energies and the localization of their wave functions. In both complexes, the HOMO is localized on the formally-negatively charged borate group pendant onto the NHC, and the LUMO is entirely comprised of the aryl groups of the triaryl phosphine. In complex 2, the more electron-deficient pyridine group on the triaryl phosphine stabilizes the LUMO energy, ultimately red-shifting the $T_1$ energy compared to that of the triphenyl phosphine-containing complex 2 (not shown). Thus, modeling corroborates the experimental results wherein the emission of complex 1 is significantly lower in energy than that of complex 2 and) Zwitterion. However, TD-DFT reveals a shift in the relative localization of frontier molecular orbitals when equated to other NHC—Cu(I) complexes specially those reported at the forefront of OLED materials applications. Since calculations show a HOMO localized on the borate of WCA-NHC, 2 electron donating ancillary ligands can be substituted to exploit their steric and electronic properties. Just recently, we found that (WCA-NHC)—Cu—(Ph)DavePhos is a blue emitter (FIG. 5D).

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A compound having a structure of:

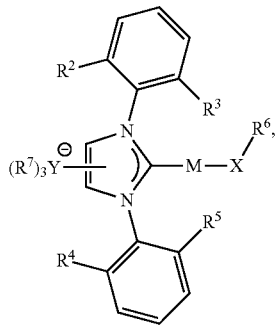

(II′)

wherein
Y is B or Al;
$R^7$ is independently hydrogen, halogen, substituted or unsubstituted alkyl, substituted or unsubstituted heteroalkyl, substituted or unsubstituted cycloalkyl, substituted or unsubstituted aryl, or substituted or unsubstituted heteroaryl;
Each $R^2$, $R^3$, $R^4$, and $R^5$ is independently hydrogen, halogen, substituted or unsubstituted alkyl;
M is a metal or a metal ion;
X is a bond, —C($R^a R^b$)—, —N($R^c$)—, —NC—, —O—, —S—, or —P($R^e R^f$)—;
$R^6$ is hydrogen, halogen, substituted or unsubstituted alkyl, substituted or unsubstituted cycloalkyl, substituted or unsubstituted heterocycloalkyl, substituted or unsubstituted aryl, or substituted or unsubstituted heteroaryl, or
$R^6$ and any atom of X, $R^a$, $R^b$, $R^c$, $R^d$, $R^e$, and $R^f$ together with atoms connected thereto form substituted or unsubstituted cycloalkyl, substituted or unsubstituted heterocycloalkyl, substituted or unsubstituted aryl, or substituted or unsubstituted heteroaryl; and
Each $R^a$, $R^b$, $R^c$, $R^d$, $R^e$, and $R^f$ is independently hydrogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl.

2. The compound of claim 1, wherein the compound further comprises a counterion.

3. The compound of claim 1, wherein:
$R^7$ is independently $R^8$-substituted or unsubstituted phenyl, $R^8$-substituted or unsubstituted pyrrolidinyl, or —N($R^8$)$_2$;
$R^8$ is halogen, —CH$_3$, —OCH$_3$, —CH$_2$CH$_3$, —OCH$_2$CH$_3$, —CX$^1_3$, —CHX$^1_2$, —CH$_2$X$^1$, —OCX$^1_3$, —OCH$_2$X$^1$, or —OCHX$^1_2$; and
$X^1$ is —F, —Cl, —Br, or —I.

4. The compound of claim 1, wherein:
X is —NC—; and
$R^6$ is hydrogen, or substituted or unsubstituted alkyl.

5. The compound of claim 1, wherein:
X is —O— or —S—; and
$R^6$ is hydrogen, substituted or unsubstituted alkyl, or substituted or unsubstituted phenyl.

6. The compound of claim 1, wherein: X is —N($R^C$)—; and
Each $R^6$ and $R^c$ is independently substituted or unsubstituted phenyl.

7. The compound of claim 1, wherein:
X is a bond; and
$R^6$ is substituted or unsubstituted heterocycloalkyl, or substituted or unsubstituted heteroaryl.

8. The compound of claim 1, wherein:
X is —P($R^e R^f$)—;
Each $R^6$, $R^e$, and $R^f$ is independently

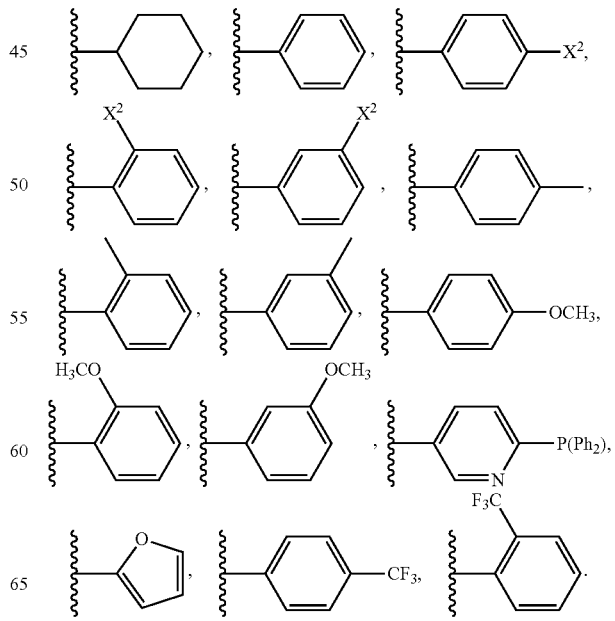

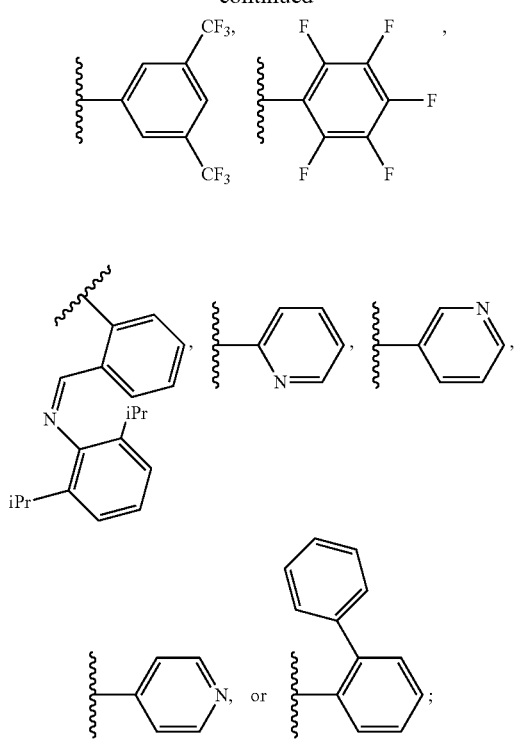

$X^2$ is —F, —Cl, —Br, or —I, and provided that at least one of $R^6$, $R^e$, and $R^f$ are not

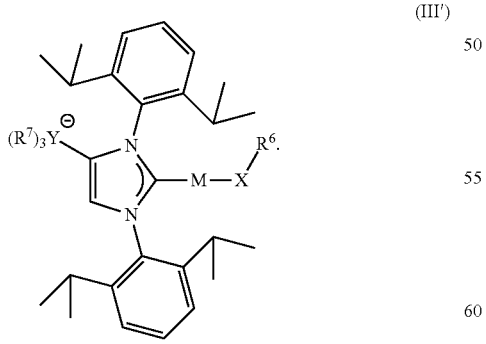

9. The compound of claim 1, wherein each $R^2$, $R^3$, $R^4$, and $R^5$ is independently is hydrogen, or unsubstituted $C_1$-$C_4$ alkyl.

10. The compound of claim 1, wherein the compound has the structure of:

(III')

11. The compound of claim 1, wherein M is Au, Cu, $Au^+$, $Cu^+$, Ag, or $Ag^+$.

12. The compound of claim 2, wherein the counterion is $Na^+$, $K^+$, or $Li^+$.

13. The compound of claim 1, wherein the compound is:

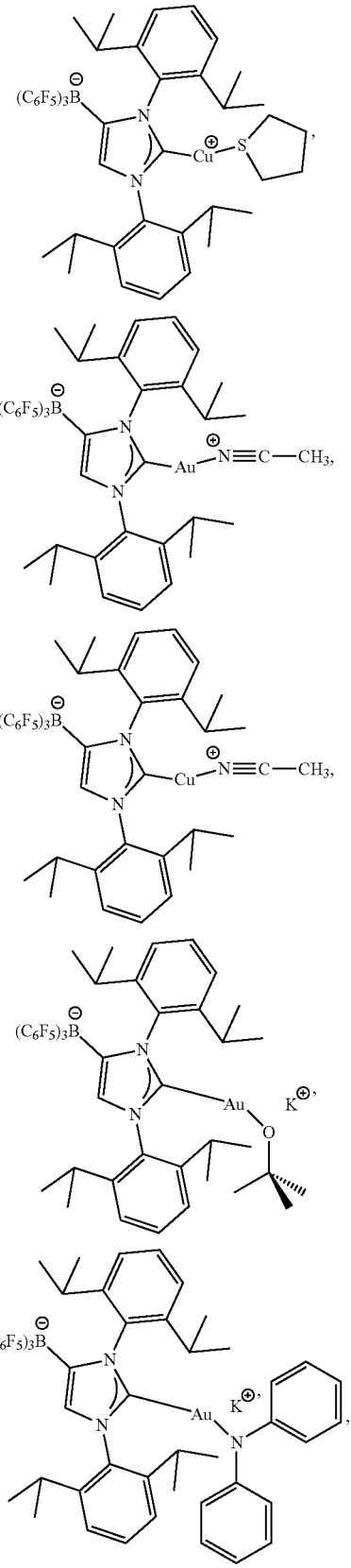

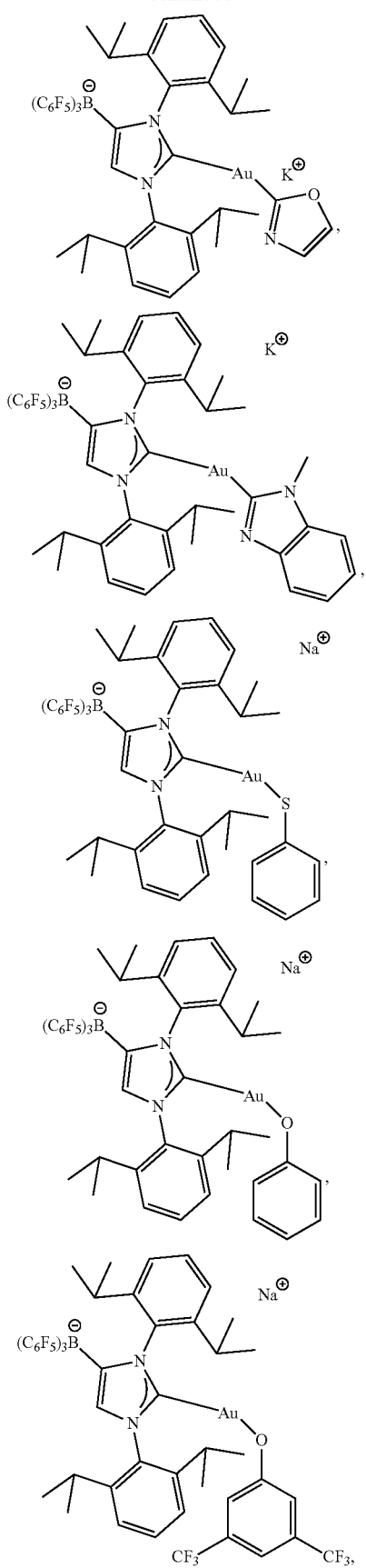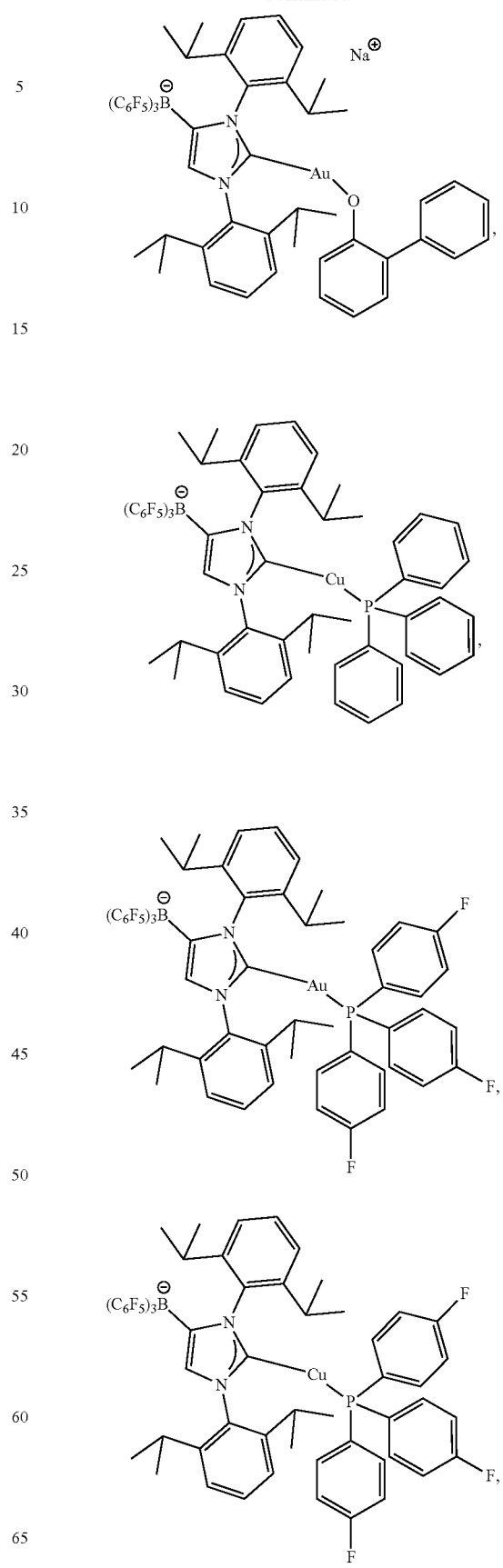

-continued
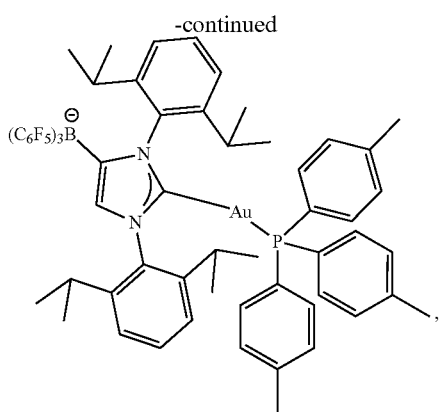
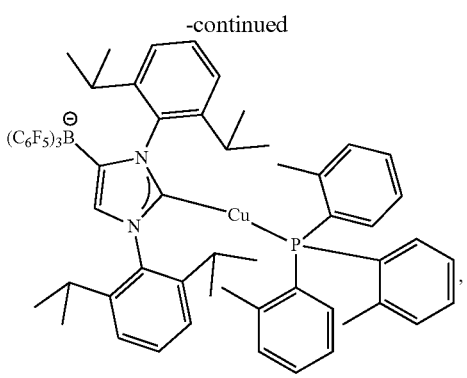
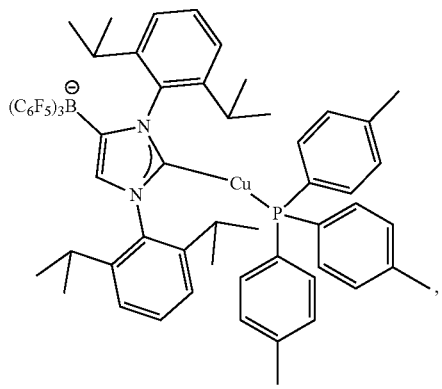
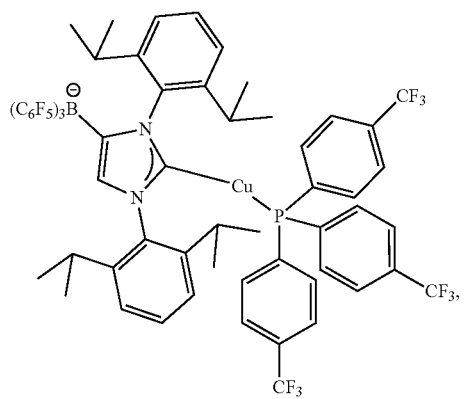
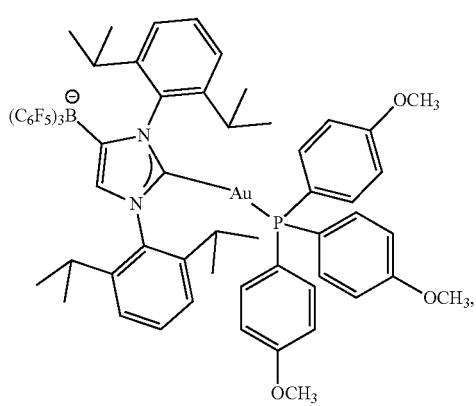
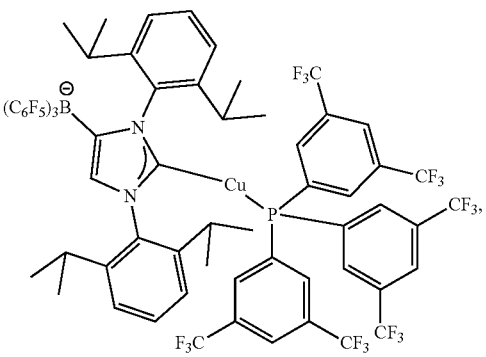
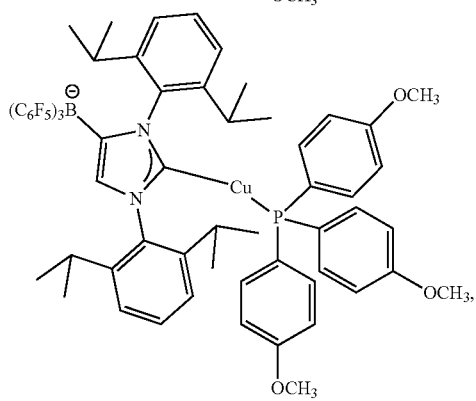
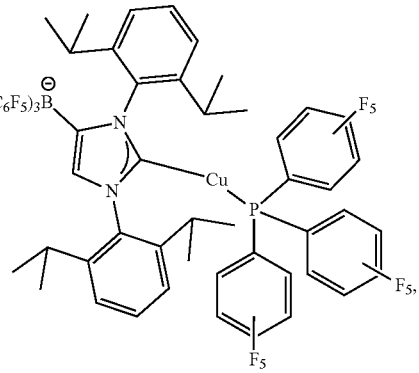

-continued

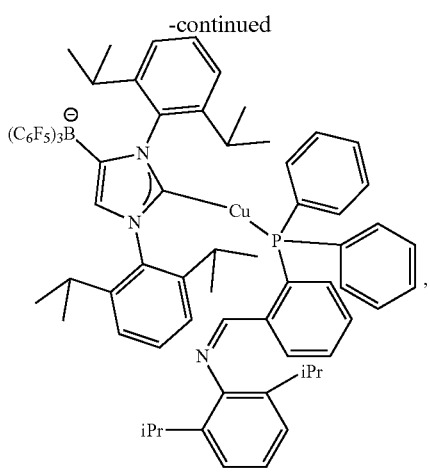

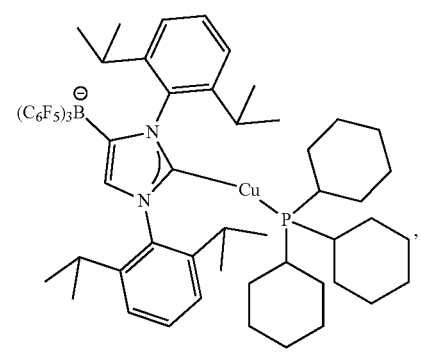

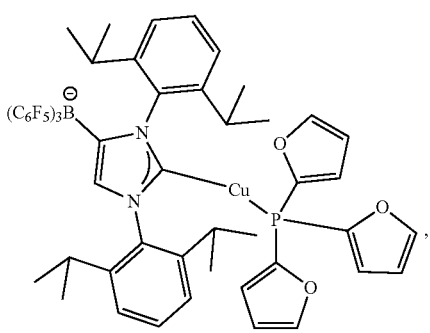

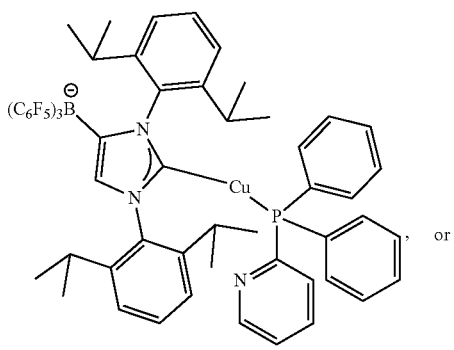

, or

-continued

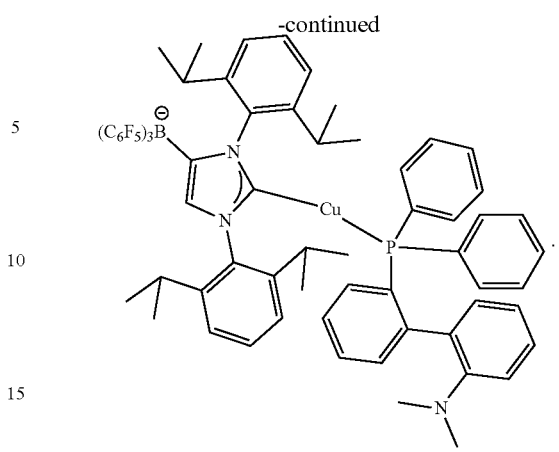

.

14. A luminescent composition comprising the compound of claim 1.

15. The luminescent composition of claim 14, further comprising a solvent component.

16. The luminescent composition of claim 14, wherein the luminescent composition is in a powder form.

17. The luminescent composition of claim 14, wherein a wavelength of luminescence emission of the composition is about 400 to 600 nm.

18. A compound having a structure of:

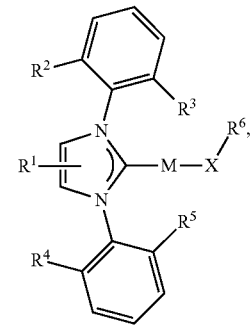

(I')

wherein
$R^1$ is an anionic group;
Each $R^2$, $R^3$, $R^4$, and $R^5$ is independently is hydrogen, halogen, substituted or unsubstituted alkyl;
M is Cu, Cu⁺, Ag, or Ag⁺;
X is a bond, —C($R^aR^b$)—, —N($R^c$)—, —NC—, —O—, —S—, or —P($R^eR^f$)—;
$R^6$ is hydrogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl, or
$R^6$ and any atom of X, $R^a$, $R^b$, $R^c$, $R^d$, $R^e$, and $R^f$ together with atoms connected thereto form substituted or unsubstituted cycloalkyl, substituted or unsubstituted heterocycloalkyl, substituted or unsubstituted aryl, or substituted or unsubstituted heteroaryl;
Each $R^a$, $R^b$, $R^c$, $R^d$, $R^e$, and $R^f$ independently hydrogen, substituted or unsubstituted alkyl, substituted or unsubstituted heteroalkyl, substituted or unsubstituted cycloalkyl, substituted or unsubstituted heterocycloalkyl, substituted or unsubstituted aryl, or substituted or unsubstituted heteroaryl.

19. The compound of claim 18, wherein the compound is:

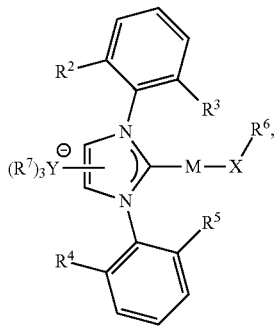

(II')

wherein:

Y is B or Al, and

R$^7$ is independently hydrogen, halogen, substituted or unsubstituted alkyl, substituted or unsubstituted heteroalkyl, substituted or unsubstituted cycloalkyl, substituted or unsubstituted aryl, or substituted or unsubstituted heteroaryl.

20. The compound of claim 19, wherein:

R$^7$ is independently R$^8$-substituted or unsubstituted phenyl, R$^8$-substituted or unsubstituted pyrrolidinyl, or —N(R$^8$)$_2$;

R$^8$ is halogen, —CH$_3$, —OCH$_3$, —CH$_2$CH$_3$, —OCH$_2$CH$_3$, —CX$^1_3$, —CHX$^1_2$, —CH$_2$X$^1$, —OCX$^1_3$, —OCH$_2$X$^1$, or —OCHX$^1_2$; and X$^1$ is —F, —Cl, —Br, or —I.

21. The compound of claim 19, wherein the compound has the structure of:

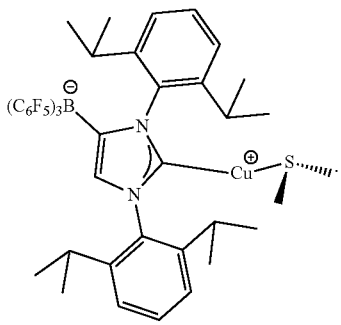

22. A luminescent composition comprising the compound of claim 18.

23. The luminescent composition of claim 21, further comprising a solvent component.

24. The luminescent composition of claim 21, wherein the luminescent composition is in a powder form.

25. The luminescent composition of claim 21, wherein a wavelength of luminescence emission of the composition is about 400 to 600 nm.

* * * * *